US009583190B2

(12) United States Patent
Miller et al.

(10) Patent No.: US 9,583,190 B2
(45) Date of Patent: Feb. 28, 2017

(54) CONTENT ADDRESSABLE MEMORY IN INTEGRATED CIRCUIT

(71) Applicant: Altera Corporation, San Jose, CA (US)

(72) Inventors: Marc Miller, Palo Alto, CA (US); Jimmy Lee Reaves, San Jose, CA (US)

(73) Assignee: Altera Corporation, San Jose, CA (US)

( * ) Notice: Subject to any disclaimer, the term of this patent is extended or adjusted under 35 U.S.C. 154(b) by 201 days.

(21) Appl. No.: 14/356,371

(22) PCT Filed: Nov. 9, 2012

(86) PCT No.: PCT/US2012/064546
§ 371 (c)(1),
(2) Date: May 5, 2014

(87) PCT Pub. No.: WO2013/071183
PCT Pub. Date: May 16, 2013

(65) Prior Publication Data
US 2015/0006808 A1    Jan. 1, 2015

Related U.S. Application Data

(60) Provisional application No. 61/558,984, filed on Nov. 11, 2011, provisional application No. 61/559,716, filed on Nov. 14, 2011, provisional application No. 61/576,973, filed on Dec. 16, 2011, provisional application No. 61/620,418, filed on Apr. 4, 2012, provisional application No. 61/632,424, filed on Aug. 24, 2012.

(51) Int. Cl.
*G06F 17/30* (2006.01)
*G11C 15/00* (2006.01)
*G11C 15/04* (2006.01)

(52) U.S. Cl.
CPC ........ *G11C 15/00* (2013.01); *G06F 17/30982* (2013.01); *G11C 15/04* (2013.01)

(58) Field of Classification Search
CPC .......................... G11C 15/04; G06F 17/30982
See application file for complete search history.

(56) References Cited

U.S. PATENT DOCUMENTS

| 5,233,689 A | 8/1993  | Rhoden et al. |
| 5,291,489 A | 3/1994  | Morgan et al. |
| 5,325,329 A | 6/1994  | Inoue et al.  |
| 5,473,267 A | 12/1995 | Stansfield    |

(Continued)

FOREIGN PATENT DOCUMENTS

WO    WO 2013/071183    5/2013

OTHER PUBLICATIONS

International Search Report and Written Opinion for PCT/US2012/064546, Jan. 25, 2013 (mailing date), Tabula, Inc.

(Continued)

*Primary Examiner* — Edward Dudek, Jr.

(57) ABSTRACT

An integrated circuit (IC) that includes content addressable memories (CAM) is described. A CAM receives a key and searches through entries stored in the CAM for one or more entries that match the key. If a matching entry is found, the IC returns a storage address indicating a memory location at which the matching was found.

32 Claims, 36 Drawing Sheets

(56) References Cited

U.S. PATENT DOCUMENTS

| | | | |
|---|---|---|---|
| 5,566,349 | A | 10/1996 | Trout |
| 5,737,578 | A | 4/1998 | Hennenhoefer et al. |
| 5,802,003 | A | 9/1998 | Iadanza et al. |
| 5,804,986 | A | 9/1998 | Jones |
| 5,913,229 | A | 6/1999 | Joo |
| 5,914,906 | A | 6/1999 | Iadanza et al. |
| 5,940,603 | A | 8/1999 | Huang |
| 5,940,852 | A * | 8/1999 | Rangasayee ............ G11C 11/41 365/189.07 |
| 5,970,240 | A | 10/1999 | Chen et al. |
| 5,982,655 | A | 11/1999 | Doyle |
| 6,038,192 | A | 3/2000 | Clinton et al. |
| 6,044,031 | A | 3/2000 | Iadanza et al. |
| 6,049,222 | A | 4/2000 | Lawman |
| 6,057,707 | A | 5/2000 | Schleicher et al. |
| 6,075,745 | A | 6/2000 | Gould et al. |
| 6,091,263 | A | 7/2000 | New et al. |
| 6,091,645 | A | 7/2000 | Iadanza |
| 6,097,212 | A | 8/2000 | Agrawal et al. |
| 6,098,087 | A | 8/2000 | Lemay |
| 6,118,707 | A | 9/2000 | Gould et al. |
| 6,130,854 | A | 10/2000 | Gould et al. |
| 6,150,838 | A | 11/2000 | Wittig et al. |
| 6,169,685 | B1 | 1/2001 | Gandini et al. |
| 6,172,521 | B1 | 1/2001 | Motomura |
| 6,173,379 | B1 | 1/2001 | Poplingher et al. |
| 6,184,709 | B1 | 2/2001 | New |
| 6,226,710 | B1 * | 5/2001 | Melchior .......... G06F 17/30982 707/999.003 |
| 6,233,191 | B1 | 5/2001 | Gould et al. |
| 6,326,651 | B1 | 12/2001 | Manabe |
| 6,326,807 | B1 | 12/2001 | Veenstra et al. |
| 6,353,332 | B1 | 3/2002 | Brelet |
| 6,411,128 | B2 | 6/2002 | Maeda |
| 6,437,446 | B1 | 8/2002 | Uchida |
| 6,459,646 | B1 | 10/2002 | Yee et al. |
| 6,462,577 | B1 | 10/2002 | Lee et al. |
| 6,483,343 | B1 | 11/2002 | Faith et al. |
| 6,501,698 | B1 | 12/2002 | Mobley |
| 6,526,559 | B2 | 2/2003 | Schiefele et al. |
| 6,573,748 | B1 | 6/2003 | Trimberger |
| 6,603,330 | B1 | 8/2003 | Snyder |
| 6,631,520 | B1 | 10/2003 | Theron et al. |
| 6,732,068 | B2 | 5/2004 | Sample et al. |
| 6,810,442 | B1 | 10/2004 | Lin et al. |
| 6,838,902 | B1 | 1/2005 | Elftmann et al. |
| 6,892,237 | B1 | 5/2005 | Gai et al. |
| 7,082,591 | B2 | 7/2006 | Carlson |
| 7,088,134 | B1 | 8/2006 | Agrawal et al. |
| 7,126,856 | B2 | 10/2006 | Sun et al. |
| 7,131,097 | B1 | 10/2006 | Schlacter |
| 7,133,971 | B2 | 11/2006 | Matick et al. |
| 7,139,862 | B2 | 11/2006 | Hemming |
| 7,145,829 | B1 | 12/2006 | Kim et al. |
| 7,185,121 | B2 | 2/2007 | Fitzsimmons et al. |
| 7,224,182 | B1 | 5/2007 | Hutchings et al. |
| 7,315,918 | B1 | 1/2008 | Yin |
| 7,495,970 | B1 | 2/2009 | Tang et al. |
| 7,765,250 | B2 | 7/2010 | Tsunoda et al. |
| 7,793,040 | B2 | 9/2010 | Bittner, Jr. |
| 7,797,497 | B1 | 9/2010 | Schmit et al. |
| 2002/0073073 | A1 * | 6/2002 | Cheng ............... G06F 17/30982 |
| 2002/0126672 | A1 * | 9/2002 | Chow .................... H04L 29/06 370/392 |
| 2002/0157071 | A1 | 10/2002 | Schiefele et al. |
| 2002/0161568 | A1 | 10/2002 | Sample et al. |
| 2003/0141898 | A1 | 7/2003 | Langhammer et al. |
| 2004/0044849 | A1 | 3/2004 | Stence et al. |
| 2004/0205292 | A1 * | 10/2004 | Lu ..................... H04L 45/7453 711/108 |
| 2005/0007155 | A1 | 1/2005 | Young |
| 2005/0231235 | A1 | 10/2005 | Crotty et al. |
| 2006/0164119 | A1 | 7/2006 | Nowak-Leijten |
| 2006/0176075 | A1 | 8/2006 | Or-Bach |
| 2007/0186036 | A1 * | 8/2007 | Bittner, Jr. ............. G11C 15/00 711/108 |
| 2007/0192752 | A1 | 8/2007 | Bhattacharya et al. |
| 2007/0226541 | A1 | 9/2007 | Brunot et al. |
| 2009/0190386 | A1 * | 7/2009 | Kim ....................... G11C 15/00 365/49.17 |
| 2009/0207642 | A1 | 8/2009 | Shimano et al. |
| 2011/0088005 | A1 | 4/2011 | Arsovski |

OTHER PUBLICATIONS

International Preliminary Report on Patentability for PCT/US2012/064546, May 22, 2014 (mailing date), Tabula, Inc.

Agrawal, O., et al., "An Innovative, Segmented High Performance FPGA Family with Variable-Grain-Architecture and Wide-gating Functions," FPGA 99, Feb. 1999, pp. 17-26, ACM, Monterey, CA, USA.

Ahmad, et al., "Post-Processor for Data Path Synthesis Using Multiport Memories," 1991 Month N/A, IEEE International Conference on Computer-Aided Design (ICCAD-91), Digest of Papers, pp. 276-279.

Altera Corp., "6. DSP Blocks in Stratix II Devices," SII52006-1.0, Feb. 2004, pp. 1-32.

Altera, "Stratix II DSP Performance," White Paper, Feb. 2004, pp. 1-9, ver. 1.0, Altera Corporation, San Jose, CA.

Andraka Consulting Group, Inc., "Multiplication in FPGAs," http://www.andraka.com/multipli.htm, Jan. 25, 2006, pp. 1-7.

Berube, Paul, et al., "FPGA implementation and experimental evaluation of a multizone network cache," Microprocessors and Microsystems, Month Unknown, 2004, pp. 237-352, Elsevier B.V.

Caspi, E., et al., "Stream Computations Organized for Reconfigurable Execution (SCORE): Introduction and Tutorial," Aug. 25, 2000, pp. 1-31, Version 1.0.

Kaviani, A., et al., "Computational Field Programmable Architecture," Custom Integrated Circuits Conference, 1998, Proceedings of the IEEE 1998, May 11-14, 1998, 4 pages.

Kocan, F., et al., "Logic Modules with Shared SRAM Tables for Field-Programmable Gate Arrays," FPL 2004, Aug./Sep. 2004, pp. 289-300, Springer-Verlag, Berlin Heidelberg.

Mandal, C., et al., "Use of Multi-port Memories in Programmable Structures for Architectural Synthesis," Proceedings of $8_{th}$ Annual IEEE International Innovative Systems in Silicon, Oct. 9-11, 1996, pp. 341-351.

Mirsky, E., et al., "MATRIX: A Reconfigurable Computing Architecture with Configurable Instruction Distribution and Deployable Resources," Proceedings of the IEEE Workshop on FPGAs for Custom Computing Machines, Apr. 1996, 10 pages.

Mirsky, E., et al., "MATRIX: A Reconfigurable Computing Device with Configurable Instruction Distribution and Deployable Resources (Extended Abstract)," Hot Chips Symposium 1997, Aug. 1997, pp. 1-3.

Nelson, B.E., "Reconfigurable Computing: An Introduction and Overview," Sep. 23, 1998, pp. 1-43.

Ouaiss, I., et al., "Hierarchical Memory Mapping During Synthesis in FPGA-Based Reconfigurable Computers," Proceedings of Design, Automation and Test in Europe Conference and Exhibition. Mar. 13-16, 2001, pp. 650-657.

Perissakis, S., et al., "Embedded DRAM for a Reconfigurable Array," Proceedings of the 1999 Symposium on VLSI Circuits, Jun. 1999, slides 1-24.

Perissakis, S., et al., "Embedded DRAM for a Reconfigurable Array," Proceedings of the 1999 Symposium on VLSI Circuits, Jun. 1999, 4 pages.

Plunkett, B., et al., "Adapt2400 ACM Architecture Overview," A Technology Whitepaper, 2004 Month N/A, pp. 1-9, QuickSilver Technology, Inc.

QuickLogic Corp., "Ultra-Low Power FPGA Combining Performance, Density, and Embedded RAM", Eclipse ll Family Data Sheet, Nov. 2005, pp. 1-92, QuickLogic Corporation, US.

Schmit, H., et al., "FPGA Switch Block Layout and Evaluation," FPGA '02, Feb. 24-26, 2002, 8 pages, ACM, Monterey, California, USA.

(56) References Cited

OTHER PUBLICATIONS

Schmit, H., et al., "Synthesis of Application-Specific Memory Designs," IEEE Transactions on Very Large Scale Integration (VLSI) Systems, Mar. 1997, vol. 5, No. 1; pp. 101-111.
Seo, et al., "Memory Allocation and Mapping in High-Level Synthesis—an Integrated Approach," 2003, IEEE Transactions on Very Large Scale Integration (VLSI) Systems, vol. 11, Issue 5, pp. 928-938.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.
Wilton, S.J.E., "Memory-to-Memory Connection Structures in FPGAs with Embedded Memory Arrays," FPGA 97, Feb. 1997, pp. 10-16, ACM, Monterey, California, USA.
Xilinx, Inc., "Virtex-4 Family Overview," Advance Product Specification, Sep. 10, 2004, pp. 21-30, v1.1, Xilinx, Inc.

* cited by examiner

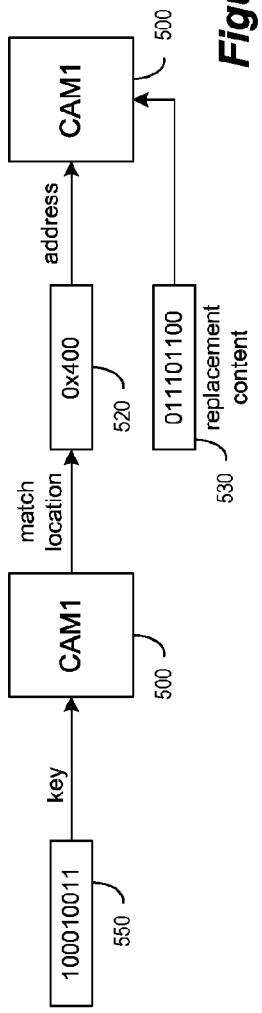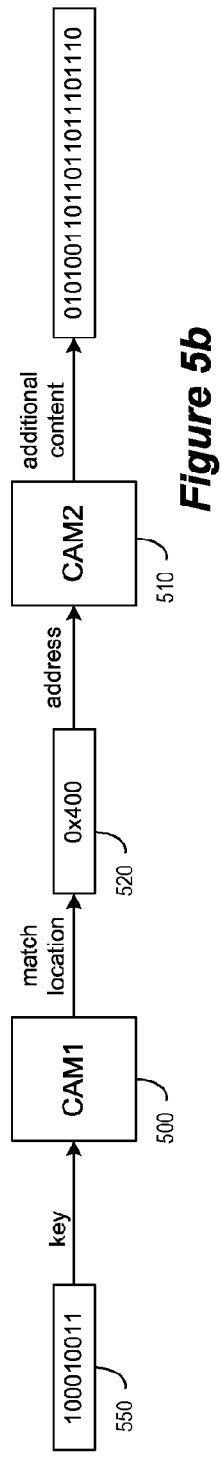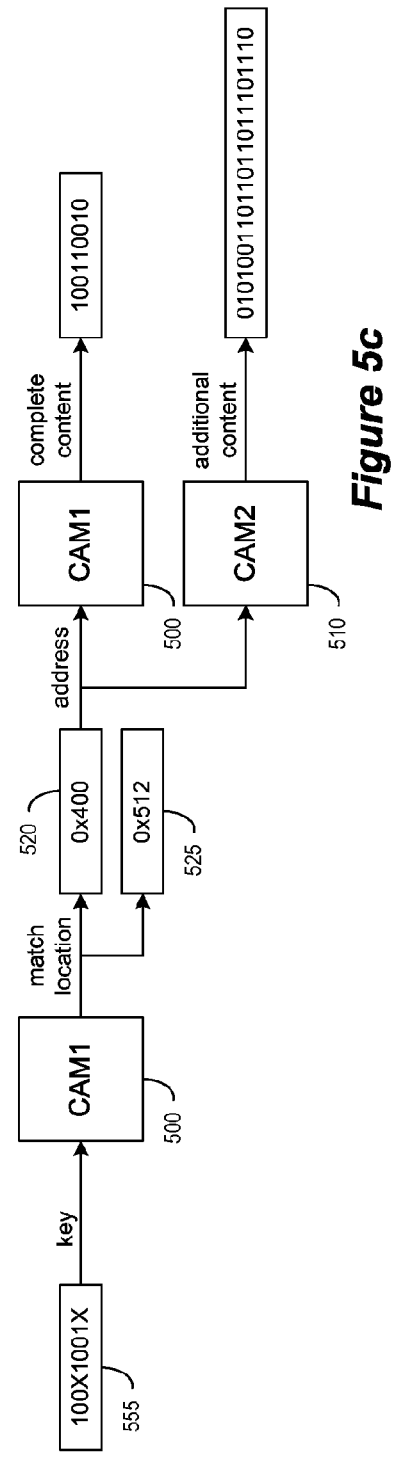

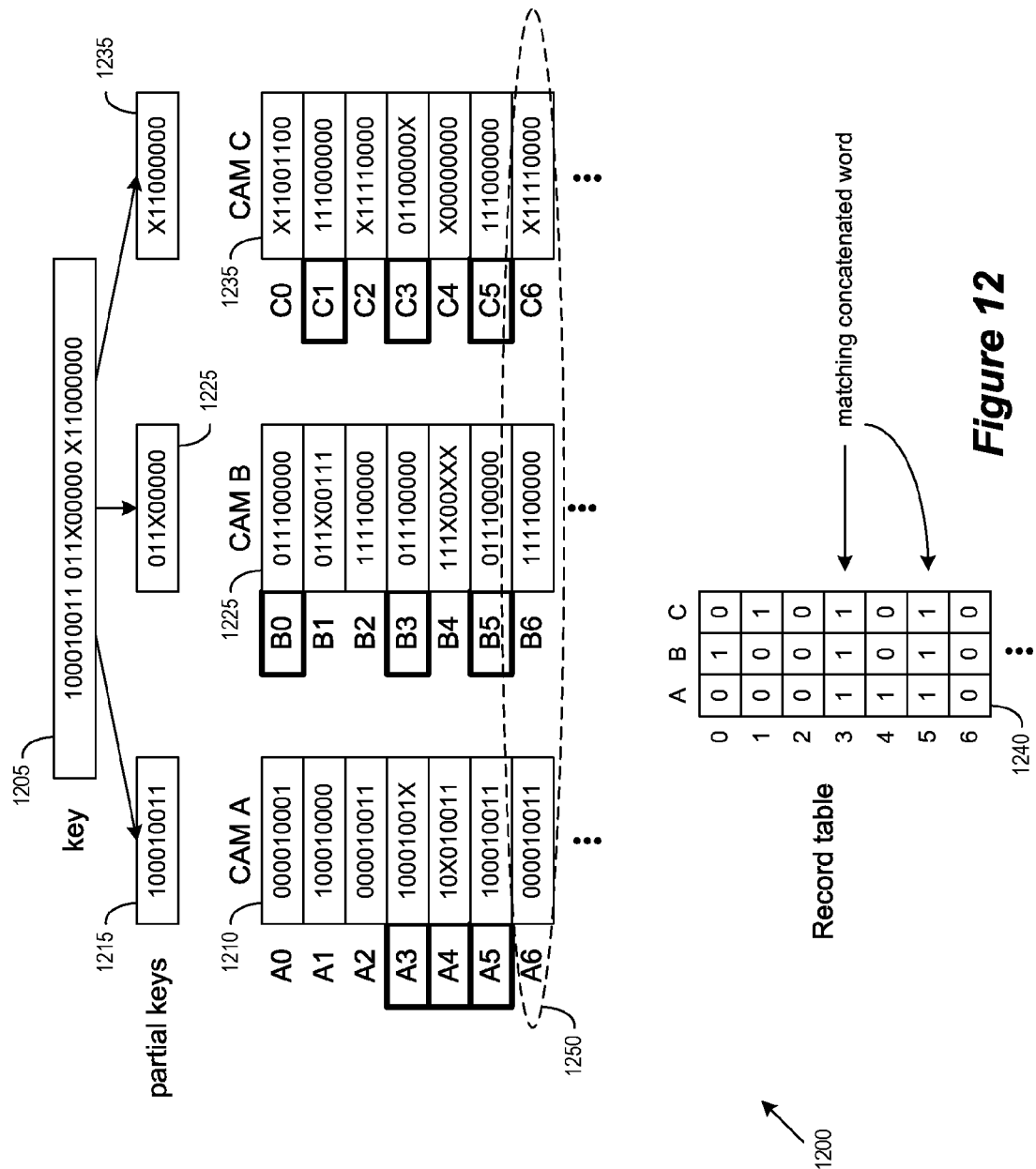

CONTENT ADDRESSABLE MEMORY IN INTEGRATED CIRCUIT

FIELD OF INVENTION

The present invention is directed towards configurable ICs having content addressable memories (CAMs).

BACKGROUND

Unlike standard computer memory (random access memory or RAM) in which the user supplies a memory address and the RAM returns the data word stored at that address, a content addressable memory (CAM) is designed such that the user supplies a data word and the CAM searches its entire memory to see if that data word is stored anywhere in it. If the data word is found, the CAM returns a list of one or more storage addresses where the word was found.

Because a CAM is designed to search its entire memory in a single operation, it is much faster than RAM in virtually all search applications. However, there are cost disadvantages to CAM. Unlike a RAM chip, which has simple storage cells, each individual memory bit in a fully parallel CAM must have its own associated comparison circuit to detect a match between the stored bit and the input bit. Additionally, match outputs from each cell in the data word must be combined to yield a complete data word match signal. The additional circuitry increases the physical size of the CAM chip which increases manufacturing cost. The extra circuitry also increases power dissipation since every comparison circuit is active on every clock cycle. Consequently, CAMs are only used in specialized applications where searching speed cannot be accomplished using a less costly method.

Despite the cost disadvantages associated with CAMs, attempts have been made to integrate CAM functionality within general purpose programmable logic devices. However, previous such attempts have not been commercially successful. One reason this is so is because usage of CAMs varies widely in the width of the comparison field. Different CAM applications can require widths from 16 bits up to 360 bits. Memories and hence hard CAMs offered by these FPGAs have very limited variation in width, usually only up to 36 bits wide. This limitation is at odds with a FPGA's goal of handling a wide variety of applications, such as supporting exact and associative look-ups with a very wide variety of widths.

A real-time reconfigurable device reconfigures to execute each portion of a design in an automatically defined sequence of steps. Such a programmable device can reconfigure on the fly at multi-GHz rates to support higher density memories and routing resources. There is therefore a need for integrating CAM functionalities into a real-time reconfigurable device such that the speed advantages of CAM functionality can be realized at minimal additional cost. There is also a need for such a real-time reconfigurable device to support a wide range of applications, including exact and associative look-ups at a very wide variety of widths.

SUMMARY

Some embodiments of the invention provide an integrated circuit ("IC") that includes content addressable memories ("CAM"). A CAM receives a key and searches through entries stored in the CAM for one or more entries that match the key. If a matching entry is found, the IC returns a storage address indicating a memory location at which the matching entry was found. The CAM includes circuitry for comparing the content of the CAM with the key and producing an indication as to whether the content of the CAM matches the key. To determine whether there is a match between the content of the CAM and the key, some embodiments search through several memory locations sequentially and compare the content of each memory location with the key.

Some embodiments subdivide the memory array of a CAM into multiple banks or sets of memory cells. The memory cells in a set (or a bank) are organized into multiple addressable memory locations. To determine whether there is a match between the content of the set and the key, some embodiments sequentially search through the set's memory locations and compare the content of each memory location with the key. In some embodiments, each set of memory cells has its own set of supporting circuitry for comparing its content against the key, such that a CAM with multiple sets of memory cells can conduct a content searching/key matching operation simultaneously for different sets of memory cells. To reduce the number of memory locations in a set that a given key matching operation must sequentially search through, some embodiments use hashing functions to divide the memory locations in the set into hashed buckets. The key matching operation in some of these embodiments only searches memory locations in the bucket selected by the hash function.

In some embodiments, the IC that includes the CAMs also includes configurable circuits that configurably perform operations based on configuration data stored in configuration data storage in the IC. The configurable circuits in the IC form a configurable fabric that includes configurable logic circuits and configurable routing circuits. The CAMs are interconnected with the configurable circuits in the fabric such that the CAMs can become part of a user design that incorporates both configurable circuits in the fabric and some or all of the CAMs in the IC.

A user design in some embodiments can define a group of CAMs as a larger user defined CAM module, a larger user defined ternary CAM ("TCAM") module, or a larger user defined random access memory (RAM). A single entry in a CAM or TCAM module can be defined to include memory locations within the same CAM or across multiple CAMs.

In some embodiments, the configurable circuits in the configurable fabric are reconfigurable circuits. A user design that is defined based on a user design clock is implemented in the IC using the reconfigurable circuits, which reconfigure several times within one user design clock cycle. In some of these embodiments, the reconfigurable circuits reconfigure according to a reconfiguration clock. The reconfiguration clock is a faster running clock than the user design clock. In some embodiments, the reconfiguration clock is a sub-cycle clock of the user design clock. In some embodiments that include reconfigurable circuits that runs on the reconfiguration clock, a CAM searches through the stored entries by comparing one set of memory cells with the key per reconfiguration clock. In these embodiments, a CAM examines multiple entries for comparison against the key in each of the user design clock cycles.

In some embodiments, at least some of the CAMs in the IC are TCAMs. Each TCAM includes comparators with individual bits that can be masked so these bits do not participate in the determination of whether an entry matches the key. In some embodiments, each bit of a key is a logical bit (or ternary pair) that includes two physical bits for denoting logical '1', logical '0', and logical 'X' (or "don't care"). In some embodiments, each bit of an entry is a logical bit that includes two physical bits for denoting logical '1', logical '0', and logical 'X' (or "don't care"). A logical bit with a logical 'X' causes the comparator to mask the bit and to disregard the bit when determining the match. Instead of TCAMs, some embodiments use regular CAMs and configurable circuits in the fabric to implement TCAM functionalities.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed.

BRIEF DESCRIPTION OF THE DRAWINGS

The novel features of the invention are set forth in the appended claims. However, for purpose of explanation, several embodiments of the invention are set forth in the following figures.

FIGS. 5a-c illustrate some examples of memory access operations performed by an IC that uses a CAM to determine a match location and then to perform further memory access operations based on the determined match location.

FIG. 12 conceptually illustrates a content searching/matching operation that is performed by using a record table.

DETAILED DESCRIPTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Content Addressable Memories

Some embodiments of the invention provide an integrated circuit ("IC") that includes content addressable memories ("CAM"). A CAM receives a key and searches through entries stored in the CAM for one or more entries that match the key. If a matching entry is found, the IC returns a storage address indicating memory location in which the matching was found.

Figure 1:
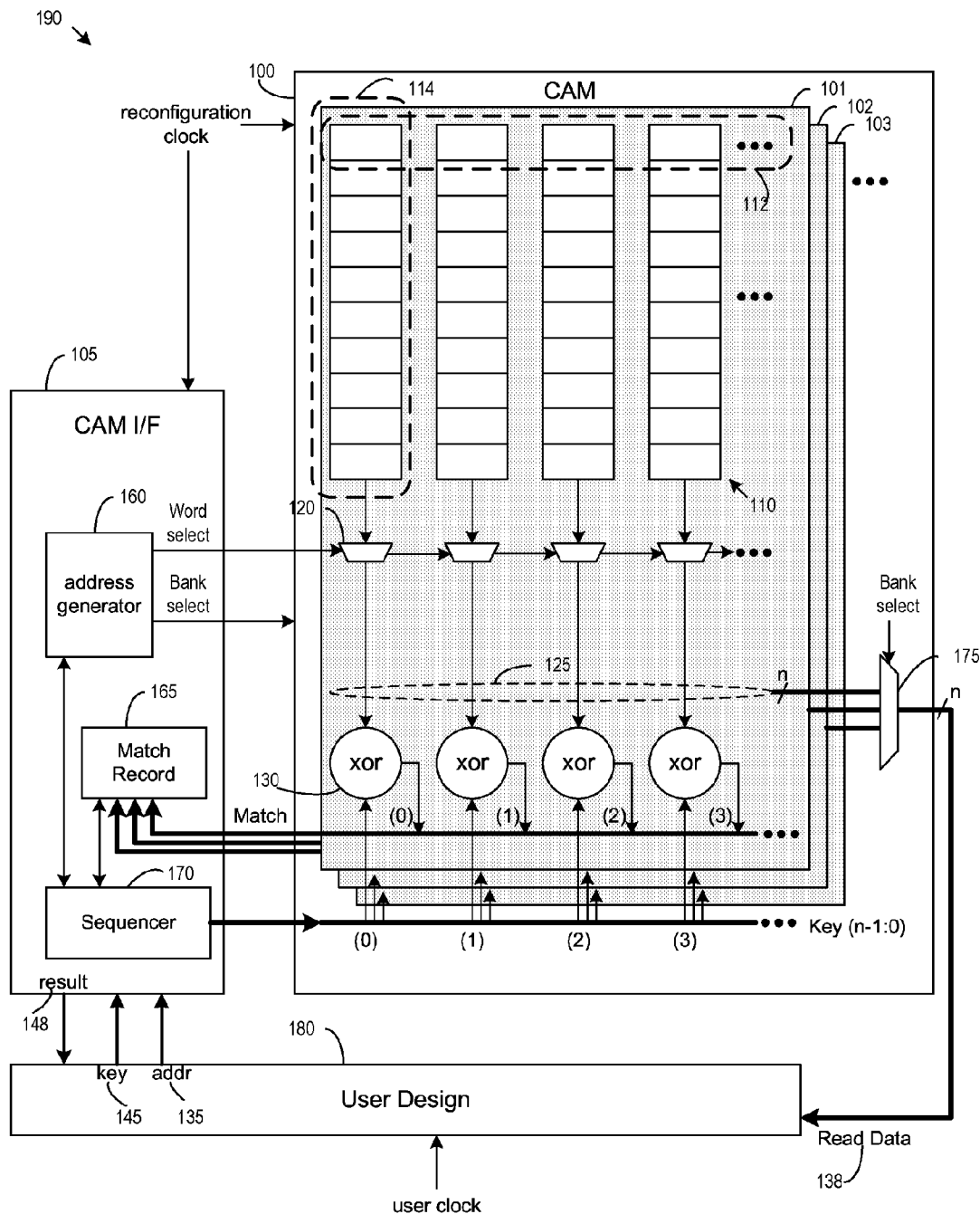
FIG. 1 illustrates an example block diagram of a CAM in an IC.

For some embodiments, FIG. 1 illustrates a block diagram of an IC 190 that includes a CAM 100 capable of supporting content searching/key matching operations required by a user design (or user logic) 180. The user design produces a key 145, which is used by the CAM interface 105 to look for a matching entry in the CAM 100. A result 148 of the matching operation is reported back to the user design 180.

The user design 180 can also directly read or write any particular address location in the CAM 100 by using an address bus 135 and receives read data 138.

The CAM 100 is divided into several banks that include banks 101-103. Each bank of the CAM 100 includes an array of n-bit wide memory cells, such as the array 110 in the bank 101. An operation to retrieve content from the CAM through a read port will cause n-bit wide content to be retrieved from all banks in the CAM 100 based on a word select signal, but only the content from one of the banks will be selected for output to the user design 180. A bank multiplexer 175 is provided for selecting the retrieved content from one of the banks to output through the CAM's read port based on a bank select signal. Both the bank select signal and the word select signal are provided by the CAM interface 105.

Each bank in the CAM 100 receives an n-bit key from the CAM interface 105 that is derived from the key 145 given by the user design. Different embodiments derive the n-bit key from the key 145 differently. In some embodiments, all or some of the banks receive a same n-bit key that is derived from the key 145 (e.g., exact copy of or the same portion of the key 145). Having identical n-bit keys across multiple banks allows multiple searching/matching operations to take place simultaneously for a same given key. On the other hand, in some embodiments, some or all of the banks receive n-bit keys that are unique to each bank (e.g., each bank receives a different portion of the key 145). Having n-bit keys that are unique to each bank allows searching/matching operations that are based on a key 145 that is wider than n.

The memory cells in the array 110 are organized into a number of rows and columns, including row 112 and column 114. Each of the columns includes a bit of from each row. At the output of each of the columns is a multiplexer for selecting among the memory cells of the column based on the word select signal and for retrieving content from the selected memory cells. For example, multiplexer 120 receives inputs from all memory cells of the column 114 and output the bit from the memory cell in the row or word selected by the word select signal. In some embodiments, the multiplexer 120 is not one single physical component but rather represents circuitry that uses the word select signal to select a bit in a packed memory array and then deliver the addressed bit to the circuits outside of the packed memory array. All of the multiplexers at the outputs of the columns are controlled by the same word select signal. The word select signal can therefore be viewed as selecting from one of the words stored in the memory array. The outputs of the multiplexers form a retrieved word 125. One of ordinary skill in the art would recognize that the word select signal can be a binary coded address bus (e.g., 4 bits needed to select from 10 address locations), a group of one-hot signals (e.g., 10 bits needed to select from 10 address locations), a gray coded address bus, or any other type of address coding scheme.

In addition to the memory cells, each bank of the CAM 100 also includes a number of logic elements for comparing the data retrieved from the memory cells with the n-bit key. For the bank 101, the XOR gates (including the XOR gate 130) compares each bit of the word selected by the word selected signal with each bit of the n-bit key. The bit-wise comparison yields an o-bit match result from each of the banks 101-103. The match result is sent to the CAM interface 105. A logic '1' in the match result indicates that there is a mismatch between the key and the retrieved word at that particular bit location. One of ordinary skill in the art would recognize that the production of the match signal can be implemented by different logic gates. For example, some embodiments use EQ gates (i.e., inverse or XOR) such that a logic '1' in the match result indicate that there is a match between the key and the retrieved word at that particular bit location.

The CAM interface 105 represents circuits outside of the CAM 100 that interfaces the CAM. In some embodiments, the CAM 100 communicates with the rest of the IC through the CAM interface circuit 105. The CAM interface 105 provides the bank select signal, the word select signal and the n-bit key to the CAM 100. The CAM interface 105 also receives the match indication from the CAM 100. The CAM 100 generates the word select, the bank select, and the n-bit key to the CAM 100 based on the key and the address signals received from the user design 180.

As illustrated, the CAM interface 105 includes an address generator 160, a match record 165, and a sequencer 170. The address generator 160 generates the word select signal and the bank select signal based on the address 135 received from the user design 180. In an operation to find a matching content, the address generator 160 in some embodiments increments the word select every clock cycle so a new word can be retrieved from the memory array 112 for comparison each clock cycle. In an operation to read from or to write into a particular address location in the memory, the address generator 160 in some embodiments generates the bank select signal based on the most significant bits of the address 135 and the word select signal based on the least significant bits of the address 135.

The match record 165 and the sequencer 170 are parts of a set of circuits for determining the location of the matching word in the CAM. The match record 165 receives matching result bits from all of the banks for some or all of the words. In some embodiments, the match record 165 stores the received matching result bits in a storage element (such as memory arrays or registers). The matching result stored in the storage element can then be accessed by the sequencer 170 or the user design 180 to determine which entry or entries in the CAM matches the key.

In some embodiments, the match record includes a set of circuits that logically combines, for each clock cycle, the match result bits produced in that clock cycle into one or more status bits. The sequencer 170 uses these status bits to determine, at each clock cycle, whether there is a match that occurs in that clock cycle. If there is, the sequencer 170 uses the word select signal from the address generator 160 to determine the location of the entry in the CAM that matches the key. In some embodiments, the CAM interface stops incrementing the word select signal as soon as a matching entry is found so the content of the matching entry is available for the user design 180 to immediately access. In some embodiments, the sequencer 170 reports the matching address to the user design 180, so the user design can use the address to retrieve the data from the CAM 100 or to perform other operations.

The user design 180 is a set of circuits in the IC 190 that uses the CAM 100 to perform a set of operations. Based on the set of operations it has to perform, the user design 180 produces the key 145 to the CAM interface 105 for finding a matching entry in the CAM 100. The user design receives the result 148 of the operation to find the matching entry from the CAM interface 105. The result 148 can be the matching result bits stored in the matching record 165. The result 148 can also be the address of the matching entry as determined by the sequencer 170.

The user design 180 produces the address 135 for retrieving data from or writing data to the memory cells in the CAM 100. After the CAM interface 105 has finished its content matching operation, the user design 180 in some embodiments accesses the matching result in the match record 165 in order to determine which entries in the CAM 100 matches the key. In some embodiments, the sequencer 170 in the CAM interface 105 determines which entry in the CAM matches the key, and the user design 180 receives the address and/or the content of the matching entry from the CAM interface 105.

In some embodiments, the user design 180 includes a set of configurable circuits (including configurable logic circuits and configurable routing circuits) that is configured to perform a set of operations that requires the use of a CAM. The user design is defined to operate in a user clock and implemented on a set of configurable circuits that reconfigures multiple times within each user clock cycle. The reconfiguration of configurable circuits in the user design 180 is based on a reconfiguration clock such that the configurable circuits reconfigure once every reconfiguration clock cycle. In some embodiments, the reconfiguration clock is a sub-cycle clock of the user clock such that one user clock cycle includes multiple reconfiguration clock cycles.

As illustrated in FIG. 1, the reconfiguration clock that is use to reconfigure the configurable circuits in the user design 180 is also used to clock the circuits in CAM 100 and the CAM interface 105. As a result, the CAM 100 and the CAM interface 105 are able to search through (i.e., perform content matching) multiple address locations within each user clock cycle. By performing content matching simultaneously across multiple banks of memory arrays in every reconfiguration clock cycle, the CAM 100 is able to provide a fast performing CAM using a densely packed memory array.

Figure 1A:
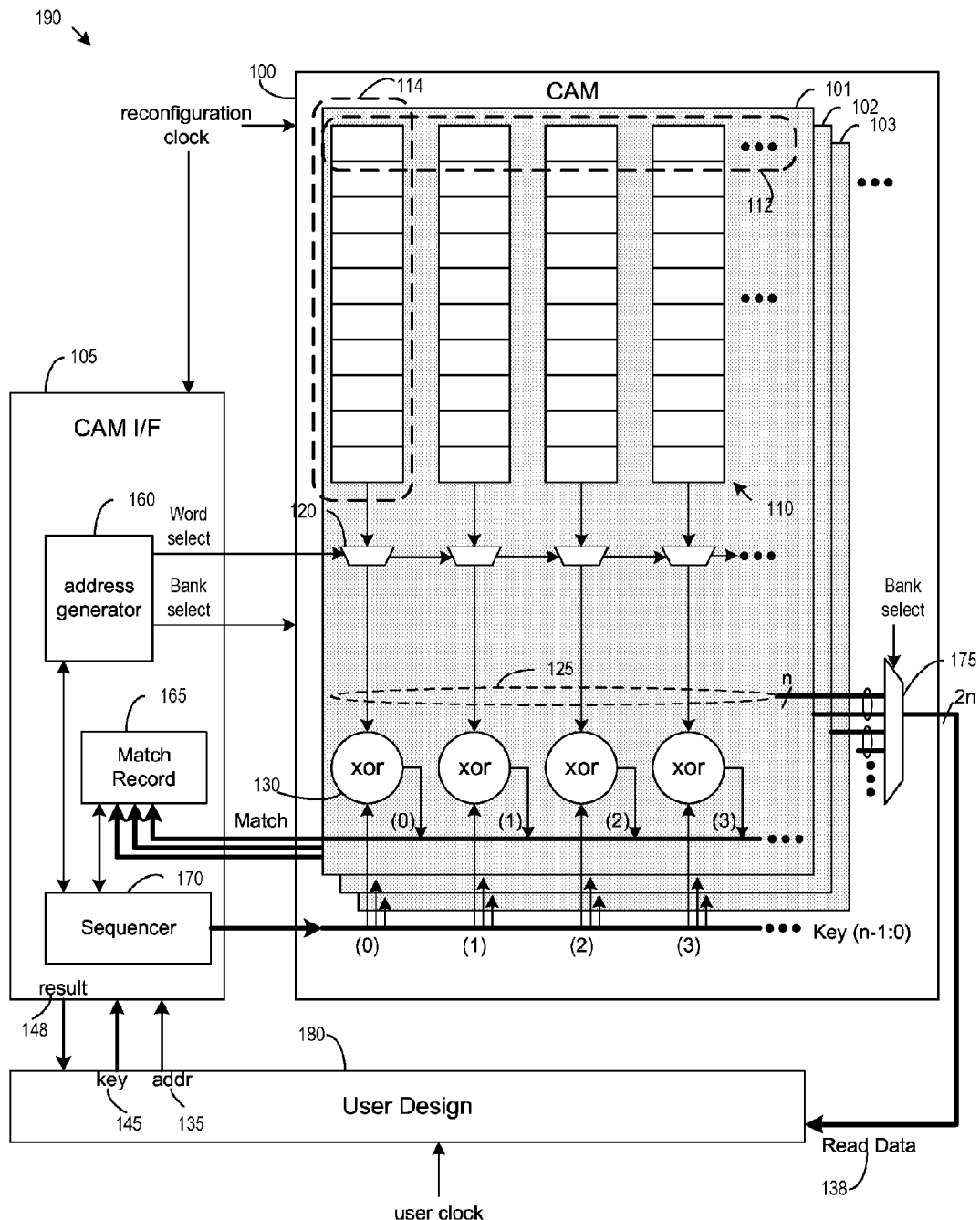
FIG. 1a illustrates a wider bank select multiplexer for providing data access to multiple banks in a CAM.

In some embodiments, a CAM having multiple banks allows data access to two or more of the banks at the same time. FIG. 1a illustrates a wider bank select multiplexer 175 that, instead of selecting and outputting one n-bit content from one of the banks, selects two (or more) n-bit wide content from two (or more) of the banks in the CAM 100 and provides a 2*n (or m*n) bits wide output through the read port.

Figure 1B:
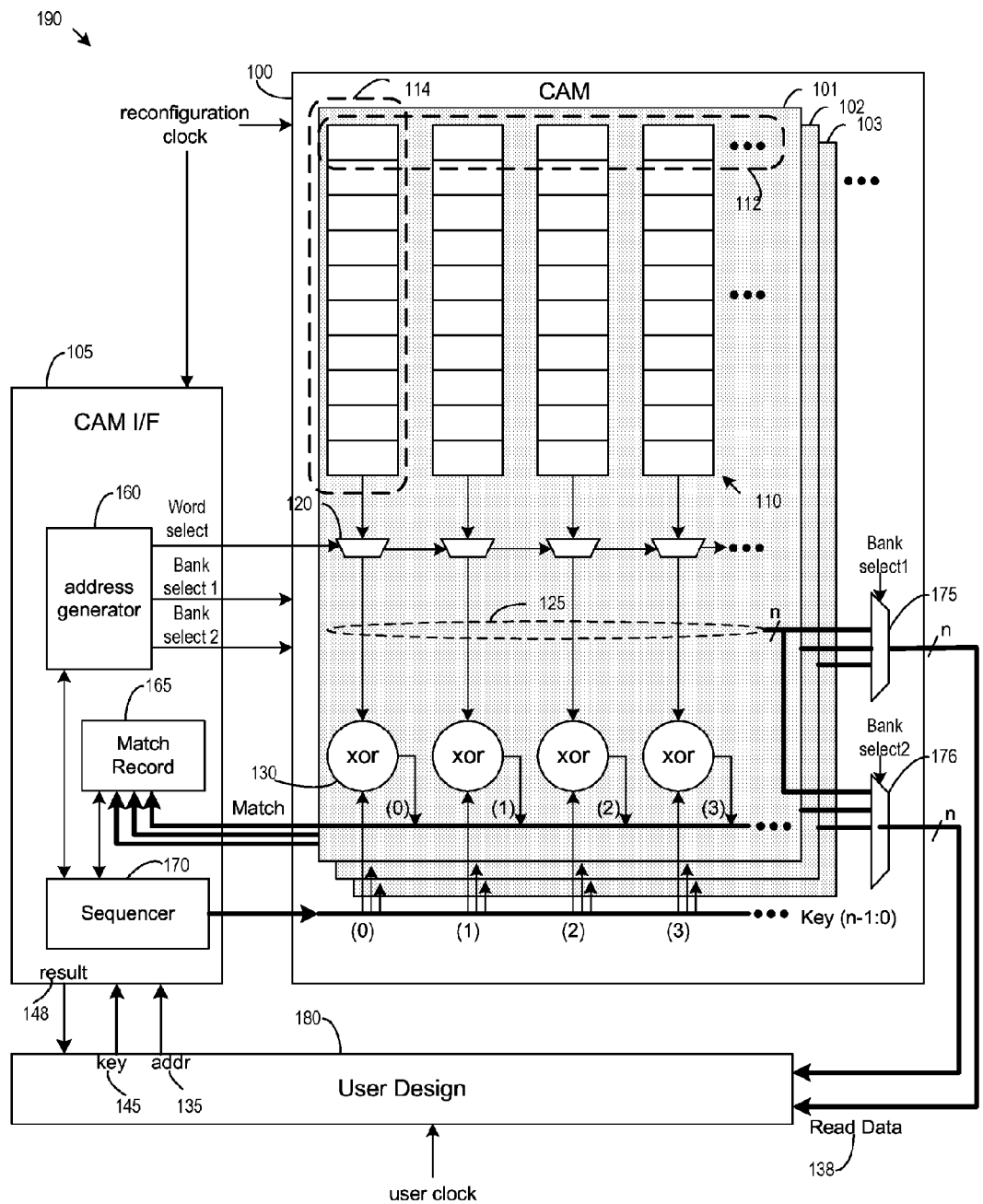
FIG. 1b illustrates multiple bank select multiplexers for providing data access to multiple banks in a CAM.

Some embodiments provide simultaneous access to additional banks by including additional bank select multiplexers. FIG. 1b illustrates an additional bank select multiplexer 176 in the CAM 100 for providing simultaneous access to multiple banks. As illustrated, each of the bank multiplexers 175 and 176 receives its own bank select signal and selects its own output from one of the banks in the CAM 100. In some embodiments, the bank select signals of the different bank multiplexers are derived from a same set of address (i.e., address bus 135) such that the output of the different bank multiplexers comes together to form one wider read port. In some other embodiments, the CAM includes multiple address buses to support multiple read ports, such that the bank select signals of the different bank multiplexers are generated from different address buses (not illustrated) and that the outputs from the different bank multiplexers form different read ports.

Figure 2:
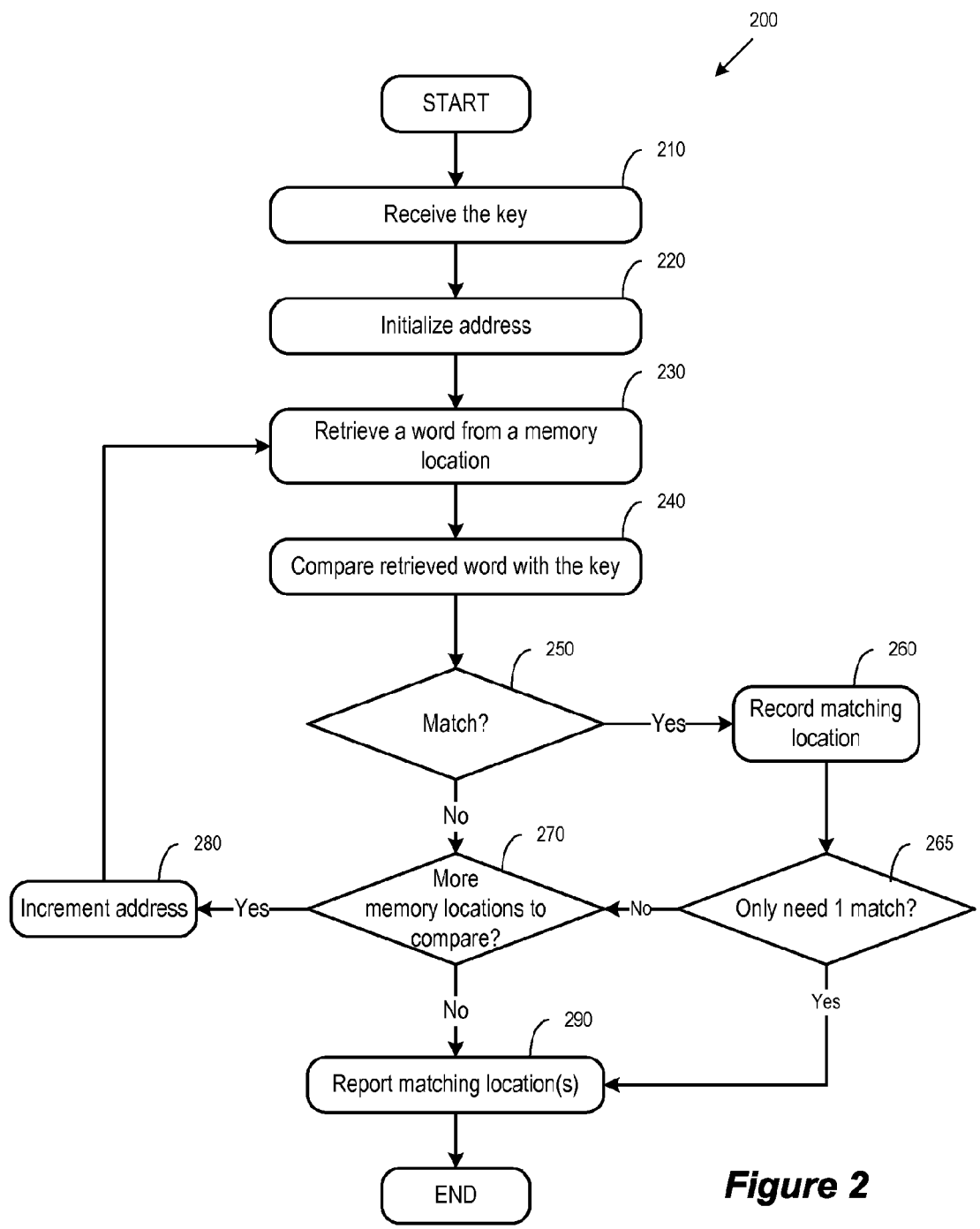
FIG. 2 conceptually illustrates an example process that can be performed by an IC for finding a matching entry or word in a CAM.

For some embodiments, FIG. 2 conceptually illustrates an example process 200 that can be performed by an IC for finding a matching entry or word in a CAM. In some embodiments, the process 200 is performed by a set of CAM interfacing circuitry similar to the CAM interface 105 of FIG. 1. In some of these embodiments, the circuitry that performs this process operates using the reconfiguration clock.

The process 200 starts when the IC performs an operation that generates a key for finding a matching entry in the CAM. The process receives (at 210) the generated key and initializes (220) an address counter to the first word in the CAM to be compared. At 230, the process uses the address being maintained at the address counter to select and retrieve a word from the CAM. For some embodiments that includes multiple banks of memories in a CAM (such as the CAM 100), the address is used to retrieve a word from each of the multiple banks.

The process then compares (at 240) the retrieved word with the key and determines (at 250) whether there is a match. If there is no match, the process 200 proceeds to 270. If there is a match, the process records (at 260) the address location of the word that matches the key. In some embodiments, every memory location that matches the key will be recorded. In some embodiments, only the first memory location that matches the key will be recorded. The recording of matching memory locations is further described below by reference to FIGS. 6, 18, and 19. After recording the matching memory locations, the process 200 proceeds to 265.

At 265, the process determines whether only one match is needed for the content matching operation. In some CAM operations, a key may match multiple entries in the CAM and the process needs to know the address locations of all entries in the CAM that match the key. On the other hand, some CAM operations need only one matching entry (such as when the CAM operation is for determining whether a matching entry exists rather than to find all matching entries). If only one match is needed, the process stops searching for additional matches and proceeds to 290. If more than one match is needed, the process proceeds to 270.

At 270, the process 200 determines whether there are more memory locations to be searched for a match. If there are more memory locations to be searched, the process increments (at 280) the address (e.g., word select from the address generator 160) and proceeds to 230 to retrieve another word for comparison. Otherwise, the process proceeds to 290.

At 290, the process reports the locations of the matching entries (or the location of the one matching entry). In the example of FIG. 1, the reporting of the locations of matching entries is made by the CAM interface 105 to the user design 180. After reporting, the process 290 ends.

As mentioned above by reference to FIG. 1, some embodiments subdivide the memory array of a CAM into multiple banks. The memory cells in a bank can be regarded as a set of memory cells that shares one set of key matching circuitry. The memory cells in a set (or a bank) are organized into multiple addressable memory locations. To determine whether there is a match between the content of the set and the key, some embodiments sequentially search through the set's memory locations and compare the content of each of the memory locations with the key. In some embodiments, each set of memory cells has its own set of supporting circuitry for comparing its content against the key. Having multiple sets of memory cells and multiple sets of supporting circuitry for content searching allows the CAM to conduct content searching/key matching operation simultaneously at different sets of memory cells. The content matching operation performed by using the CAM 100 is based on a key provided by the user logic 180. The user logic (or user design) 180 in turn receives the result of the content searching/key matching operation and use the result to perform other operations such as retrieving the content of the matching entry.

Figure 3:
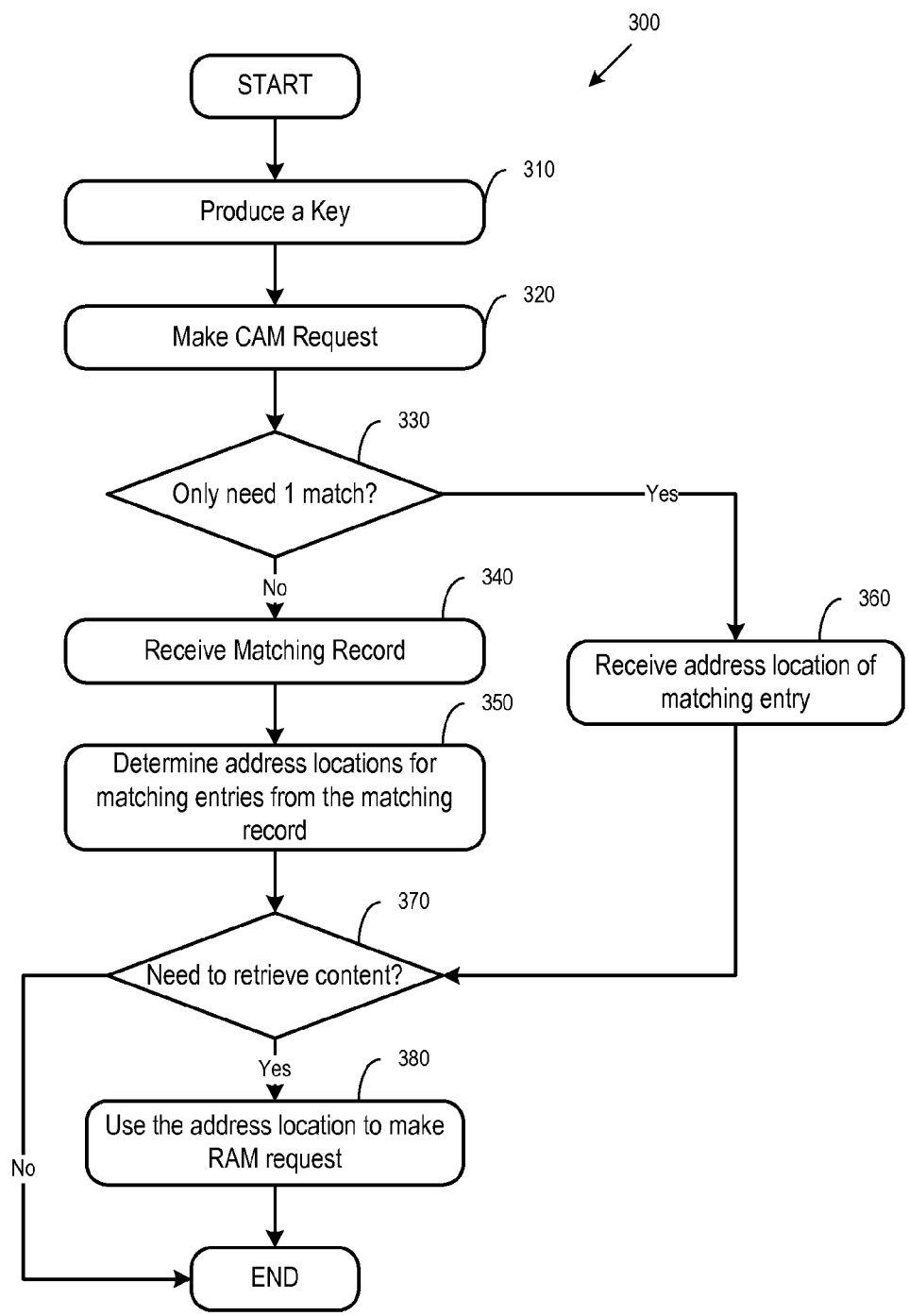
FIG. 3 conceptually illustrates a process for finding entries in a CAM that matches a key.

For some embodiments, FIG. 3 conceptually illustrates a process 300 performed by the user logic 180 in order to find entries in the CAM 100 that matches a key. In some embodiments, this process is defined to operate based on the user clock while the supporting circuitry of the CAM operation (e.g., the CAM interface 105) and the reconfigurable circuits in the user design 180 operate in the reconfiguration clock.

The process 300 starts when the user design is performing an operation that requires the search of the CAM for an entry with content that matches a key. The process produces (at 310) the key and makes (at 320) a request to search the CAM for an entry that matches the key.

Once the CAM (and the CAM interface) has finished searching for the matching entry, the process determines (at 330) whether only one match is needed by the user design. In some embodiments, process requires only one matching entry if, for example, the user design only needs to know whether there is a matching entry at all. If the user design needs to know the locations of all matching entries, the process proceeds to 340. If the user design only needs to find one matching entry in the CAM, the process proceeds to 360. At 360, the process receives the address location of the matching entry and proceeds to 370.

At 340, the process receives the matching record from the CAM interface, which in some embodiments contains the matching result bits from all of the banks for some or all of the words. Based on the matching result stored in matching record, the process determines (at 350) the address locations of matching entries. The determination of matching record from matching result bits will be further described below by reference to FIG. 6.

Next, the process determines (at 370) whether it is necessary to actually retrieve content from the CAM. In some embodiments, the operation being performed requires only knowing whether there are matching entries in the CAM. In some embodiments, the operation being performed by the user design requires only knowing the address locations of the matching entries. If the operation does not require the retrieval of content from the CAM, the process ends. If the process requires the actual retrieval of content from the CAM, the process proceeds to 380.

At 380, the process uses the address location to make a RAM request to the CAM (i.e., treating the CAM as a RAM) and perform a read operation. A user design that does not know the complete content but uses a key with masked bits to find the matching entries would in some embodiments perform memory read operation based on the address location of the matching entry. After making the RAM request, the process 300 ends.

Figure 4:
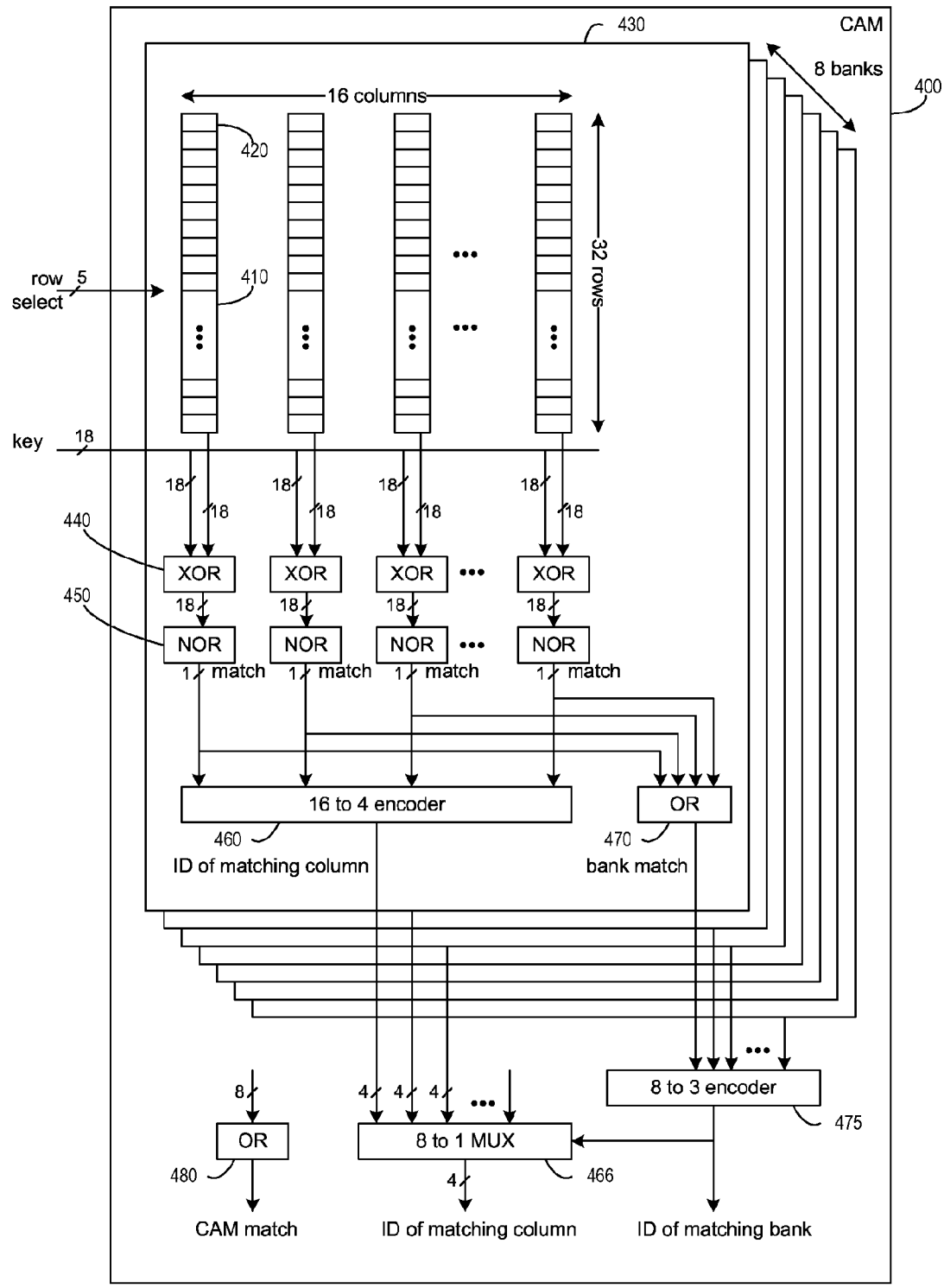
FIG. 4 illustrates an example CAM that includes multiple sets of memory cells and multiple sets of supporting circuitry for content searching.

FIG. 4 illustrates an example CAM 400 that includes multiple sets of memory cells and multiple sets of supporting circuitry for content searching. The example CAM 400 receives an 18-bit key and performs content matching with the 18-bit key. The CAM 400 has a memory array that is organized into banks, columns and rows. Specifically, the memory array in the CAM is distributed among 8 banks (e.g., the bank 430). Each bank includes 16 columns (e.g., the column 410). Each column includes 32 rows of memory cells (e.g., the row 420). Each row of memory cells stores 18 bits of data. Each column (including 32 rows of 18-bits) is associated with a set of key matching circuitry. For example, the column 410 is associated with the 18-bit XOR gate 440 and the 18 to 1 NOR gate 450. Since each column has its own set of key matching circuitry and there are 128 columns in the CAM 400 (16 columns per bank×8 banks=128 columns), the CAM 400 can be regarded as having 128 sets of memory cells (this is unlike the CAM 100 of FIG. 1, in which each bank is regarded as a set of memory cells).

For selecting one row out of the 32 rows for each column of each bank, the CAM 400 also receives a 5-bit row select signal. The 5-bit row select signal selects one row out of 32 rows, and the column 410 retrieves the content from the selected row. The retrieved content (an 18-bit word) is presented to the XOR gate 440 for performing a bit-wise comparison with the 18-bit key. The 18-bit comparison result (a logic '1' at a particular bit position representing a mismatch) is brought together by the NOR gate 450 to produce a one bit a column matching indicator. The matching indicator would be at logic '1' only if there are no mismatches between the key and the retrieved content.

Since all of the columns in all of the banks can simultaneously perform the content searching/key matching operation based on the same row select signal, some embodiments includes additional support circuitry for identifying the column and the bank from which the matching content is found. To identify which of the columns in a bank stores the matching content, each bank has a 16 to 4 encoder (such as 460 of the bank 430) for producing a matching column identifier. Each bank also has a 16 to 1 OR gate (such as the OR-gate 470 of the bank 430) for producing a bank matching indicator. For the bank 430, the 16 to 4 encoder 460 encodes the 16 column matching indicators from the 16 NOR gates (such as 450) into a 4-bit column identifier. The 16 column matching indicators are also OR'ed together by the OR gate 470 to produce the one bit bank matching indicator for the bank 430.

At the CAM level, to identify which of the banks contains the matching content, the CAM 400 has an 8 to 3 encoder 475 and an 8 to 1 multiplexer 465. The 8 matching indicators for the 8 banks are brought together by the 8 to 3 encoder 475 to produce a 3-bit bank identifier for the CAM 400. The 8 to 1 multiplexer 465 then uses the 3-bit bank identifier to select the column identifier from the bank that has the matching content. To produce a final CAM matching indicator for the CAM 400, the CAM 400 includes an 8 input OR gate 480 for OR-ing together all 8 bank matching indicators. Based on the bank identifier, the column identifier, the row select, and the CAM matching indicator, an external logic (such as the CAM interface 105 of FIG. 1) can determine and record the address location of the matching entry in the CAM 400.

Once matching content has been found in a particular CAM, some embodiments use the address location of the match (match location) to perform further memory access operations. For some embodiments, FIGS. 5a-c illustrate some examples of memory access operations performed by an IC that uses a CAM to determine a match location and then to perform further memory access operations based on the determined match location. FIGS. 5a-c illustrate three different memory access operations based on a content search of a CAM 500 (labeled "CAM1") that produces a match location 520.

FIG. 5a illustrates a memory write operation in which the match location is used to update the content of the CAM. As illustrated, a 9-bit key 550 ("100010011") is presented to the CAM1 500, and the content searching/key matching operation of CAM1 determines that memory location 520 has the matching content (i.e., the content at location 0x420 of CAM1 is also "100010011"). The IC then writes the replacement content "011101100" to location 0x420 of CAM1.

FIG. 5b illustrates a memory read operation in which the match location is used to retrieve data from other memory structures (e.g., a RAM or another CAM). As illustrated, the 9-bit key 550 ("100010011") is presented to the CAM1 500, and the content searching/key matching operation of CAM1 determines that memory location 520 has the matching content (i.e., the content at location 0x420 of CAM1 is also "100010011"). The match location 520 is then used to retrieve content from other memory structures in the IC. Some embodiments perform this operation when using the content of CAM1 as associative tags.

FIG. 5c illustrates a memory read operation in which some bits in the key are "don't cares". As illustrated, a 9 bit key 555 has the value "100X10001X", in which 'X' represents "don't care". A "don't care" or 'X' at a particular bit position means that the matching operation does not care whether the key and the content in the CAM matches at that particular bit position. In the example of FIG. 5c, this means that a memory location that stores the value "1001100011" would be considered a match for the key "100X10001X", and so would a memory location that stores the value "1000100010", "1001100010", or "1000100011".

The 9-bit key 555 with "don't cares" is submitted to CAM1 for content searching/key matching and produces two match locations 520 (0x400) and 525 (0x512). The IC then uses the first match location to fetch the actual content without the "don't cares" from CAM1. The first match location can also be used to retrieve content from another memory structure (e.g., CAM2 510) in a memory access operation similar to that is shown in FIG. 5b.

To implement "don't care" bits, each bit of the key in some embodiments is a logical bit (or ternary pair) that includes two physical bits for denoting logical '1', logical '0', and logical 'X' (or "don't care"). In some embodiments, each bit of an entry is a logical bit that includes two physical bits for denoting logical '1', logical '0', and logical 'X'. For example, binary value "00" can be used to express logical '0', binary value "01" can be used to express logical '1', and binary value "10" or "11" can be used to express logical 'X'. One of ordinary skill would understand that other conventions of expressing logical bits are possible.

In some embodiments, comparison between keys and memory content having "don't care" bits are accomplished by masked comparators. For example, when "10" or "11" are used to express "don't care", the most significant bit indicates whether the ternary pair is expressing "don't care" and can be used as the mask bit to mask the result of the comparison at the least significant bit. Some embodiments use ternary CAMs (TCAMs) instead of ordinary CAMs in order to support "don't care" bits in content searching. TCAM and "don't care" bits will be further described below by reference to FIG. 20.

In some embodiments, some or all matching locations will be used to perform additional operations (such as fetching actual content or retrieving additional content). In the example of FIG. 5c, the second matching location 525 (0x512) will also be used for further operations. In some embodiments, matching memory locations are maintained in a match record so that multiple matches can be detected.

Figure 6:
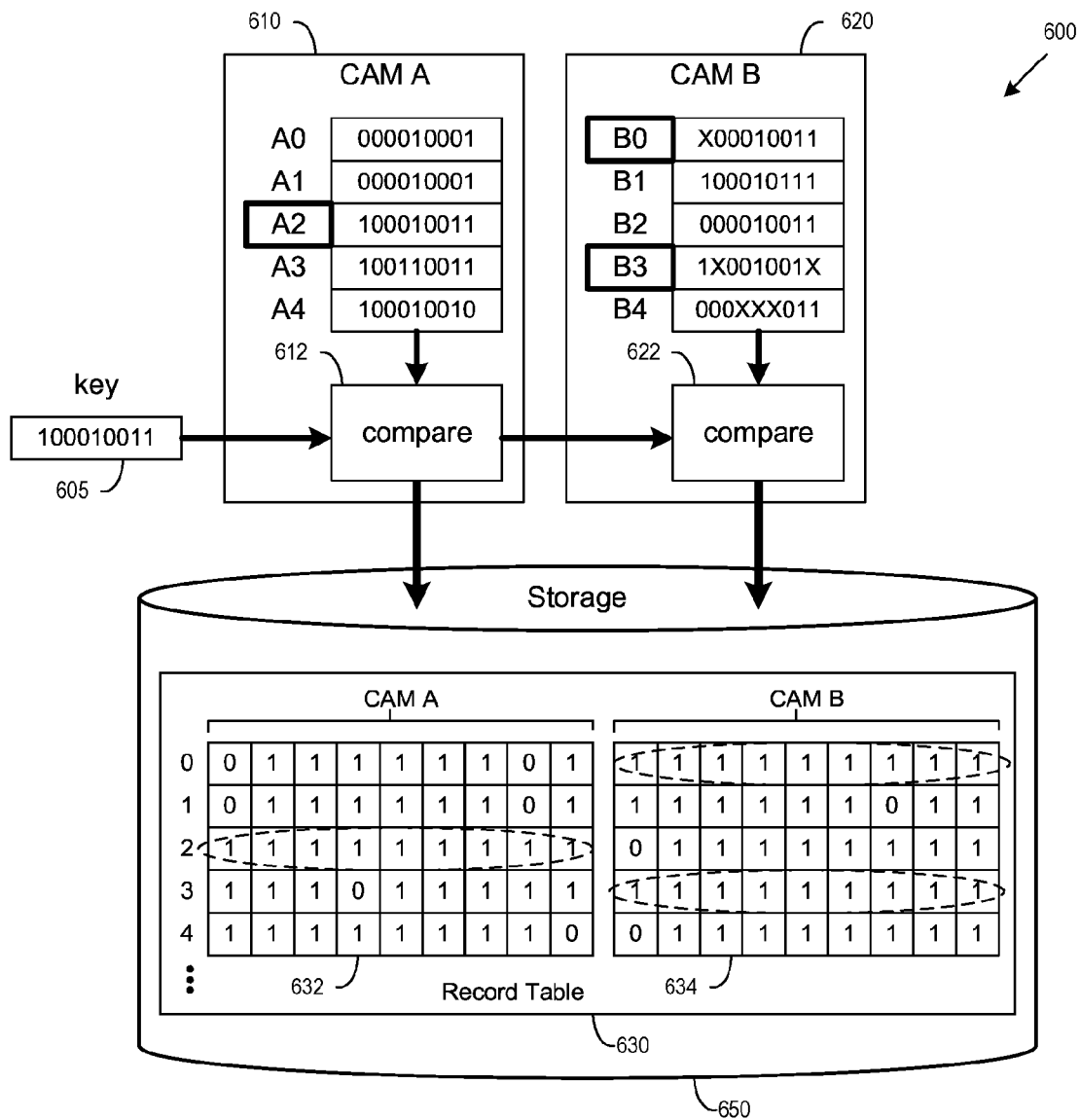
FIG. 6 conceptually illustrates an IC that is performing a content searching/matching operation by using a record table.

The match record is a record of match or non-match between the key and the content of the CAM at every bit position for some or all of the address locations. In some embodiments, such a match record is stored in a storage element as a record table that can be subsequently accessed and analyzed to determine whether there are matching entries and to locate the matching entries. FIG. 6 below illustrates such a record table of matching memory locations.

FIG. 6 conceptually illustrates the recording of the result of a content searching/matching operation. As illustrated, the content searching/matching operation is based on a key 605 that is used to search for matching content in CAMs 610 (CAM A) and 620 (CAM B). Comparators 612 and 622 produce the comparison result between the key 605 and content of the CAMs 610 and 620. The comparison result is recorded as the record table 630.

The key 605 has the value "100010011". The content search and match operation yields three memory locations, A2, B0, and B3 that match this key. Location A2 of CAM A (610) has content "100010011", which is identical to the value of the key 605. CAM B (620) is a TCAM capable of expressing "don't care" ('X') bits. Location B0 has content "X00010011" and location B3 has content "1x001001X". Both locations, B0 and B3, match the value of the key "100010011" as the "don't care" bits are masked.

The record table 630 includes a section 632 that corresponds to CAM A and a section 634 that corresponds to CAM B. Each bit in the record table stores the bit-wise result of the comparison between the key and the content in the CAMs. Every '1' represent a bitwise match and every '0' represent a bitwise mismatch. Every row in the record table 630 corresponds to the comparison result of a memory location in a CAM. In the example of FIG. 6, every bit position in row 2 of record table section 632 is a '1'. This is an indication that memory location A2 of CAM A matches the key 605. Likewise, every bit position in row 0 and row 3 of record table portion 634 is '1'. This indicates that memory locations B0 and B3 matches the key 605. All other rows in the record table contains at least one '0', indicating that there is no match between the key 605 and any of those other memory locations.

In some embodiments, record tables are implemented in storage circuits (such as RAMs, CAMs, latches, or flip flops) in the IC. In the example of FIG. 6, the record table 630 is stored in a storage element 650. The contents of the record table can be accessed by other circuits in the IC for further processing. For example, in an IC with configurable circuits, the record table can be accessed by configurable circuits configured to retrieve data from the record table for determining which memory location has content that matches the key. When the record table indicates that content in more than one memory location matches the key (such as in the example of FIG. 6), some embodiments use the bit pattern in the record table to access some or all of the memory locations with matching content. In addition to, or instead of, accessing content of matching memory locations, some embodiments use the bit pattern in the record table to keep track of matching memory locations.

One of ordinary skill in the art would recognize that the record table 630 is organized into record table sections 632 and 634 for the purpose of illustration. Record tables can be implemented in storage circuits that are organized differently from the record table 630. For example, a record table can span multiple different storage circuits. Alternatively, one single storage circuit can store and keep a record table that includes matching record from multiple CAMs.

Although the example of FIG. 6 illustrates a record table that keeps track of matching record of two different CAMs, one of ordinary skill would realize that a record table can also be used to track matching records from any combination of storage elements that are used to perform content matching/searching operations. For example, a record table can maintain the matching record of three or more CAMs, or two different banks of a same CAM, etc.

Figure 7:
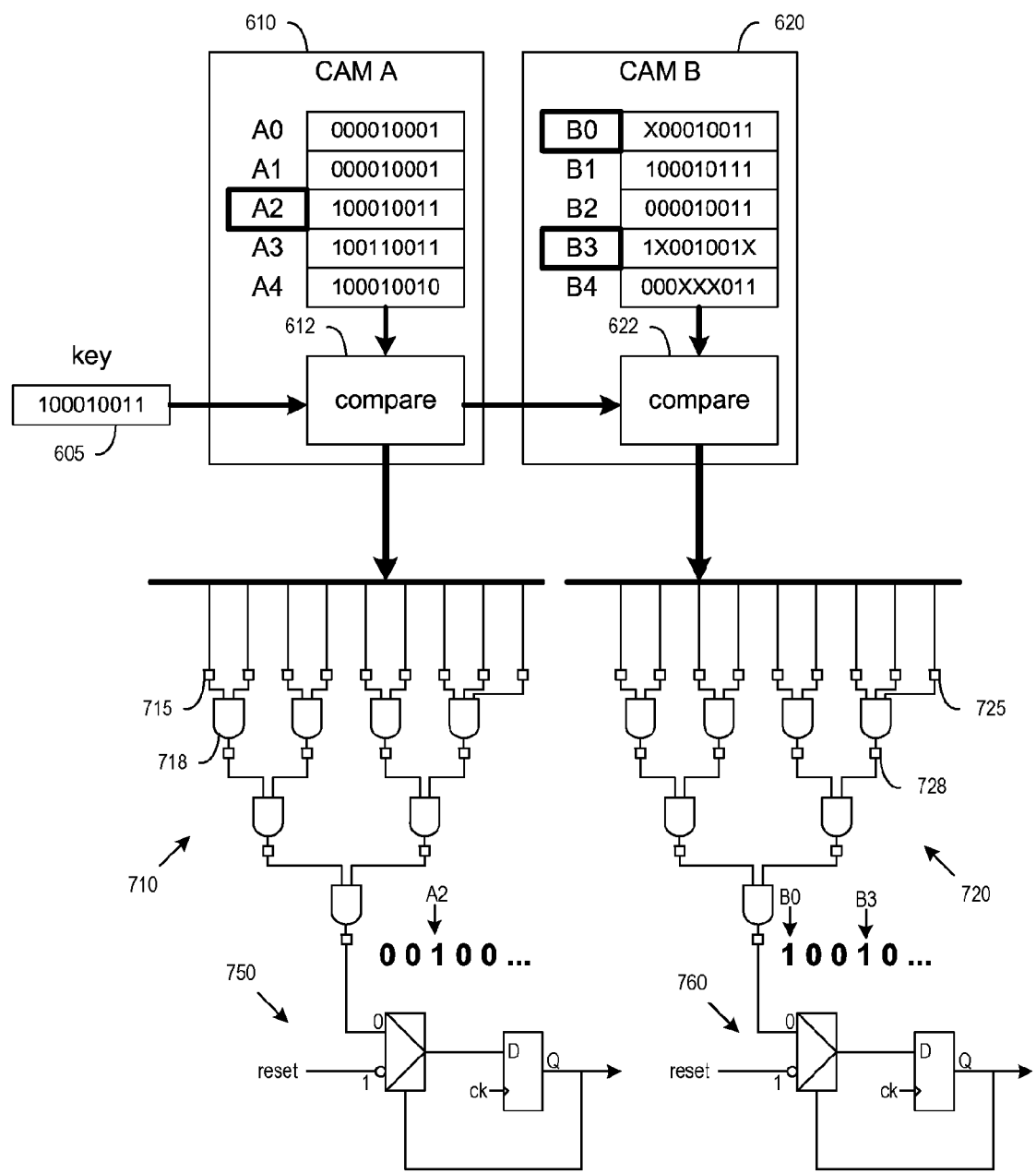
FIG. 7 conceptually illustrates the reduction of matching record.

Instead of saving the complete matching record of content matching/searching operation as a record table in a storage circuits, some embodiments logically reduces the matching record to fewer bits before delivering the reduced result to the user design. FIG. 7 conceptually illustrates the reduction of matching record. Like FIG. 6, FIG. 7 also illustrates a content searching/matching operation that is based on the key 605 that is used to search for matching content in CAMs 610 (CAM A) and 620 (CAM B). Instead of directly recording the result of the comparison in a storage circuit as a record table, the stream of comparison result flows into comparison reduction circuitry 710 and 720. Accumulators 750 and 760 monitor and accumulate the reduced result from the comparison reduction circuitry 710 and 720. As soon as a '1' appear at the output of the comparison reduction circuitry 710, the accumulator 750 becomes a '1' to indicate that a matching entry has been found.

The comparison reduction circuit 710 includes a set of logic gates that receive one row of comparison result each clock cycle from the comparators 612. The comparison reduction circuit 720 includes a set of logic gates that receive one row of comparison result each clock cycle from the comparators 622. Each comparison reduction circuit includes a tree of AND gates to reduce the rows of comparison results that it receives. A comparison result that is all '1' (i.e., a match) will be reduced by the tree of AND gates into a single bit of logic '1'. A comparison result that has at least one '0' (i.e., no match) will be reduced by the tree of AND gates into a single bit of logic '0'. In the example of FIGS. 6 and 7, the comparison between the key 605 and the content of address locations A2, B0, and B3 will result in '1' at the output of the AND-tree, while all other address location will result in '0' at the output of the AND-tree. One of ordinary skill would realize that the comparison reduction circuitry need not be implemented as an AND-tree, and that many other Boolean alternatives can be used to logically reduce comparison bits.

The comparison reduction circuitry 710 and 720 are also pipelined. As the number of comparison bits generated by the comparators can be quite large, the combinational logic (e.g., AND-tree) needed to reduce the large number of comparison bits may not be able to finish its operation within one clock cycle. In some embodiments, it is therefore necessary to divide the combinational logic into multiple pipeline stages. Storage elements (flip flops or latches) such as 715, 718, 725, and 728 are used to store intermediate result between the pipeline stages, so each pipeline stage is able to perform a new computation for a new comparison result in every clock cycle.

In some embodiments, the comparison reduction circuitry 710 and 720 are implemented as part of the CAM interface (such as 105 of FIG. 1) in support of CAM operations. In some of these embodiments, the CAM interface is implemented by using configurable circuits. Using configurable circuits to implement CAM interface (and hence comparison reduction circuitry) allows CAM operations to be customized according to the requirement of user design. Section II below describes ICs that include configurable circuits and CAMs, in which the operation of the CAMs are supported and customized by configurable and/or reconfigurable circuits.

II. Content Addressable Memory and Configurable IC

In some embodiments, the IC that includes the CAMs also includes configurable circuits that configurably perform operations based on configuration data stored in configuration data storage in the IC. The configurable circuits in the IC form a configurable fabric that includes configurable logic circuits and configurable routing circuits. The CAMs are interconnected with the configurable circuits in the fabric such that the CAMs can become part of a user design that incorporates both configurable circuits in the fabric and some or all of the CAMs in the IC. In some embodiments, the configurable circuits in the configurable fabric are configured to provide the necessary circuitry for supporting the content searching/key matching operations as described above by reference to FIGS. 1-5. For example, the CAM interface 105 of FIG. 1 can be implemented by the configurable circuits in the fabric.

Figure 8:
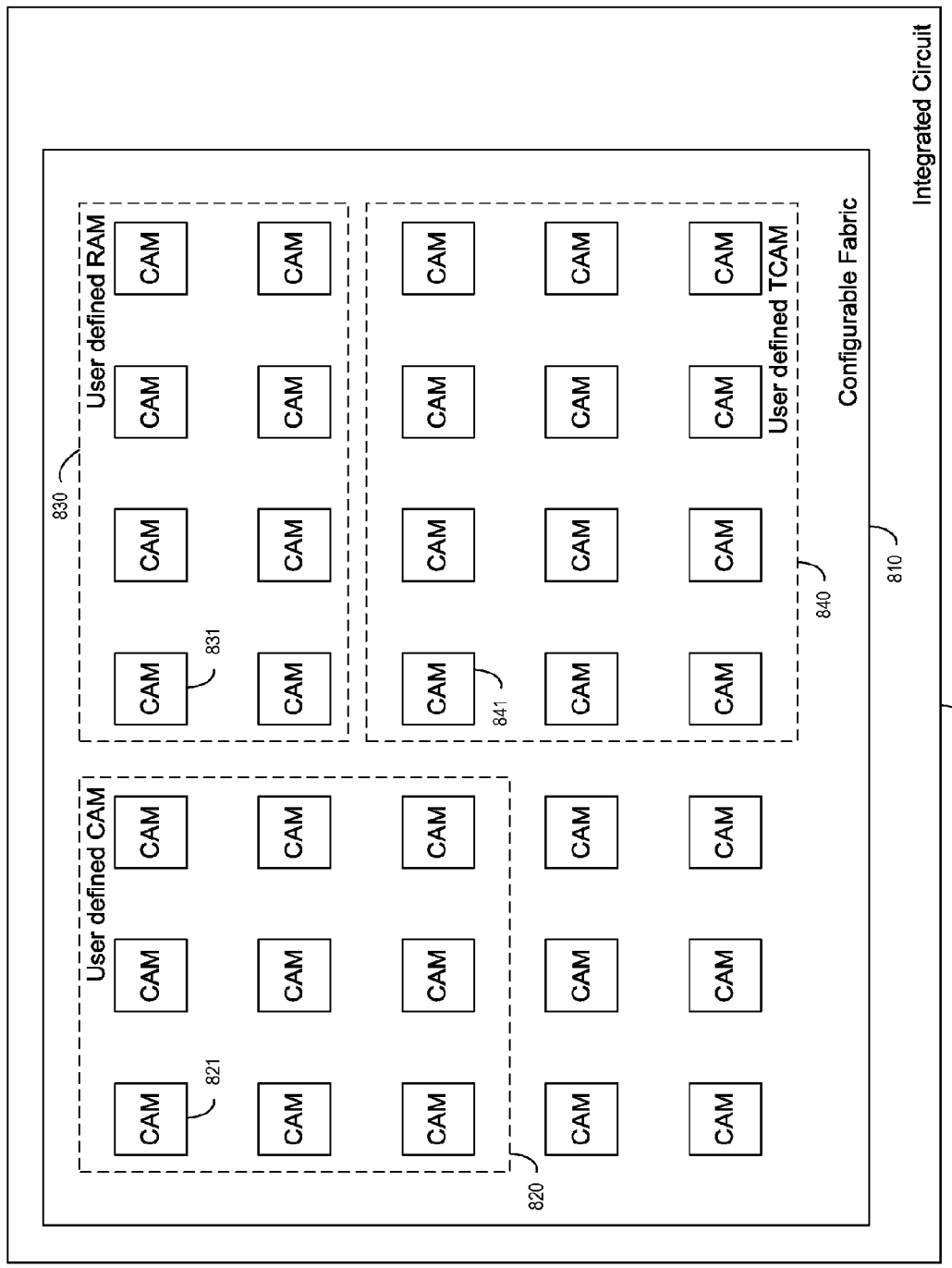
FIG. 8 illustrates an example IC that includes a configurable fabric.

For some embodiments, FIG. 8 illustrates an example IC 800 that includes a configurable fabric 810. The configurable fabric 810 includes configurable logic circuits and configurable routing circuits that can be configured to perform different operations based on configuration data stored in configuration storage in the IC 800. The configurable fabric 810 also includes a number of CAMs such as CAMs 821, 831, and 841. The configuration data in the IC also defines three user defined memory structures: a user defined CAM 820, a user defined RAM 830, and a user defined TCAM 840. The CAMs in the configurable fabric can also be configured to be in different combinations of user defined memory structures, or to not be in any user defined memory structure.

The user defined CAM 820 includes 9 CAMs, including the CAM 821. The user defined CAM 820 can be defined to include more or less CAMs according to different configuration data. Unlike an individual CAM which can perform content searching/key matching for a key of limited width, a user defined CAM can be configured to have a user defined width that is wider than the native width of the individual CAMs. And unlike an individual CAM which can have only a finite amount of content (e.g., the CAM 400 of FIG. 4 only has 32×16×8 rows of 18 bits), a user defined CAM can be configured to have a user defined size that is greater than the limited size of an individual CAM. In some embodiments, this is done by using the configurable circuits in the configurable fabric 810 to cascade or concatenate multiple CAMs. The concatenation or cascading of CAMs will be described further by reference to FIGS. 9 and 10 below.

The user defined RAM 830 includes 8 CAMs, including the CAM 831. Like the user defined CAM 820, the user defined RAM 830 can cascade and concatenate the CAMs within it to form a wider and/or larger RAM. In some embodiments, some or all of the memory structures in the IC in the configurable fabric are CAMs, and some or all of the CAMs can act as RAMs by simply not using the content searching/key mapping support circuitry.

The user defined TCAM 840 includes 12 CAMs, including the CAM 841. Like the user defined CAM 820 and the user defined RAM 830, the user defined TCAM 840 can cascade and concatenate the CAMs it contains to form a wider and/or larger TCAM. In some embodiments, the configurable circuits in the configurable fabric can be configured to provide the necessary supporting circuitry for handling "don't cares". The supporting circuitry for implementing TCAM functionality by using regular CAMs will be further described by reference to FIG. 22 below. In some embodiments, rather than having regular CAMs in the fabric, some or all of the memory structures in the configurable fabric are TCAMs that have built-in mask comparators for handling logical "don't cares".

In some embodiments, each individual CAM (such as the CAM 821) is part of a configurable tile. A configurable tile is a group of circuits that can be instantiated in an array with multiple rows and columns in an IC. A configurable tile with a CAM memory (also called a CAM tile) includes memory cells and comparators for performing content searching/key matching operations. In some embodiments, other circuits for supporting CAM operations are also included in a CAM tile, such as the CAM interface circuit that provides address pointers (i.e., word select and/or bank select) to the CAM memory.

As mentioned above, multiple CAMs can be defined together to form a larger and/or wider CAM. One entry in a CAM or TCAM module can be defined to include memory locations within a same CAM or across multiple CAMs. In some embodiments, multiple CAMs can share a same row select (or word select) signal. In this instance, a word retrieved from a first CAM can concatenate with a word retrieved from a second CAM (or many more CAMs) to form a wider word that can be used to compare against a wider key.

Figure 9:
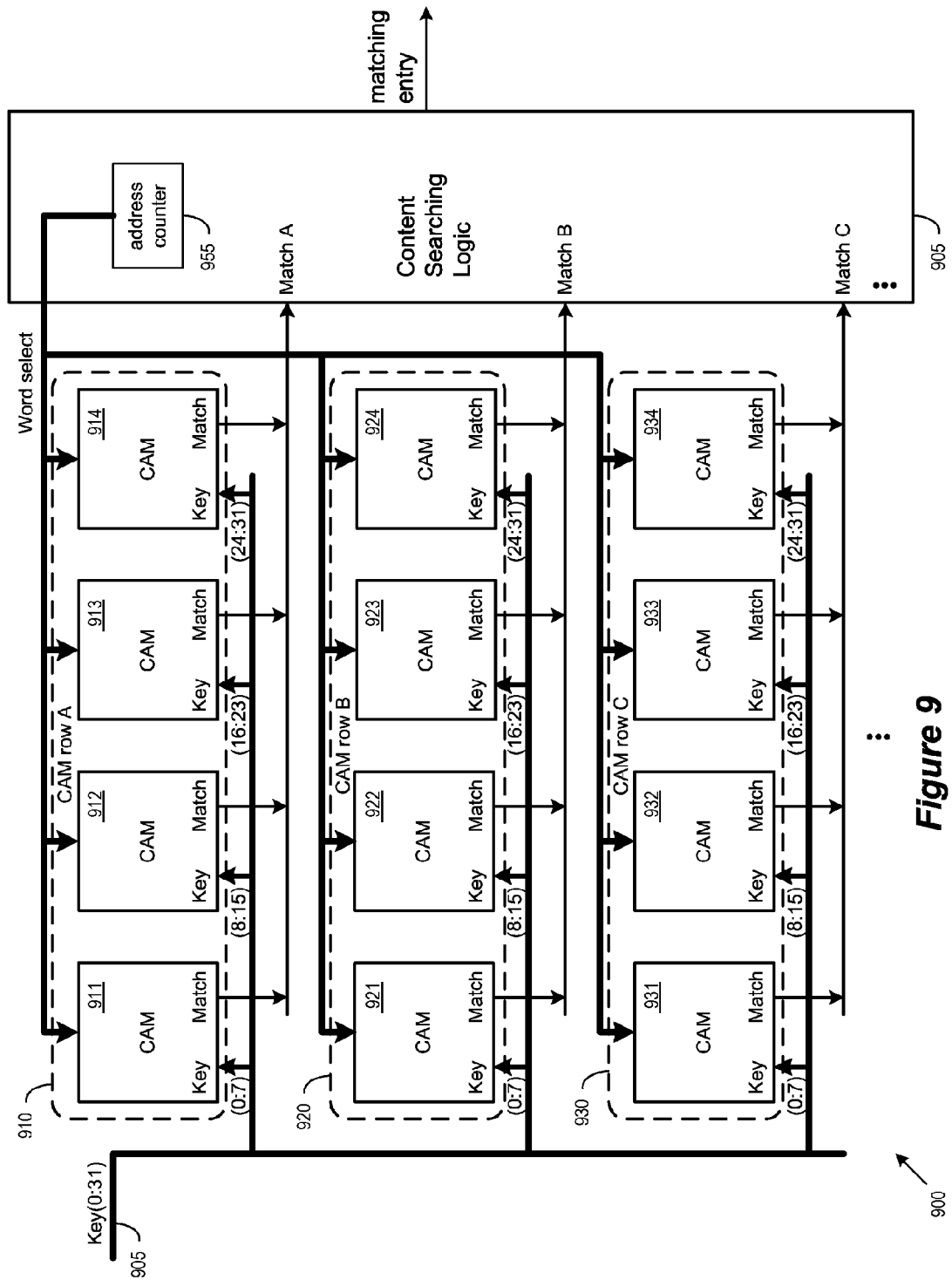
FIG. 9 illustrates the formation of a larger CAM with wider content by concatenating multiple CAMs.

FIG. 9 illustrates the formation of a larger CAM with wider content by concatenating multiple CAMs. As illustrated, user defined CAM 900 receives a 32-bit key 905. The user defined CAM 900 includes 3 rows of CAMs. The first CAM row 910 includes CAMs 911, 912, 913, and 914. The second CAM row 920 includes CAMs 921, 922, 923, and 924. The third CAM row 930 includes CAMs 931, 932, 933, and 934. The user defined CAM 900 also includes a content searching logic 905 that supports the content searching operation of the user defined CAM. In some embodiments, the content searching logic 905 is implemented by the configurable logic and/or routing circuits in the IC. One of ordinary skill in the art would understand that a row of CAMs does not necessarily include CAMs that are physically aligned in a row in the IC. In some embodiments, a CAM row is a group of CAMs that are chosen by a software design tool according to a set of constraints.

Each CAM in the user defined CAM 900 is 8-bit wide, meaning it performs an 8-bit comparison between its content and an 8-bit key. Each CAM row receives the same 32-bit key 905. Within each CAM row, each CAM receives an 8-bit partition of the 32-bit key. For example, within the CAM row 910, CAM 911 receives bits 0 to 7 of the key 905, CAM 912 receives bits 8 to 15 of the key 905, CAM 913 receives bits 16 to 23 of the key 905, and CAM 914 receives bits 24 to 31 of the key 905.

Each CAM row also receives a word select signal that is applicable to each of the CAMs in the row. Each CAM in the row uses the same word select signal for selecting a word for content retrieval and comparison against the portion of the key 905 that is assigned to the CAM. In some embodiments, the same word select signal is supplied to the different CAM row, since the content searching/key matching operations takes place across all CAMs in all CAM rows simultaneously. In a user defined CAM that includes multiple CAM rows, multiple concatenated words are being retrieved simultaneously.

The retrieved 8-bit words from each of the 4 CAMs in one CAM row concatenate into one 32 bit word. This concatenated 32 bit word retrieved across the CAM row is compared against the 32 bit key. In some embodiments, the key comparison logic within each CAM (e.g., 911) compares a portion of the key with a portion of the concatenated word and produces a matching indicator for that portion. Each CAM row (e.g., CAM row A 910) sends one matching indicator to the content searching logic 905 to indicate that a matching word has been found between a concatenated 32 bit word and the 32 bit key. As illustrated, CAM row A 910 produces match indicator A, CAM row B 920 produces match indicator B, and CAM row C 930 produces match indicator C. In some embodiments, a match indicator for a row is produced by ORing the match indicator from each of the CAMs. This ORing function is implemented by the configurable circuits in the configurable fabric in some embodiments.

The content searching logic 905 provides the word select signal to the CAM rows. In some embodiments, the content searching logic 905 produces the word select signal based on an address counter 955 that increments during the content searching operation. It also uses the match indicator from each of the CAM rows to determine whether there is a match and to determine the match location. Though not illustrated, one of ordinary skill would recognized that the one address counter 955 providing word select signal to all CAMs of the user defined CAM 900 can be replaced by several address counters that are synchronized with each other to provide identical word select or address pointers to the CAMs.

Figure 10:
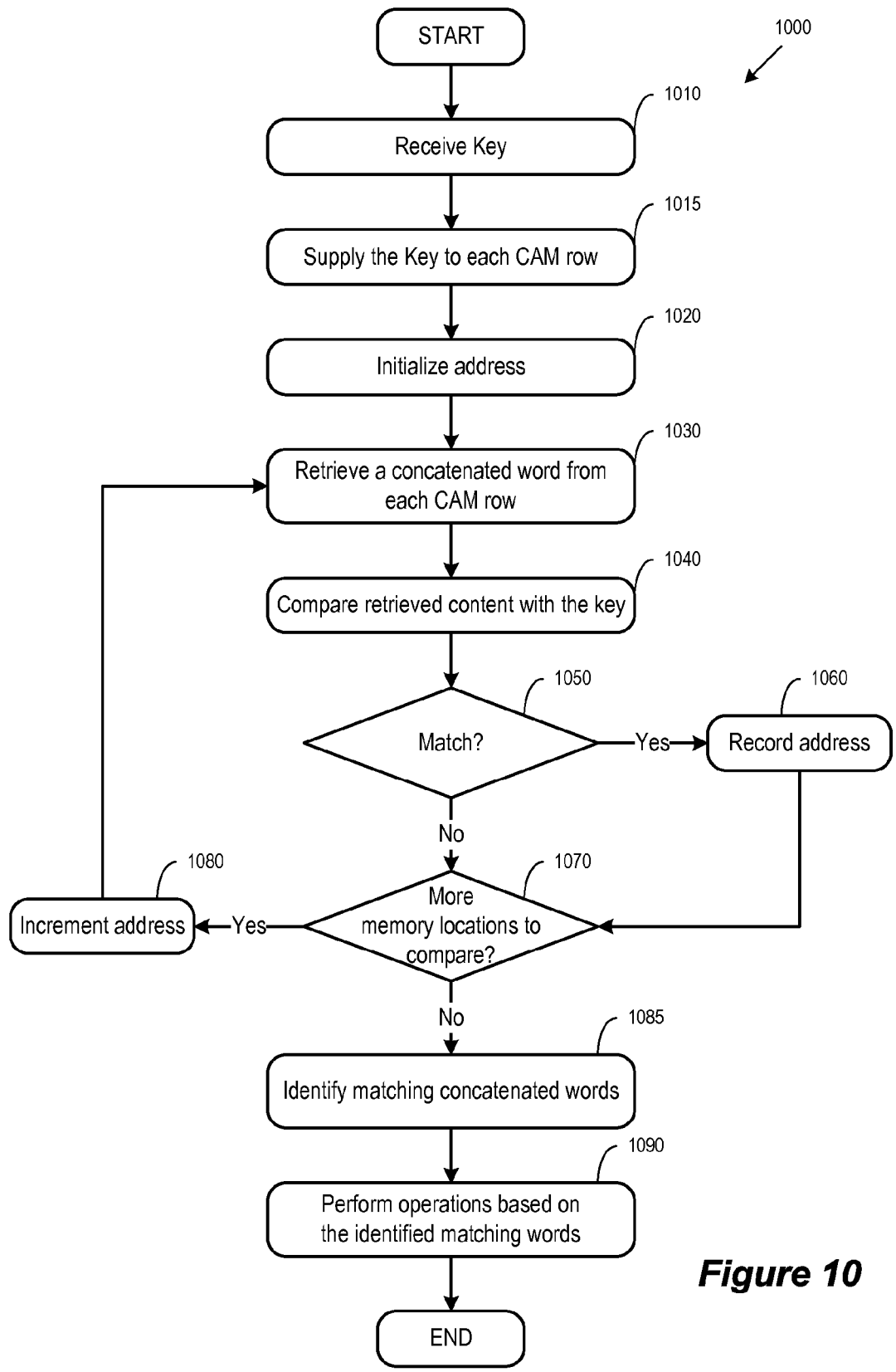
FIG. 10 conceptually illustrates a process for performing a content searching/key matching operation in a user defined CAM that includes several CAM structures.

For some embodiments, FIG. 10 conceptually illustrates a process 1000 for performing the content searching/key matching operation in a user defined CAM that includes several CAM structures. The process 1000 is at least partially executed by the content searching logic 905 of FIG. 9 in some embodiments.

The process 1000 starts when the IC performs an operation that generates a key for finding a matching entry in the user defined CAM. The process receives (at 1010) the generated key and supplies (at 1015) the key to each CAM row. The process then initializes (at 1020) an address counter. At 1030, the process uses the address being maintained at the address counter to select and retrieve a concatenated word from each of the CAM rows. In a user defined CAM that includes multiple CAM rows, multiple concatenated words are retrieved simultaneously. The process then compares (at 1040) the retrieved word (or words if there are multiple CAM rows) with the key and determines (at 1050) whether there is a match.

If there is a match, the process records (at 1060) the address location of the concatenated word that matches the key. Some embodiments store matching results in a record table such as the record table 630 of FIG. 6, from which the address location of the match can be identified. Some embodiments record the address location by storing the value at the address counter. For some embodiments that retrieve multiple concatenated words from multiple CAM rows, recording the address also includes recording the identity of the CAM from which the match indication occurred. After recording the address, the process 1000 proceeds to 1070.

If there is no match, the process 1000 proceeds to 1070 without recording an address. At 1070, the process 1000 determines whether there are more memory locations to be searched for a match. If there are more memory locations to be searched, the process increments (at 1080) the address counter and proceeds to 1030 to retrieve another word for comparison. Otherwise, the process 1000 proceeds to 1085.

At 1085, the process uses the recorded addresses to identify concatenated words that match the search key. In some embodiments, this identification is performed by using a record table that records matching results. The use of a record table for identifying memory locations with matching content is described above by reference to FIG. 6. The use of a record table for identifying matching concatenated words will be further described below by reference to FIG. 12.

The process next performs (at 1090) one or more memory access operations based on the identified matching concatenated words. Some of these memory access operations are described above by reference to FIG. 5. After performing the memory access operations, the process 1000 ends.

In some embodiments, each CAM has multiple sets of memory cells and multiple sets of content matching supporting circuitry (such as the CAM 100 or the CAM 400). In these embodiments, not only the multiple CAM rows are performing content search in parallel, within each CAM the different sets of memory cells and content matching circuitry are also performing content search in parallel. In the example of FIG. 4 in which the CAM 400 has 128 sets that simultaneously perform the key matching operation. Each set has 32 rows or words that has to be access sequentially, one row or word per clock cycle. The user defined CAM can search through all 128 sets in 32 cycles. If the CAMs in the user defined CAM 900 are similar to CAM 400 that has 128 sets, then the user defined CAM can search through 128 sets×(number of CAM rows) in 32 cycles.

In some embodiments, a concatenated word in a user defined RAM can be defined differently for accomplishing different performance/cost/functionality trade-offs. For example, some user designs may require very fast search time. Other user designs may require very wide keys. Still other user designs may require very large data capacity in the CAMs.

Figure 11A:
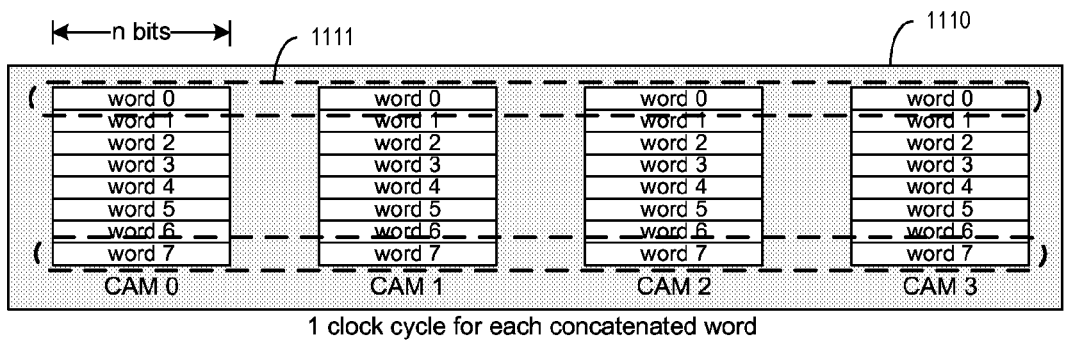
FIGS. 11a-c illustrate examples of cascading or concatenating words in a user defined CAM.
Figure 11B:
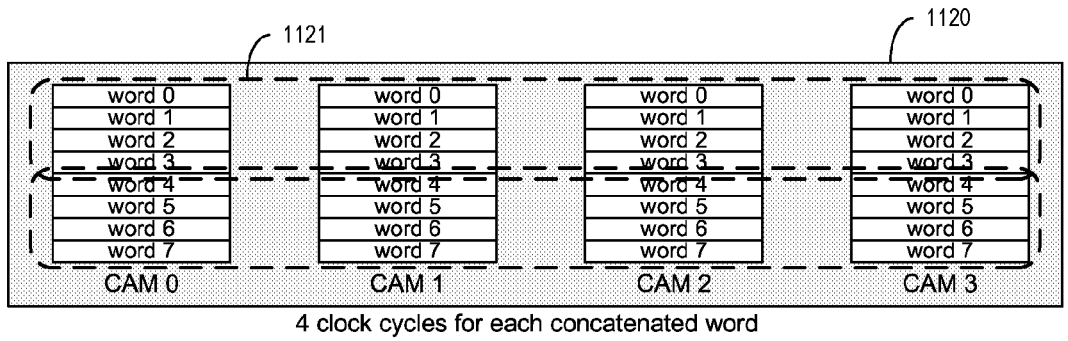
Figure 11C:
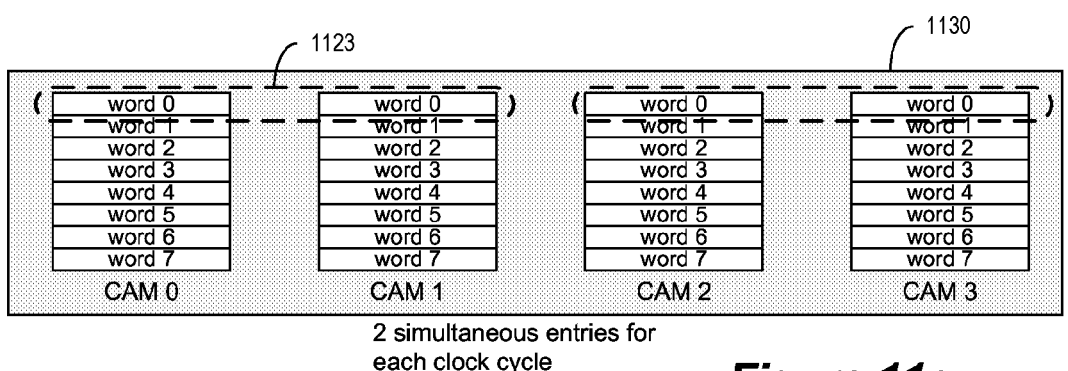

For some embodiments, FIGS. 11*a-c* illustrate several examples of cascading or concatenating words in a user defined CAM. As illustrated, there are 4 CAMs 1101, 1102, 1103, 1104 that are available to be part of larger user defined CAM. Each CAM is n-bit wide and performs an n-bit comparison between its content and an n-bit key. The words in each CAM are in a packed memory array and can only be accessed one at a time.

FIG. 11*a* illustrates a user defined CAM 1110, in which each concatenated word is defined to include words at the same address location across all 4 CAMs. A concatenated word in the user defined CAM 1110 (e.g., concatenated word 1111) therefore has 4×n bits. In this configuration, the user defined CAM 1100 can search through one concatenated word in one clock cycle, each concatenated word having 4×n bits.

FIG. 11*b* illustrates a user defined CAM 1120, in which each concatenated word is defined to be 16×n bits. Instead of using 16 CAMs so the user defined CAM can search through one word in one clock cycle, this configuration uses only 4 CAMs. Each concatenated word (e.g., 1121) includes words from 16 different memory locations in the 4 CAMs. In this configuration, the user defined CAM 1120 can only search through one word in 4 cycles, each word having 16×n bit. This configuration consumes fewer CAMs at the cost of longer search time.

FIG. 11*c* illustrates a user defined CAM 1130, in which each concatenated word (e.g., 1123 and 1130) is defined to be 2×n bits. Instead of using only 2 CAMs so the user defined CAM can search through one word in one clock cycle, this configuration uses all 4 CAMs so the user defined CAM 1130 can search through twice as many words in one clock cycle (e.g., searching through both the word 1123 and the word 1130 in a same clock cycle). This configuration consumes additional CAMs for increased search speed.

As illustrated in FIGS. 11*a*-11*c*, a concatenated word can span multiple CAM modules. A concatenated word can also span multiple address locations within the same CAM. In order to determine whether a concatenated word that spans multiple CAMs or multiple address locations matches a particular key, some embodiments combine match indications from different CAMs into a single matching indicator (such as the CAM row matching indicator illustrated in FIG. 9). Some embodiments, on the other hand, use a record table to keep track of matches between individual memory locations and portions of the key and then use the bit pattern in the record table to determine if there is a match between a concatenated word and the key.

FIG. 12 conceptually illustrates an IC 1200 that is performing a content searching/matching operation by using a record table. The content searching/matching operation involves a search key 1205, three CAMs 1210, 1220, and 1230 (CAM A, CAM B, and CAM C, respectively), and a record table 1240. The search key 1205 is wider than each of the three CAM modules. It is divided into three partial keys 1215, 1225, and 1235. Each partial key is used for searching a CAM for matching content (partial key 1215 for searching CAM A 1210, partial key 1225 for searching CAM B 1220, partial key 1235 for searching CAM C 1230). The results of comparisons between the partial keys and the content of the three CAMs are recorded in the record table 1240. This recording operation corresponds to operation 1060 of the process 1000 of FIG. 10 in some embodiments.

In this example, a concatenated word is defined to span CAM A 1210, CAM B 1220, and CAM C 1230. For example, locations A6 of CAM A, B6 of CAM B, and C6 of CAM C are combined to define concatenated word 1250. The search operation is performed by comparing the key 1005 with each of the concatenated words stored across CAM A, CAM B and CAM C.

Similar to the record table 630 of FIG. 6, each bit in the record table 1240 stores the result of comparing the key to a memory location. In the example of FIG. 12, 1's in the record table indicate that content at memory locations A3, A4, and A5 match the partial key 1215, content at memory locations B0, B3, and B5 match the partial key 1225, and content at memory locations C1, C3, and C5 match the partial key 1035. By retrieving and analyzing the bit pattern in the record table 1240, it can be determined that a concatenated word spanning A3, B3, and C3 matches the key 1205 (since the record table entries for A3, B3 and C3 are all 1's). It can also be determined that another concatenated word spanning A5, B5, and C5 matches the key 1205 (since the record table entries for A5, B5 and C5 are all 1's). No other concatenated word matches the key 1205 since all other rows in the record table 1240 contain at least one '0' to indicate a mismatch with one of the partial keys.

One of ordinary skill in the art would recognize that the record table 1240 is organized into rows and columns for purpose of illustration. Record table can be implemented in storage circuits that are organized differently from that which is illustrated in FIG. 12.

Search speed is also dependent on the number of words in a set that must be sequentially searched through. More words that have to be searched through sequentially, the longer it takes to finish a content search/key matching operation. Reducing the number of memory locations that must be sequentially searched through would therefore accelerate the content search/key matching operation. To reduce the number of memory locations that a given key matching operation must sequentially search through, some embodiments use hashing functions to divide the memory locations in a CAM into hashed buckets. The key matching operation in these embodiments only search memory locations in the bucket selected by the hash function.

Figure 13:
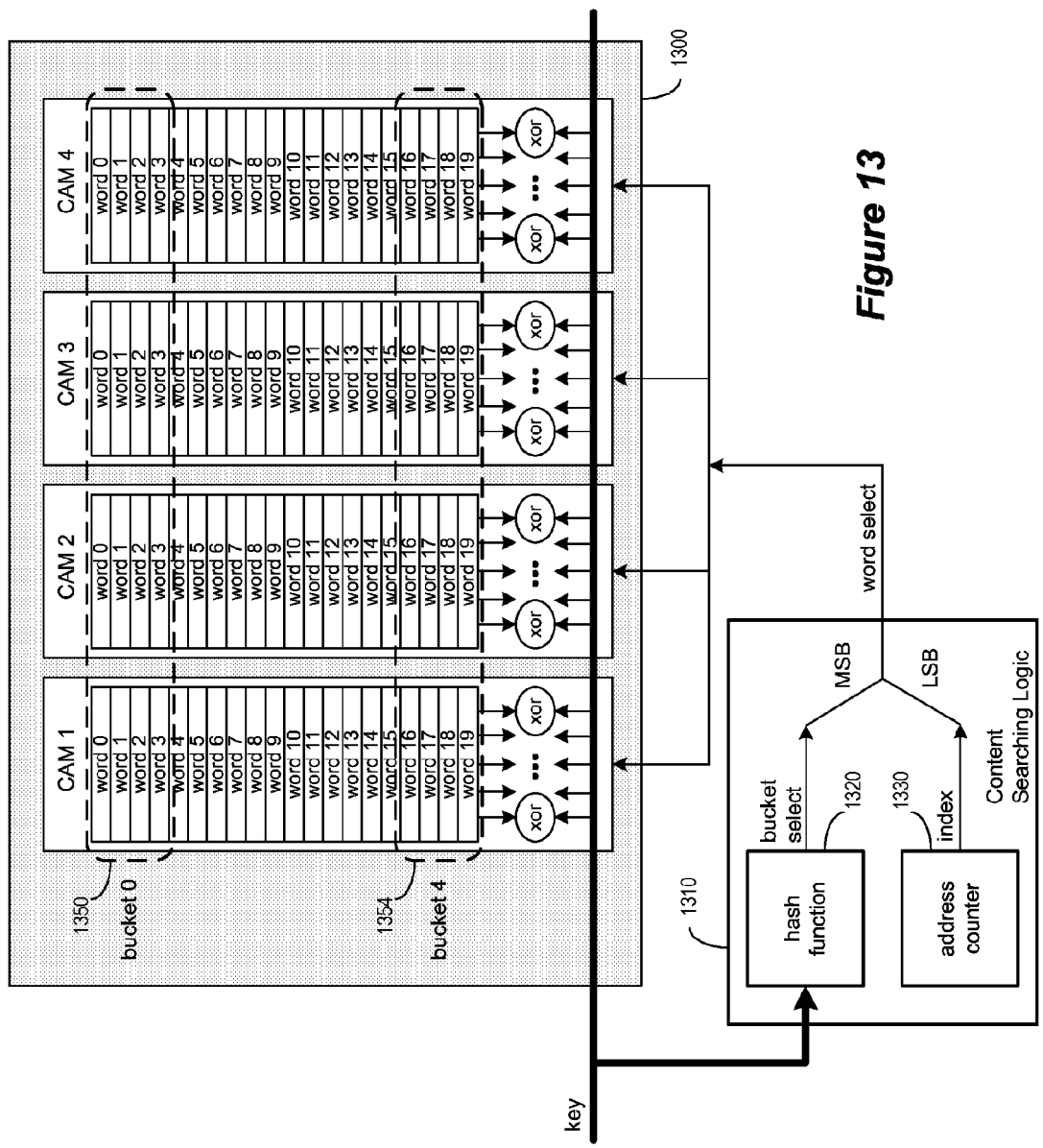
FIG. 13 illustrates the use of a hash function to accelerate content search/key matching operations.

For some embodiments, FIG. 13 illustrates the use of a hash function to accelerate content search/key matching operations. The IC of FIG. 13 includes a user defined CAM 1300 and a content searching logic 1310. For some embodiments that include a configurable fabric, the content searching logic 1310 can be implemented by the configurable circuits in the configurable fabric.

As illustrated, an IC has a user defined CAM 1300 that includes CAMs 1301, 1302, 1303, and 1304. The user defined CAM 1300 receives a key that goes to all four CAMs for content comparison and search. Each of the CAMs includes 20 words that can only be retrieved one at a time, and each of the CAMs includes one set of key comparators that can compare only one retrieved word with the key at a time. In other words, to complete a memory search operation without hash, the IC must sequentially search through 20 words.

The content search logic 1310 includes a hash function module 1320 and an address counter 1330. The content search logic 1310 provides the word select signal to the user defined CAM 1300. The MSB of the word select signal is provided by the hash function module 1320, while the LSB is provided by the address counter 1330.

The hash function module 1320 receives the key and converts the received key into a bucket selection signal. The hash function divides all possible content values into a number of different buckets (e.g., buckets 1350 and 1354) by producing a bucket selection signal. When writing to the CAM, the bucket selection places each piece of content entering the CAM into a bucket determined by the hash. When reading from a CAM, the bucket selection indicates in which of the buckets could the content matching key be found.

A content search/key matching operation with hash function is therefore performed with the hash function selecting a bucket based on the key and the address counter going through each memory location within the bucket. Using the hash function therefore accelerates the content search operations by limiting the search to only a subset of all the memory locations.

III. Content Addressable Memory and Reconfigurable Circuits

The content search operation can be further accelerated by running the user defined CAM at a faster running clock. This can be the case when the configurable circuits in the configurable fabric are reconfigurable circuits.

In some embodiments, the configurable circuits in the configurable fabric are reconfigurable circuits. A user design that is defined based on a user design clock is implemented in the IC using the reconfigurable circuits, which reconfigure several times within one user design clock cycle. In some of these embodiments, the reconfigurable circuits reconfigures according to a reconfiguration clock. The reconfiguration clock is a faster running clock than the user design clock. In some embodiments, the reconfiguration clock is sub-cycle clock of the user design clock. In some embodiments that includes reconfigurable circuits that runs on reconfiguration clock, a CAM searches through the stored entries by comparing one set of memory cells with the key per reconfiguration clock. In these embodiments, a CAM examines multiple entries for comparison against the key in each of the user design clock cycle.

Figure 14:
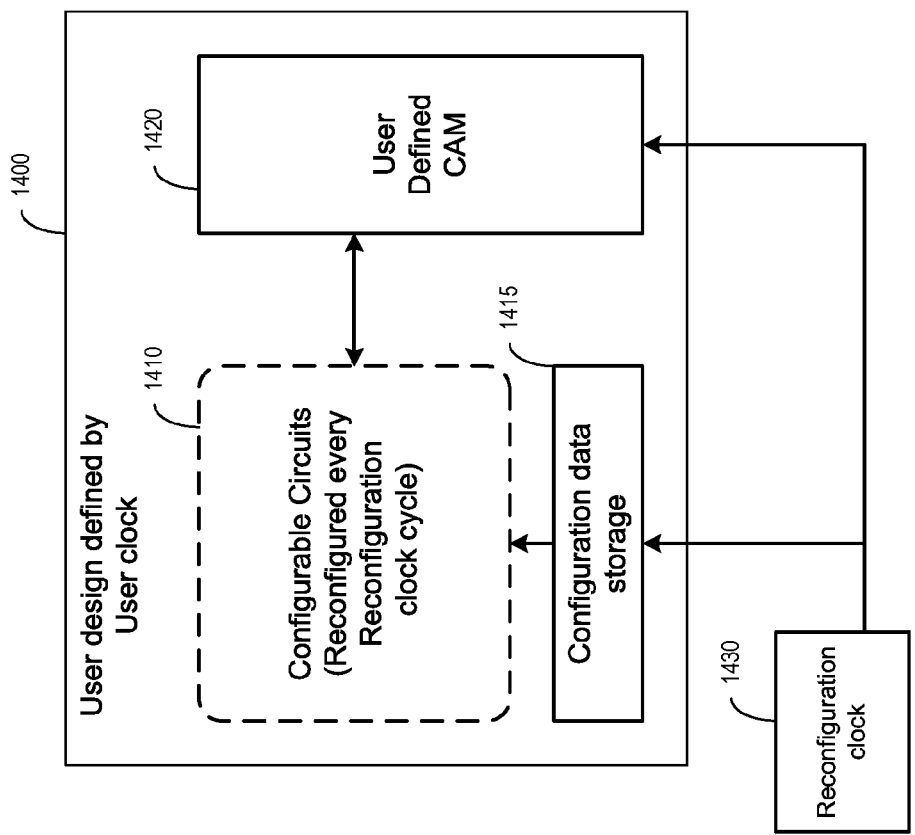
FIG. 14 illustrates an IC in which reconfigurable circuits that run on a reconfiguration clock are used to implement a user defined CAM.

FIG. 14 illustrates an IC in which reconfigurable circuits running on a reconfiguration clock are used to implement a user defined CAM. As illustrated, a user design 1400 is implemented using configurable circuits 1410 and includes a user defined CAM 1420. The configurable circuits perform different operations based on configuration data stored in configuration data storage 1415. The IC also includes a clock source 1430 that provides a reconfiguration clock that is used by the configurable circuit to reconfigure once every reconfiguration clock cycle. The user defined CAM 1420 is controlled by the reconfigurable circuits and driven by the reconfiguration cycle and therefore able to retrieve and compare one word of data per reconfiguration cycle.

Although it is defined by a user design clock (or user clock), the user design 1400 is implemented by reconfigurable circuits that run on a reconfiguration clock. Since the reconfiguration clock is faster than the user design clock, the user defined CAM is able to retrieve more than one word in each user design clock. In other words, a user defined CAM can perform multiple memory accesses in one user design cycle, since memory access is performed by various reconfigurable logic that operate on the reconfiguration clock. In some embodiments, the reconfiguration clock is a sub-clock of the user design clock (i.e., each user design cycle encompasses multiple reconfiguration clock cycles), so that the user defined CAM can retrieve and compare multiple words per user design clock.

Figure 15A:
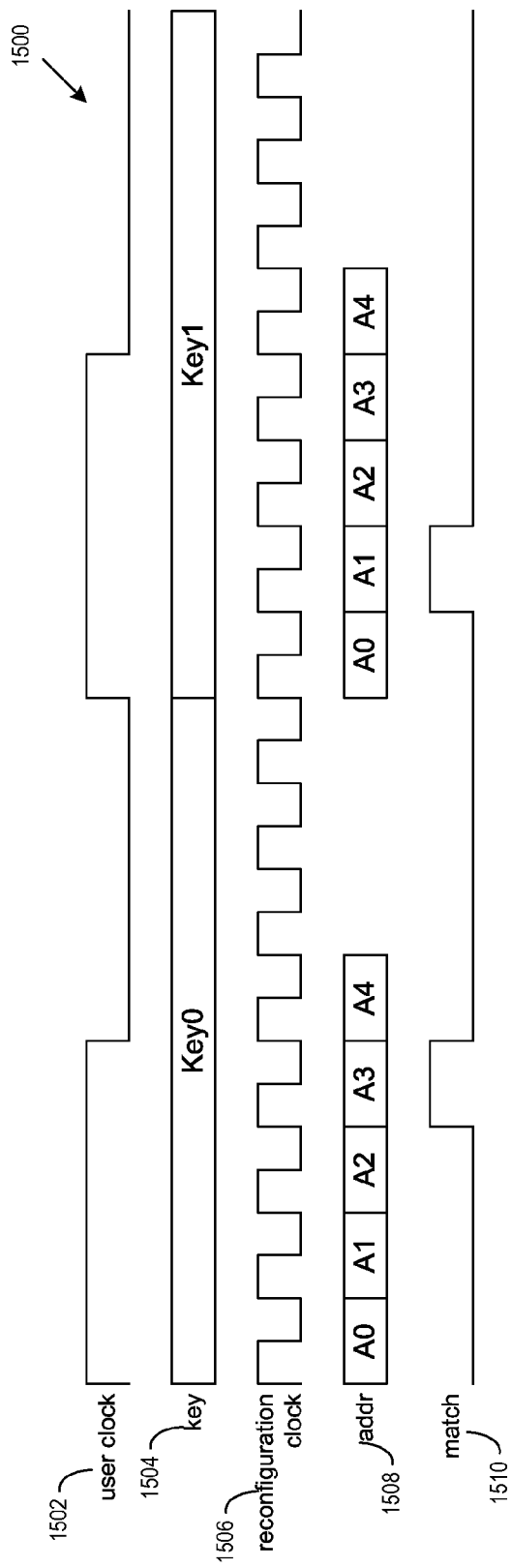
FIG. 15a-b illustrates a CAM operation in an IC with reconfigurable circuits.
Figure 15B:
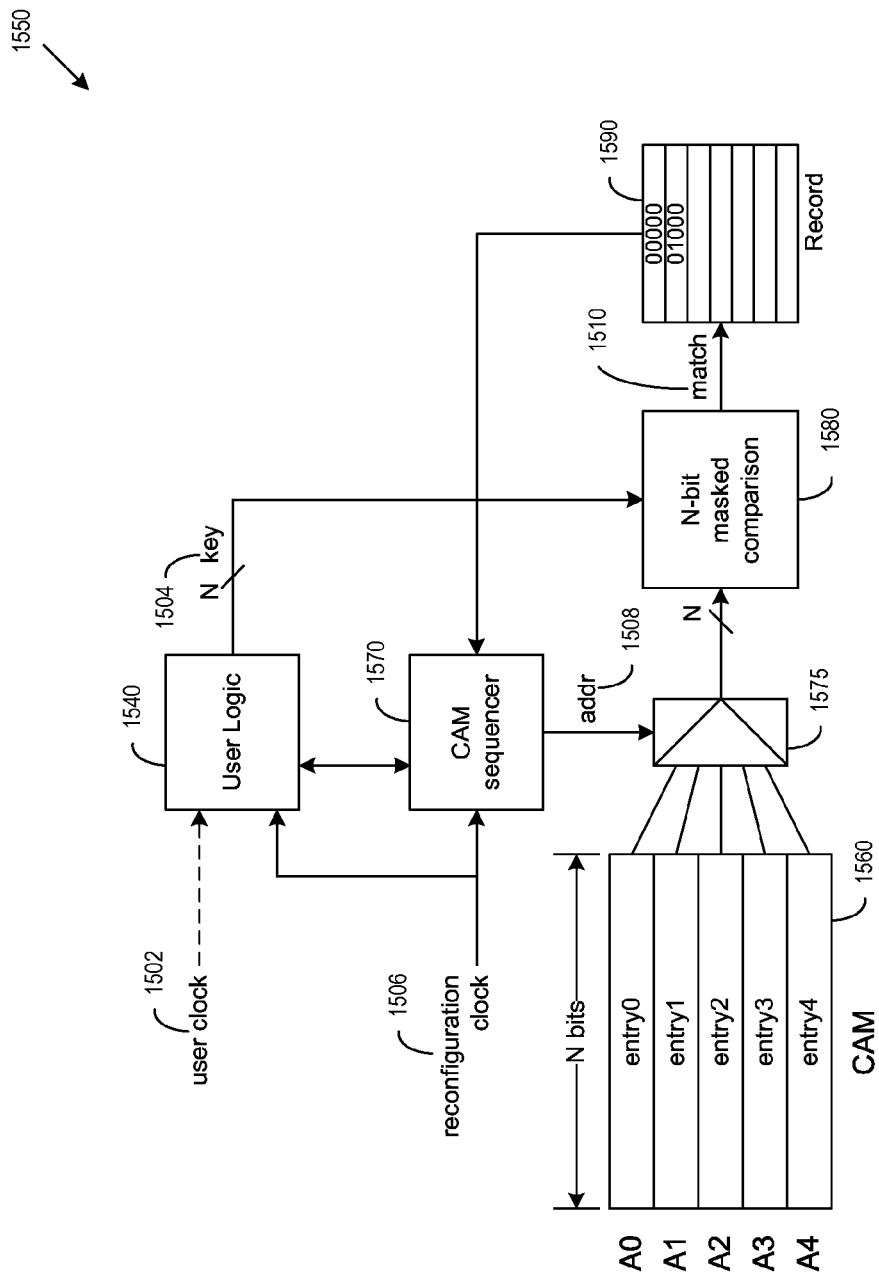

For some embodiments, FIGS. 15*a-b* illustrate a CAM operation in an IC with reconfigurable circuits. FIG. 15*a* illustrates a timing diagram 1500 of the CAM operation. FIG. 15*b* illustrates a set of circuits 1550 that performs the CAM operation in an IC. The set of circuits 1550 produces the waveforms in the timing diagram 1500 when in operation. The timing diagram 1500 includes waveforms for user clock 1502, search key 1504, reconfiguration clock 1506, memory address 1508, and match indication 1510. The set of circuits 1550 includes a CAM 1560, a CAM sequencer 1570, a multiplexer 1575, a masked comparator 1580, a record table 1590, and a user logic 1540.

The CAM sequencer 1570 is a logic circuit that operates on the reconfiguration clock 1506. The masked comparator 1580 performs comparison with the search key 1504. The user clock 1502 is a slower clock than the reconfiguration clock 1506. In the example of FIG. 15, each user clock cycle includes 8 reconfiguration clock cycles. The key is defined and supplied by a user design that is implemented in the user logic 1540. Since the user design is defined by the user clock of the user design, the user logic 1540 can present at most one search key to the CAM 1560 in one user clock cycle (even if the user logic 1540 is actually implemented by reconfigurable circuits that operates on the faster running reconfiguration clock 1506).

The CAM sequencer 1570, on the other hand, operates by using the reconfiguration clock 1506. The CAM sequencer 1570 can search through several different memory locations by presenting several different addresses to the CAM 1560 in each user clock cycle, because the reconfiguration clock 1506 is several times faster than the user clock 1502. In the example illustrated, the sequencer 1570 goes through at least five different addresses (i.e., A0-A4) on the memory address 1508 to retrieve five different entries from the CAM 1560 within one user clock cycle. Each of the five entries is selected by the multiplexer 1575 and presented to the masked comparator 1580 for comparison with the key 1504. The masked comparator generates the matching indicator 1510. The record table 1590 records the matching indicator for each memory location and report the result back to the CAM sequencer 1570. In the example of FIG. 15*a*, a match with Key0 is found when the address 1508 is A3, and a match with Key1 is found when the address 1508 is A1.

Figure 16A:
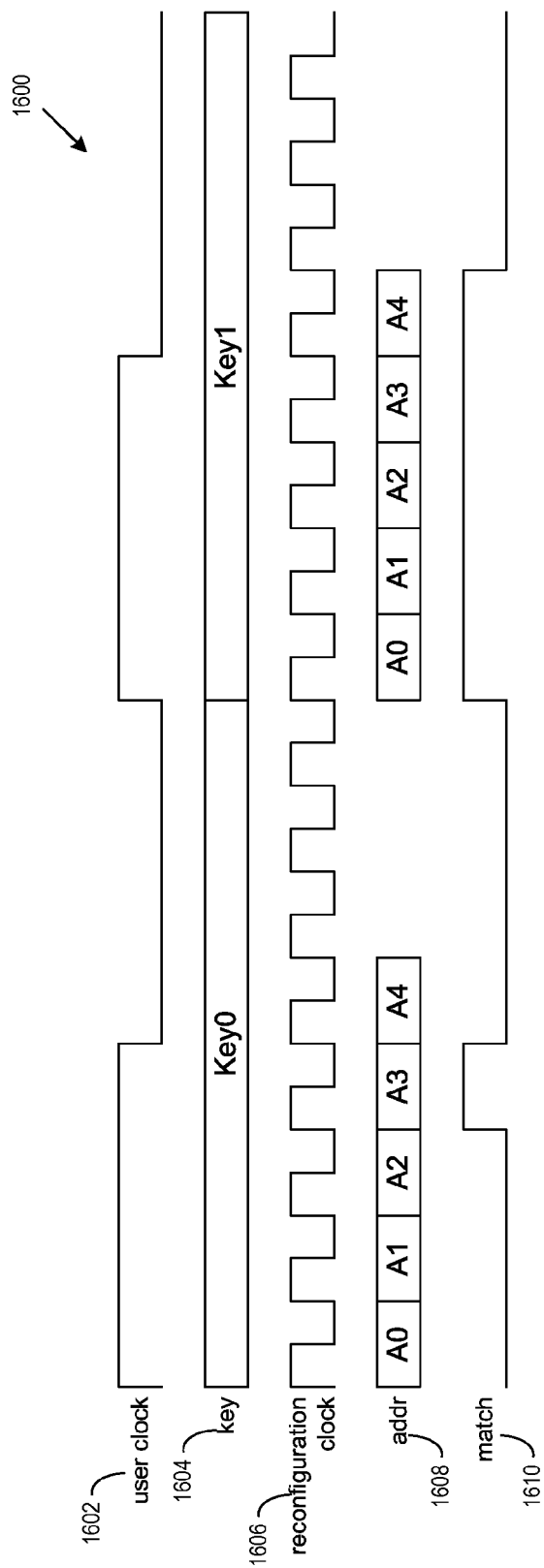
FIG. 16a-b illustrates retrieving multiple words within the same user clock cycle to form a concatenated word.
Figure 16B:
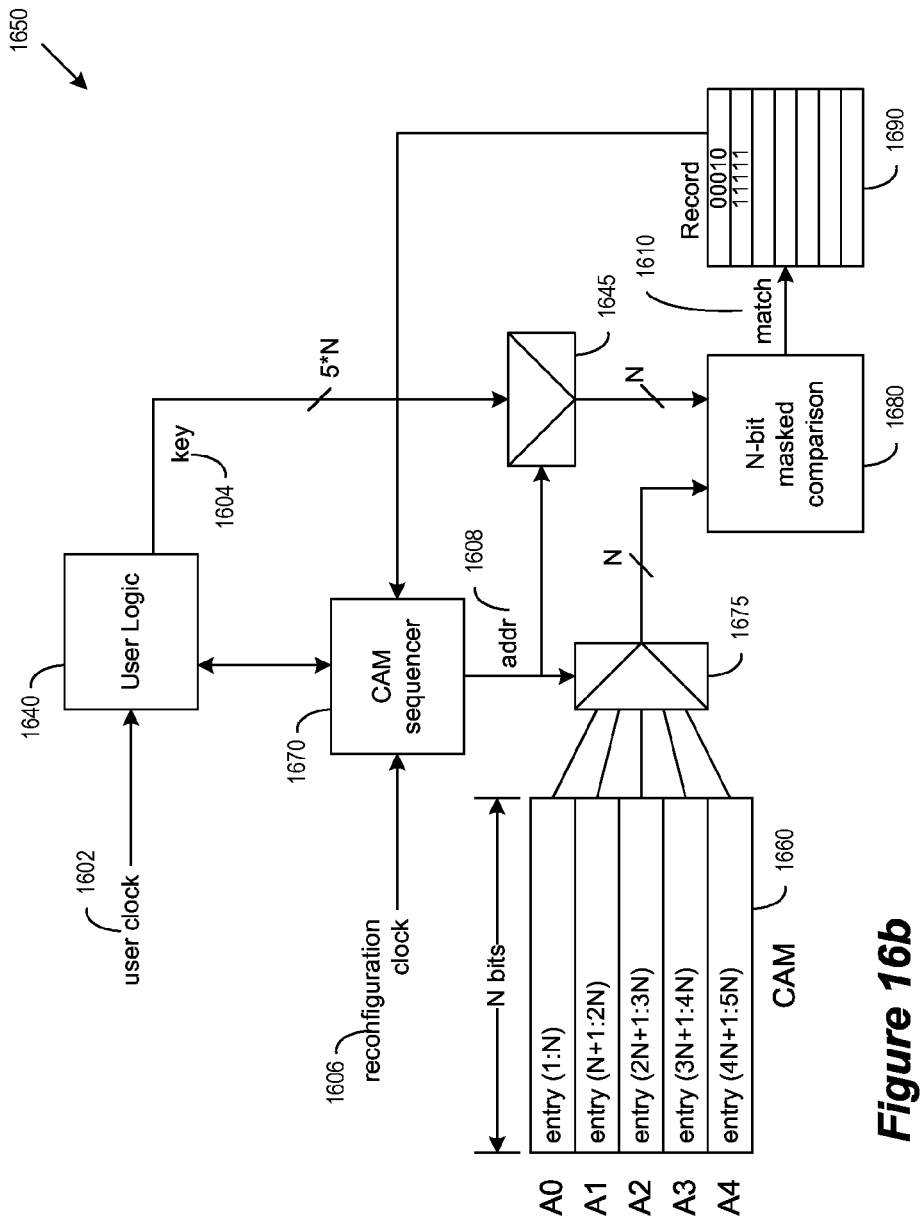

Since the reconfiguration clock can be used to drive CAM sequencer 1570 to retrieve multiple words from the same CAM in the same user clock cycle, some embodiments use consecutive words in a CAM to form a concatenated word that, within one user clock cycle, can be retrieved and compared with a wider key. FIGS. 16*a-b* illustrate retrieving multiple words from a CAM within the same user clock cycle to form a concatenated word.

FIG. 16a illustrates a timing diagram 1600 for a CAM operation that retrieves a concatenated word. FIG. 16b illustrates a set of circuit 1650 that performs the concatenated word CAM operation in an IC. The set of circuits in the 1650 produces the waveforms in the timing diagram 1600 when in operation. The timing diagram 1600 includes waveforms for user clock 1602, search key 1604, reconfiguration clock 1606, memory address 1608, and match indication 1610. The set of circuits 1650 includes a CAM 1660, a CAM sequencer 1670, a multiplexer 1675, a masked comparator 1680, a record table 1690, and a user logic 1640.

The CAM sequencer 1670 is a logic circuit that operates on the reconfiguration clock 1606. The masked comparator 1680 performs comparison with the search key 1604. The user clock 1602 is a slower clock than the reconfiguration clock 1606. In the example illustrated in FIG. 16, the search key is wider (width of 5*N bits) than the CAM 1660 (width of N bits). Each word in the CAM 1660 stores a portion of a concatenated word that is to be compared with the search key 1604. The key 1604 is defined and supplied by a user design that is implemented in the user logic 1640. Since the user design is defined by the user clock of the user design, the user logic 1640 can present at most one search key to the CAM 1660 in one user clock cycle (even if it is implemented in reconfigurable circuits that operates on the faster running reconfiguration clock 1606).

Like the CAM sequencer 1570, the CAM sequencer 1670 operates on reconfiguration clock 1606 and can search through several different memory locations by presenting several different addresses (e.g., A0-A4) to the CAM 1660 in each user clock cycle. Different portions of the concatenated word are retrieved through the multiplexer 1675 and presented to the masked comparator 1680 for comparison. Different portions of the key 1604 are likewise selected by the multiplexer 1675 and presented to the masked comparator 1680. The masked comparator 1680 generates the matching indicator 1610. In the example of FIG. 16a, a match with Key0 is found when the address 1608 is A3, and matches with Key1 are found for all of A0-A4.

The record table 1690 records the matching indicator for each memory location. The first entry in the record table 1690 records the comparison result for the first search key (Key 0) that was presented in the first user clock cycle and the second entry records the comparison result for the second search key (Key 1) that was presented in the second user clock cycle. The first entry of the record table 1690 is "00010", indicating there is no match with Key 0 (only one portion of the key has a match), while the second entry of the record table 1690 is all '1's, indicating that there is a match between the content of the CAM 1660 with Key 1. The content of the record table 1590 is available for access by the CAM sequencer 1670 so the CAM sequencer can assist the user logic 1640 in determining the locations of matching entries.

Figure 17:
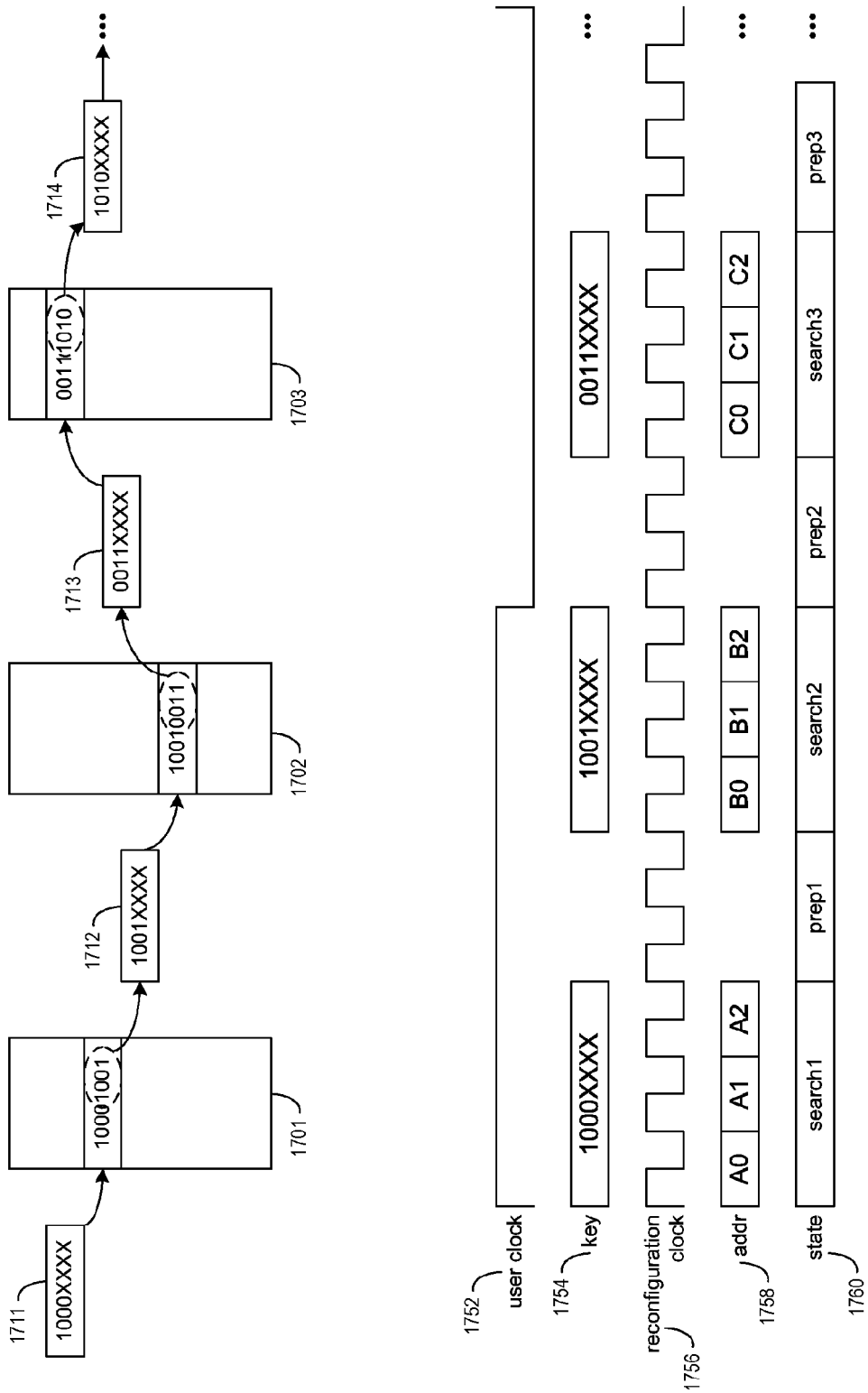
FIG. 17 illustrates an example linked list retrieval operation using CAMs.

The fact that the CAM 1660 can be accessed at a faster rate than the user clock 1602 by using the reconfiguration clock 1606 means that the reconfiguration clock can be used to accelerate various memory access operations. For example, in some embodiments, CAMs implement a linked list that is able to be entirely traversed in one or very few user clock cycles. FIG. 17 illustrates an example linked list retrieval operation using CAMs. The figure includes an example linked list 1700 and a timing diagram 1750.

As illustrated, the linked list 1700 includes memory locations in several CAMs 1701-1703. An initial search key 1711 ("1000XXXX") is produced by an IC to search for a matching entry. Instead of searching through all memory locations in all CAMs, the searching operation stops at the first memory location that contains a matching entry (in this case "10001001" in CAM 1701). The matching entry 1721 is then used to produce a second search key 1712 "1001XXXX". The second key is then used to search for the second matching entry (in this case "10010011" at 1722 in the CAM 1702). The second matching entry is then used to produce a third search key 1713 "0011XXXX" that is used to search for a third matching entry (in this case "00111010" at 1723 in the CAM 1703). This traversal operation can continue until the end of the linked list 1700 is reached.

The timing diagram 1750 illustrates the operation of the IC when it is traversing the linked list 1700. The timing diagram 1750 includes waveforms for a user clock 1752, a current search key 1754, a reconfiguration clock 1756, memory address 1758, and a state 1760 of the linked list traversal operation.

The first matching entry is located after a few reconfiguration clock cycles in the "search1" state using the first search key "1000XXXX". The IC next spends a few reconfiguration clock cycles in the "prep1" state in which the IC determines the second search key ("1001XXXX") and perform other memory access operations (such as using the address of the matching location to fetch additional content as discussed above in FIG. 5).

After the "prep1" state, the IC enters the "search2" state and uses the second search key to search for the second matching entry. After a few reconfiguration clock cycles, the IC locates the second matching entry (and hence the next memory location in the linked list). The IC then continues the traversal of the linked list by using the second matching entry to determine the third search key and find the third matching entry, etc.

Because the reconfiguration clock is faster than the user clock (at least 16 times faster in the example of FIG. 17), the IC is able to traverse each link in the linked list at a fraction of a user clock cycle. Given a sufficiently fast reconfiguration clock cycle, an IC with a CAM sequencing circuit that reconfigures based on the reconfiguration clock can traverse an entire linked list in one or very few user clock cycles.

Several examples described above include circuits that can be implemented as reconfigurable circuits operating in the reconfiguration clock. For example, the CAM interface 105 of FIG. 1 (including sequencer 170), the comparison reduction circuitry 710 and 720, the storage circuit 650 of FIG. 6 for storing record tables, and the accumulators 750 and 760 of FIG. 7 can all be implemented by reconfigurable circuits operating in reconfiguration clock. These circuits all operate in faster running reconfiguration clock when the user design that uses the CAM functionality is defined by or operates in slower running user clock.

Figure 18:
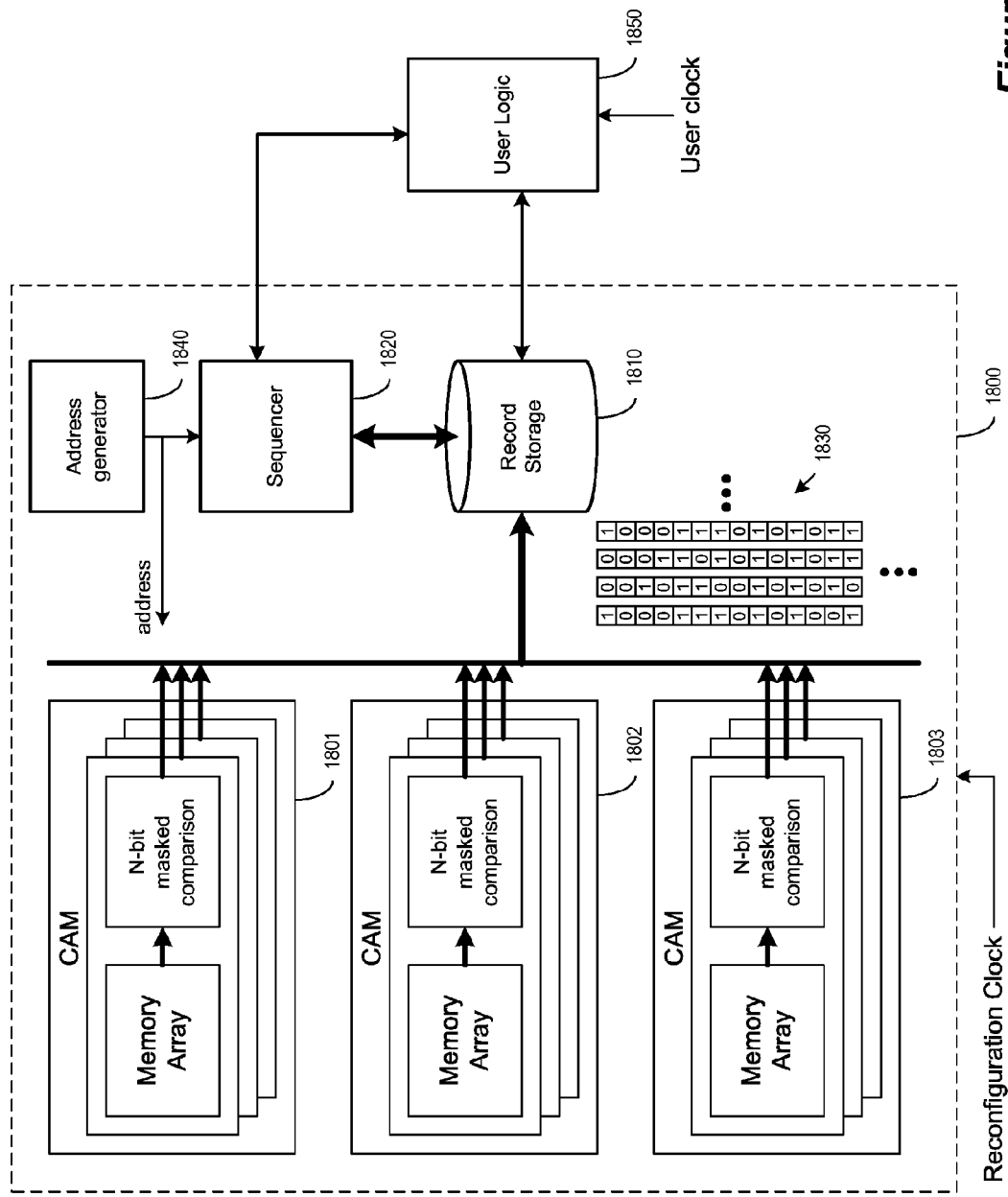
FIG. 18 illustrates a user defined CAM that operates using reconfiguration clock while the user design is operating using user clock.

FIG. 18 illustrates a user defined CAM 1800 that operates using reconfiguration clock while the user design is operating using user clock. The user defined CAM 1800 includes several CAM modules 1801-1803 that perform content matching/searching operation and produces a stream of matching result 1830 that is stored in a record storage circuit 1810. The address to the CAMs is generated by an address generator 1840 during the content matching/searching operation. The content of the storage circuit 1810 is then analyzed by either a sequencer 1820 or a user logic 1850 of the user design. The user logic 1850 is defined by or operating in user clock. The use defined CAM 1800, the record storage circuit 1810, and the sequencer 1820 all operate in reconfiguration clock.

Each of the CAM modules 1801-1803 includes banks of memory array and comparison circuits for performing content matching/searching operations. The streams of comparison result from the different CAM modules are then stored in the record storage 1810. In every reconfiguration clock cycle, each of the CAM modules completes one comparison between the key and one entry of the CAM and produces one comparison result. The comparison results from the different CAMs forms the stream of comparison result 1830 and arrives at the record storage 1810. The record storage 1810 continuously stores the stream of comparison result on each reconfiguration clock cycle.

The address generator 1840 increments and provides address to the CAM modules 1801-1803 during the content searching/matching operation. The address generator increments the address (or compute a new address) to the CAM modules every reconfiguration clock cycle, enabling content from a new address location to be read out from all banks of all CAM modules in the user defined CAM 1800.

In some embodiments, the result of the comparison stored in the record storage 1810 is analyzed by the sequencer 1820, which also operates in reconfiguration clock. The sequencer in some embodiments serve as an interface between the user defined CAM 1800 and the user logic 1850, whose operation is defined by the user clock. The sequencer 1820 operating in faster reconfiguration clock is able to quickly process or analyze comparison results stored in the record storage 1810. The user logic 1850 can read the processed matching result from the sequencer 1820 at a rate determined by user clock. In some embodiments, the sequencer performs its analysis based on the address generated by the address generator 1840.

In some embodiments, the sequencer 1820 is implemented by configurable circuits that are programmed by the user according to the requirement of the user design. For example, the sequencer 1820 can be programmed to process the matching result stored in the record storage 1810 to look for address locations with entries that matches the key. The sequencer 1820 can also be programmed to look for matches based on concatenated word across multiple CAMs and/or across multiple CAM entries as in the example described by reference to FIG. 11*a-c*. The sequencer 1820 can also be programmed to implement a fast link list traversing algorithm, as described above by reference to FIG. 17. The configurable circuits in some embodiments are reconfigurable circuits that reconfigures once every reconfiguration clock cycle.

Figure 19:
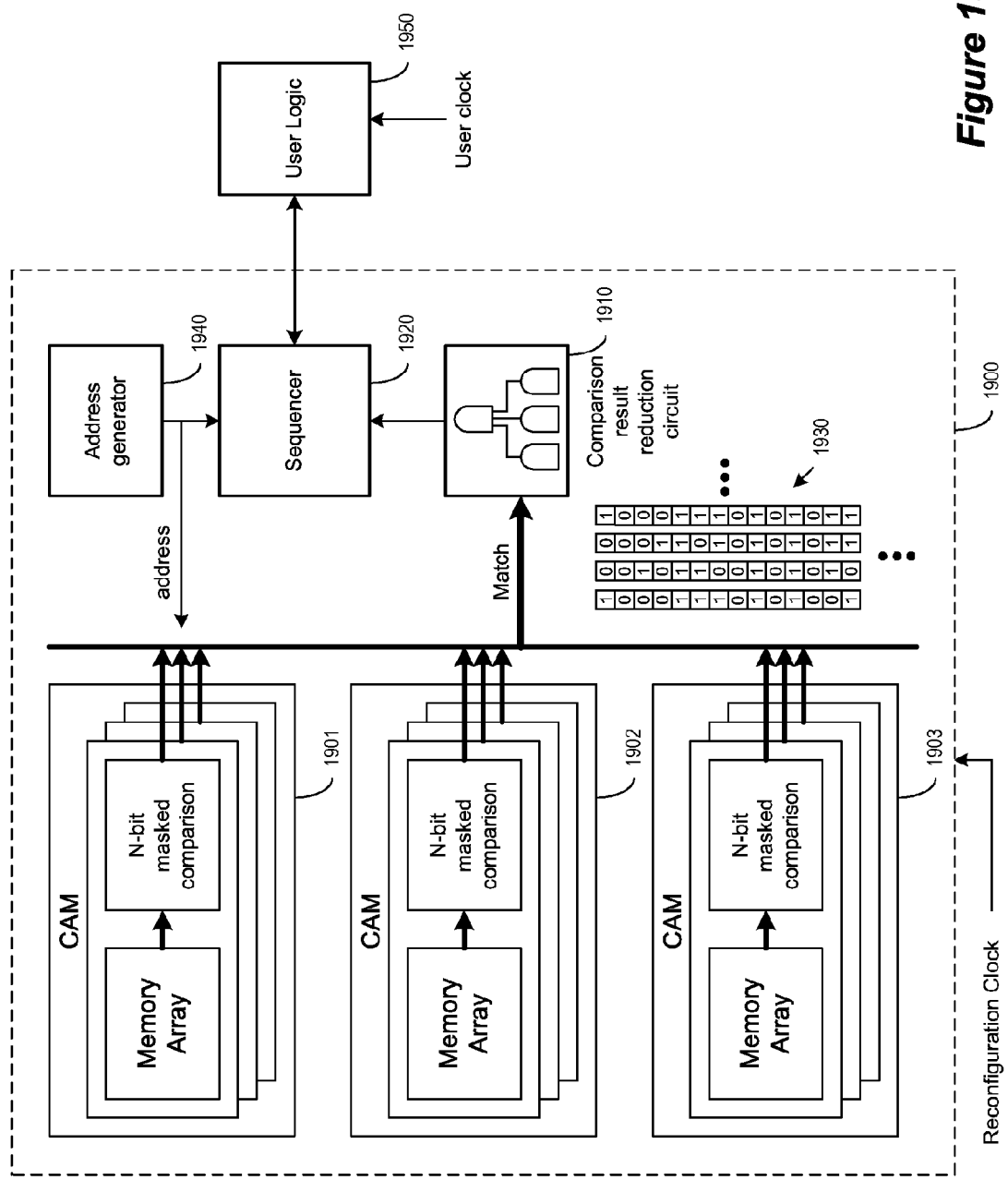
FIG. 19 illustrates a user defined CAM that includes a comparison result reduction circuitry that operates in reconfiguration clock for processing the comparison result stream.

As mentioned above by reference to FIG. 7, some embodiments use comparison result reduction circuitry such as 710 and 720 to logically reduce the comparison result instead of storing the entire comparison result stream in a storage circuit. Some embodiments include such a comparison result reduction circuitry that operates in the reconfiguration clock. FIG. 19 illustrates a user defined CAM 1900 that includes a comparison result reduction circuitry 1910 that operate in reconfiguration clock for processing the comparison result stream. Similar to the user defined CAM 1800, the user defined CAM 1900 includes CAM modules 1901-1903, an address generator 1940, and a sequencer 1920 that interfaces a user logic 1950. Like the CAM modules 1801-1803, the CAM modules 1901-1903 also perform content matching/searching operations and produce a comparison result stream 1930. However, unlike the user defined CAM 1800 which stores comparison result stream in a storage circuit, the user defined CAM 1900 includes the comparison result reduction circuit 1910 that logically reduces the comparison result stream.

The comparison result reduction circuit 1910 accepts comparison result bits from all CAM modules in the user defined CAM 1900 on every reconfiguration clock cycle. In some embodiments, the many bits of the comparison result stream 1930 are logically reduced by the comparison reduction circuit 1910 to a few status bits in several reconfiguration clock driven pipeline stages. The status bits being produced every cycle are fed to the sequencer 1920, which keeps track of matching entries in the user defined CAM 1900. In some embodiments, the sequencer includes accumulators similar to the accumulators 750 and 760 for keeping track of the matching entries.

In some embodiments, the comparison result reduction circuit 1910 and the sequencer 1920 are implemented by configurable circuits that are programmed by the user according to the requirement of the user design. In some embodiments, the configurable circuits implementing the comparison result reduction circuit 1910 and the sequencer 1920 are reconfigurable circuits that reconfigures once every reconfiguration clock cycle.

The comparison result reduction circuit 1910 can be programmed to produce any types of status bits. The comparison result reduction circuit can be programmed to produce status bits based on different configurations of CAM entries or concatenated words, as discussed above by reference to FIG. 11*a-c*. For example, a user defined CAM that is configured to simultaneously compare four 64 bit entries with one 64 bit key yields 256 comparison bits in each clock cycle. A corresponding comparison result reduction circuits in some embodiments would include configurable circuits that implement four 64-to-1 AND tree to produce four status bits for the four entries in each clock cycle.

The sequencer 1920 in some embodiments can be programmed to process the status bits produced by the comparison result reduction circuit 1910. In some embodiments, the sequencer 1920 is programmed as a finite state machine that is capable of processing status bits across multiple clock cycles. Such a sequencer can be used to determine whether a concatenated word that is defined across multiple clock cycles matches the key (e.g., by looking for consecutive matching indications across multiple clock cycles). In addition, the sequencer 1920 can be programmed to implement a fast link list traversing algorithm, as described above by reference to FIG. 17.

IV. Ternary Content Addressable Memory

In some embodiments, at least some of the CAMs in the IC are Ternary Content Addressable Memories (TCAMs). Each TCAM includes comparators with individual bits that can be masked so these bits do not participate in the determination of whether an entry matches the key. In some embodiments, each bit of a key is a logical bit that includes two physical bits for denoting logical '1', logical '0', and logical 'X' (or "don't care"). In some embodiments, each bit of an entry is a logical bit that includes two physical bits for denoting logical '1', logical '0', and logical 'X' (or don't care). A logical bit with a logical 'X' causes the comparator to mask the bit. In some embodiments, the two logical bits include one data bit and one mask bit. A logical bit with a '1' in the mask bit represents a logical 'X' regardless of what is in the data bit (i.e., the data bit is a "don't care" and thus masked). A logical bit with a '0' in the mask bit represent either a '1' or a '0' depending on the value of the data bit (i.e., the data is not masked). One of ordinary skill in the art would recognize that coding of logical '1', '0' and 'X' is arbitrary and that some embodiments may encode a logical bit differently (e.g., using '1' in the mask bit to represent 'X').

In some embodiments, each bit of the content stored in TCAM memory array is a logical bit pair capable of expressing 'X'. In some embodiments, a key is a ternary key formed by logical bit pairs capable of expressing 'X'. A logical 'X' from either the key or the TCAM memory array would cause the comparison result of the corresponding bit position to be disregarded.

Figure 20:
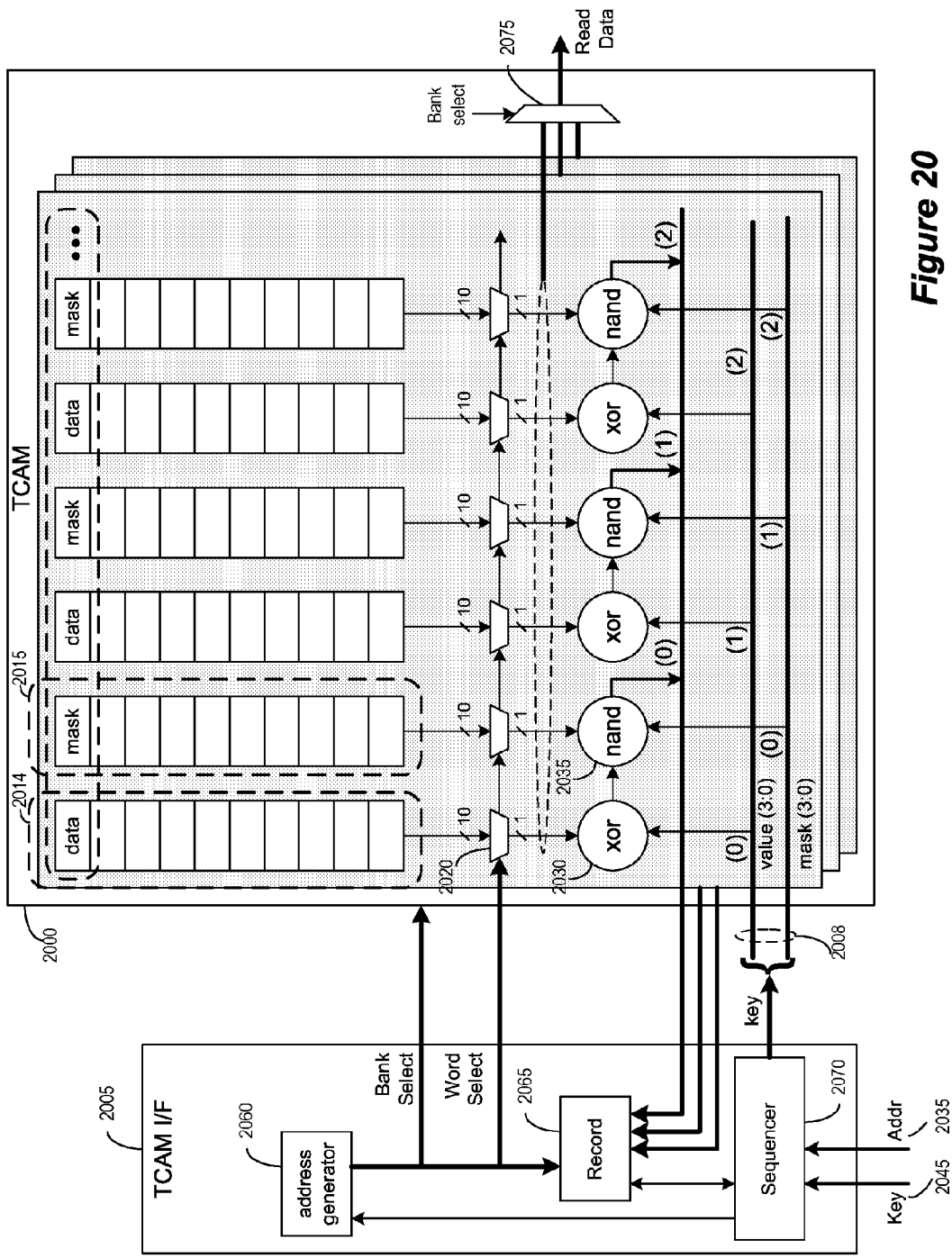
FIG. 20 illustrates an example TCAM with built-in support for handling logical 'X'.

For some embodiments, FIG. 20 illustrates an example TCAM 2000 with built-in support for handling logical 'X'. Like CAM 100, the TCAM 2000 performs content searching/matching operation based on a key 2045, which is used by the TCAM interface 2005 to look for a matching entry in the TCAM 2000. The TCAM 2000 is also divided into several banks, each bank includes an array of memory cells and a set of comparison logic for comparing the key with the content stored in the array of memory of that bank. The content of the TCAM can be directly read or written at any particular address location by using an address bus 2035 and a read data bus 2075, which is the output of multiplexer that uses a bank select signal from the TCAM interface to select read data from one of the banks.

The TCAM interface 2005 represents circuits outside of the TCAM 2000 that serve as interface between the TCAM 2000 and the reset of the IC. It is similar to the CAM interface 105 in that it too provides bank select signal, word select signal based on the address 2035. The TCAM interface 2005 also provides an n-bit key to each of the banks based on the received key 2045. The TCAM interface 2005 also includes a match record 2065 for receiving matching result bits from all of the banks for some or all of the words.

TCAM is similar to CAM except that TCAM supports "don't care" by using half of the bits in the memory array and/or half of the bits in the key as mask bits. The key 2008 as supplied by the TCAM interface 2005 to the TCAM 2000 includes both "value" bits and "mask" bits. Each bit position in the key has a corresponding value bit and a corresponding mask bit. A bit position with a mask bit of '1' indicate that this bit position in the key is a "don't care". A bit position with a mask bit of '0' indicates that the value bit at this bit position will be used for comparison with content in the TCAM.

The TCAM 2000 also includes circuitry for masking comparison result on bit positions that are "don't care". In order to support "don't care" logic, half of the columns of memory array stores data while the other half of the columns stores mask bits. As illustrated, the XOR gates (including the XOR gate 2030) compares each data bit of the word selected by the word selected signal with each bit in the 4-bit "value" part of the key 2008. The bit-wise comparison yields a 4 bit comparison result. A '1' in the comparison result indicates that there is a mismatch between the key and the retrieved word at that particular bit location. Each bit wise comparison result is then sent to a NAND gate to be masked in case it is a "don't care" bit. For example, at bit position 0, the data bit supplied by column 2014 is first compared with value bit 0 of the key 2008 at XOR gate 2030, where a '1' represents that there is a mismatch. This result bit is fed to the NAND gate 2035, where a mask bit coming from the column 2015 and a mask bit from the key 2008 comes together to mask the bit of comparison result. A '0' from either the stored mask bit or the mask bit in the key would force the NAND gate 2035 to produce a '1', thereby masking the comparison result on that bit position. The comparison result bits are then fed to the match record 2065 in the TCAM interface 2005.

One of ordinary skill in the art would recognize that the production of the match signal can be implemented by different logic gates. Using XOR gates and NAND gates to produce a logic '1' match signal is one of many possible Boolean alternatives. For example, producing a logic '1' to indicate a match can be equivalently accomplished by using by using '1' in the mask bit represent 'X' instead of '0', and by using EQ gates (i.e., inverse of XOR) and OR gates.

Figure 21:
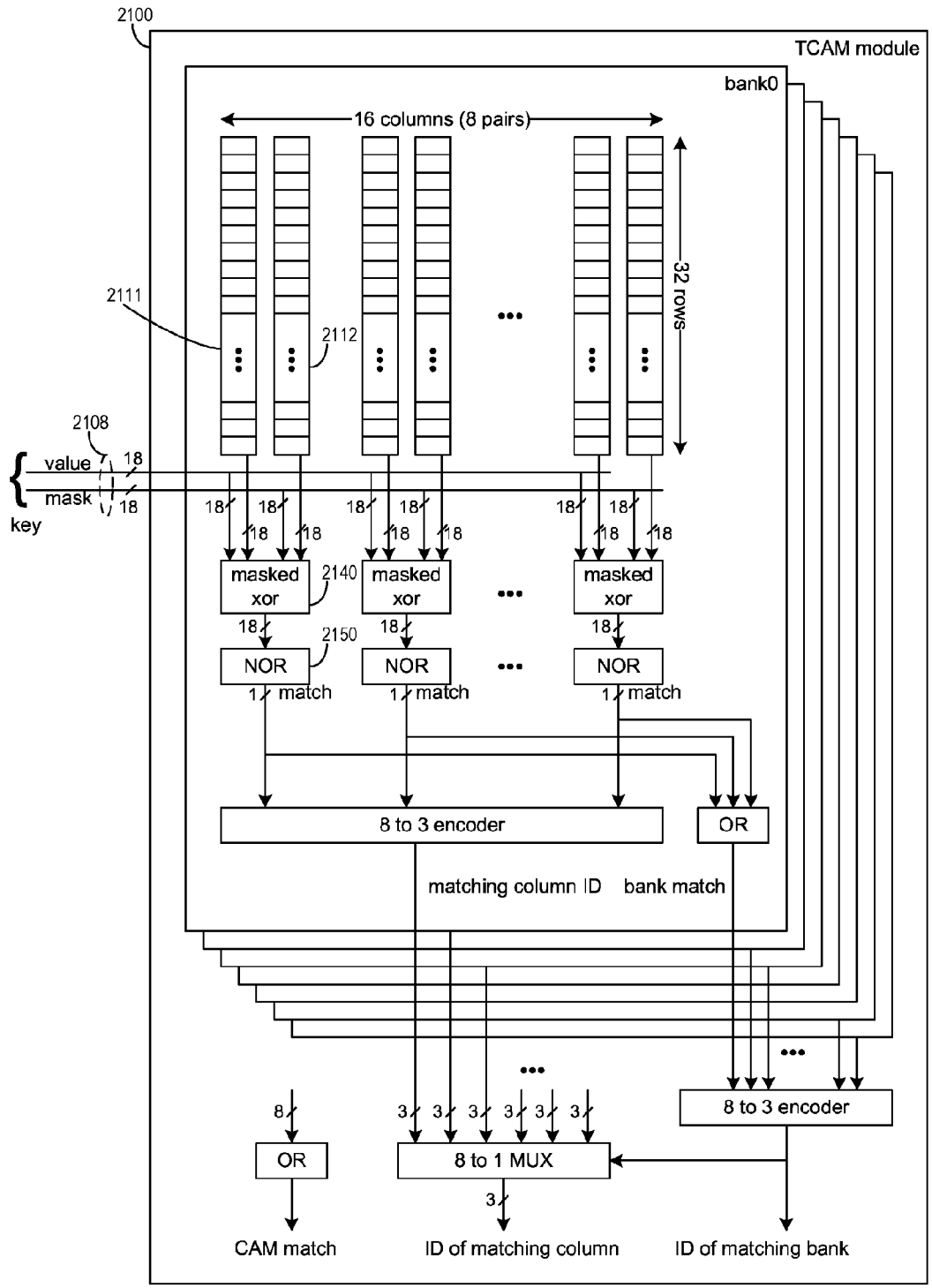
FIG. 21 illustrates an example TCAM that includes multiple sets of memory cells and multiple sets of supporting circuitry for content searching.

Similar to a CAM, a TCAM can also include multiple sets of memory cells and multiple sets of supporting circuitry for parallel content searching. FIG. 21 illustrates an example TCAM 2100 that includes multiple sets of memory cells and multiple sets of supporting circuitry for content searching. The TCAM 2100 is similar to the CAM 400 of FIG. 4 in that the TCAM 2100 also has 8 banks of memory cells, with each bank including 16 columns, and each column including 32 rows that are 18 bits each. The TCAM 2100 differs from the CAM 400 in that its 16 columns are organized into 8 column pairs (e.g., data column 2111 and mask column 2112), with each pair representing one logical bit capable of expressing a logical 'X'. The TCAM 2100 also receives an 18-bit ternary key 2108 consisting of an 18-bit value and an 18-bit mask. The comparators of the TCAM 2100 are mask comparators that mask the comparison result for "don't care" bits. For example, the masked XOR gate 2140 uses the 18 bit key mask and the 18 bit stored mask from the mask column 2112 to mask the comparison result between the 18 bit key and the 18 bit data from the data column 2111.

Although both the CAM 400 and the TCAM 2100 have the same number of memory cells, the TCAM 2100 supports only 64 sets of simultaneous content searching. This is because the TCAM 2100 uses half of the 18 bit wide columns to store mask bits. In contrast, the CAM 400 uses all 128 columns to store data bits. It is therefore capable of supporting 128 sets of simultaneous content searching.

In some embodiments, a TCAM module can be configured to act as a CAM, a TCAM or a RAM. In some embodiments, whether a TCAM module is used as a CAM, a RAM, or a TCAM is determined by how the configurable circuits that interface or control the TCAM module are configured. These configurable circuits (e.g., the CAM interface 105, the sequencer 170, etc.) are in turn configured by configuration data stored in configuration storages in some embodiments. In other words, a TCAM module can be configured to function as a CAM, a RAM, or a TCAM based on different sets of configuration data stored in configuration storages. The TCAM module of some embodiments includes the necessary circuitry to support all three different configurations.

Figure 22:
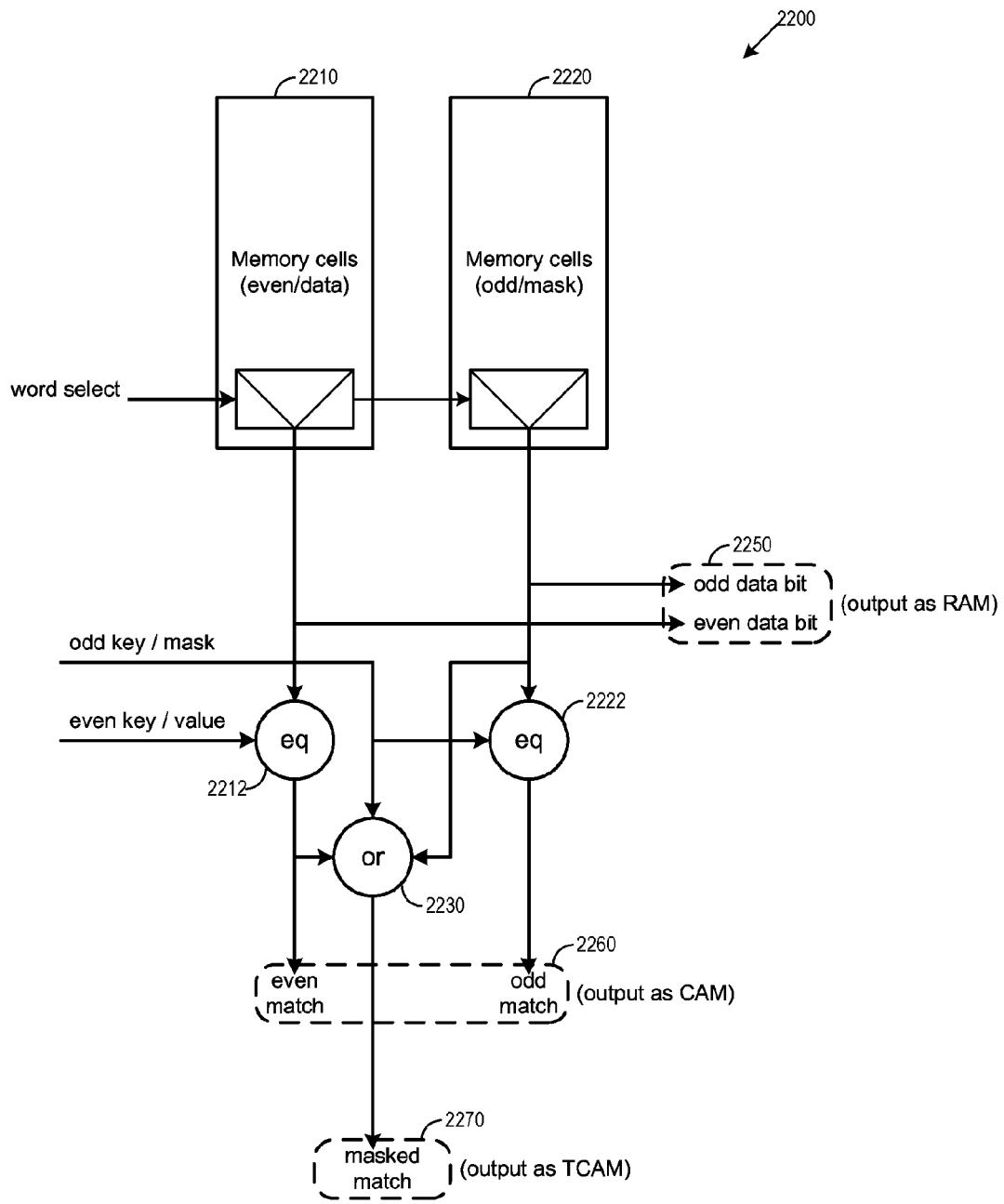
FIG. 22 illustrates example support circuitry in a TCAM module.

FIG. 22 illustrates example support circuitry 2200 in a TCAM module that allows two columns of memory cells 2210 and 2220 to act either as a RAM, a CAM with two sets of comparators, or a TCAM with one set of masked comparators. The support circuitry 2200 includes two EQ gates (inverse of XOR) 2212 and 2222, and an OR gate 2230. The memory cells 2210 and 2220 use the word select signal to select one of several words stored in the memory cells. One of ordinary skill in the art would recognize that a column of memory cells is chosen in this example to be 1-bit wide for illustration purpose only. In some embodiments, each column is wider than one bit.

When used as a CAM or a RAM, the memory cell 2210 supplies a bit in an even number bit position, and the memory cell 2220 supplies a bit in an odd number bit position. When used as a TCAM, physical bits coming from the memory cells 2210 and 2220 form a ternary pair (for supporting logical 'X') such that the memory cell 2210 supplies the data bit in the ternary pair and the memory cell 2220 supplies the mask bit in the ternary pair.

The EQ gate 2212 receives a data bit from the memory cell 2210 and produces a match signal between the data in the memory cell 2210 and an even bit in the key. The EQ gate 2222 receives a data bit from the memory cell 2220 and produces a match signal between the data in the memory cell 2210 and an odd bit in the key. The OR gate 2230 is for producing a masked comparator result for the TCAM. It receives the outputs from the EQ gate 2212 as the data bit comparison result, the output of the memory cell 2220, and the odd bit from the key as masks. In this circuit, if a bit from the key matches a bit in the memory, the EQ gate produces a '1'. This comparison result will be masked by either a '1' from the mask column 2220, or from a '1' in a corresponding mask bit from the key. One of ordinary skill in the art will recognize that other Boolean alternatives for the choice of logic gates and ternary pair encoding are possible.

For the TCAM module to act as a RAM, the data from the memory cells are directly tapped as output bits 2250. For the TCAM module to act as a CAM, it outputs two matching indicators (2260) for each of the two memory cell columns from the outputs of EQ gates 2212 and 2222. For the TCAM module to act as a TCAM, it outputs only one matching indicator based on the masked comparison at 2270.

Since TCAM modules can act as RAM, CAM or TCAM, some embodiments include only TCAMs in an IC with configurable circuits for implementing user defined CAMs, RAMs or TCAMs in a user design. In some other embodiments, TCAM functionalities are not implemented by using TCAMs with built-in masked comparator. Instead, configurable circuits in the configurable fabric together with CAMs can be configured to become a user defined TCAM.

Figure 23:
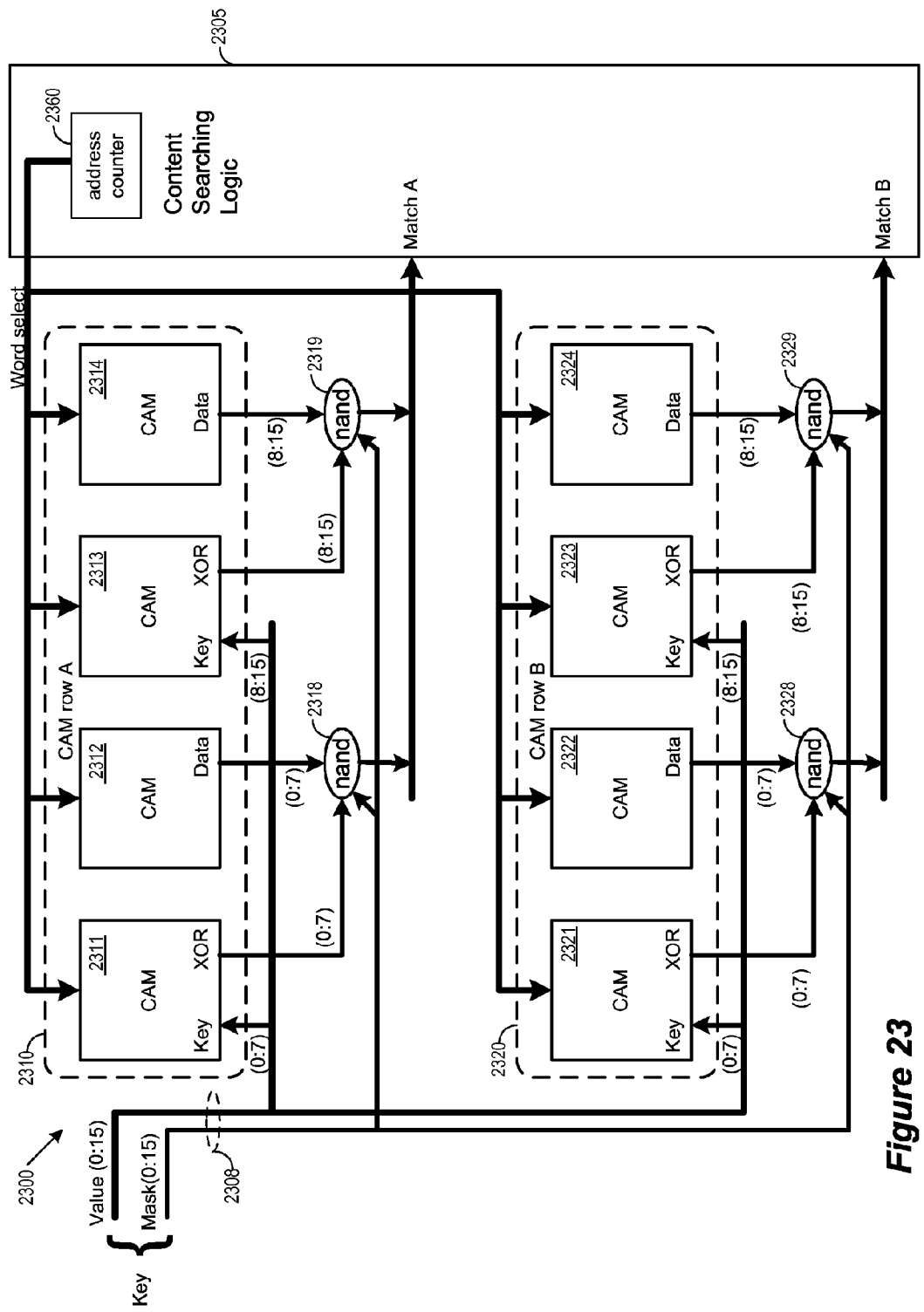
FIG. 23 illustrates a user defined TCAM that is implemented by several regular CAMs.

FIG. 23 illustrates a user defined TCAM 2300 that is defined by several regular CAMs. The user defined TCAM 2300 receives a ternary key 2308 that includes 16 value bits and 16 mask bits. The user defined TCAM 2300 includes 2 rows of CAMs 2310 and 2320. The first CAM row 2310 includes CAMs 2311, 2312, 2313, and 2314. The second CAM row 2320 includes CAMs 2321, 2322, 2323, and 2324. The user defined TCAM is storing 16-bit concatenated words. The user defined TCAM 2300 also includes content searching logic 2305 that supports the content searching operation of the user defined TCAM by providing an address counter 2360. In some embodiments, the content searching logic 2305 is implemented in the configurable fabric.

Each CAM is 8-bit wide and can perform an 8-bit comparison between its content and an 8-bit key. Each CAM row receives the same 16 bit ternary key (16 bit key and 16 bit mask) for comparison with the 16-bit concatenated words stored in the CAM row. Within each CAM row, two of the CAMs store data bits of the concatenated word and compare the stored data bits with the key bits while the other two CAMs store mask bits and provide those mask bits for expressing logical don't cares. For example, in the CAM row 2310, the CAM 2311 compares bits 0 to 7 of the key with bits 0 to 7 of the concatenated words, and the CAM 2313 compares bits 8 to 15 of the key with bits 8 to 15 of the concatenated words. The CAM 2312 provides mask bits for bits 0 to 7 and the CAM 2314 provides mask bits for bits 8 to 15. The CAMs 2311 and 2313 provide bit-wise comparison results to the NAND gates 2318 and 2319, respectively. These two NAND gates then apply the mask bits from the CAMs 2312 and 2314 to mask the bit positions that correspond to "don't cares" (in this case, a '0' in the mask means the bit is a "don't care" bit, while a '1' in the comparison result means there is a mismatch in the bit position.)

V. Configurable IC Architecture

An IC is a device that includes numerous electronic components (e.g., transistors, resistors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit that has configurable circuits. A configurable circuit is a circuit that can "configurably" perform a set of operations. Specifically, a configurable circuit receives a configuration data set that specifies the operation that the configurable circuit must perform from the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in any or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 24:
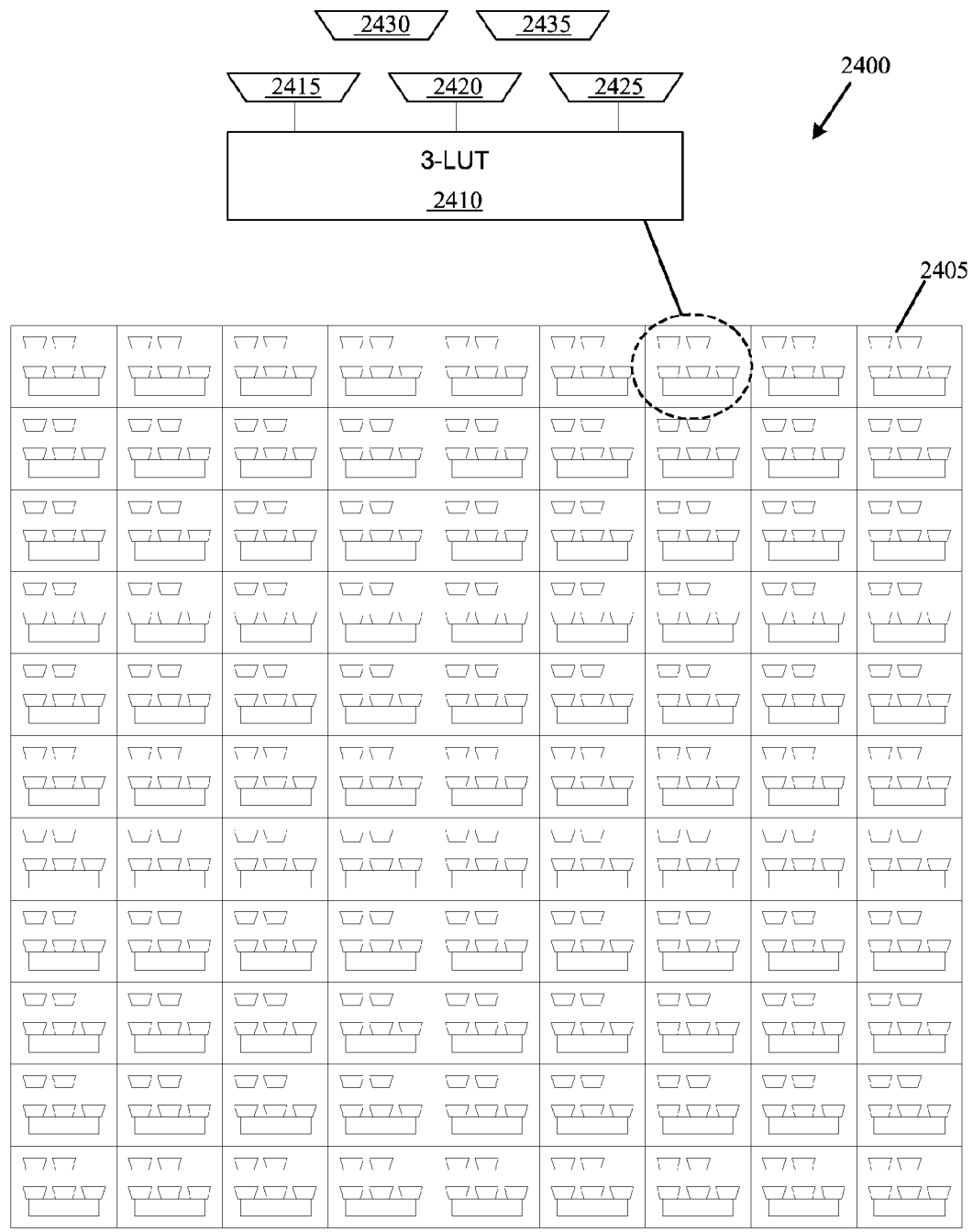
FIG. 24 illustrates a configurable circuit architecture that is formed by numerous configurable tiles that are arranged in an array with multiple rows and columns of some embodiments.
Figure 25:
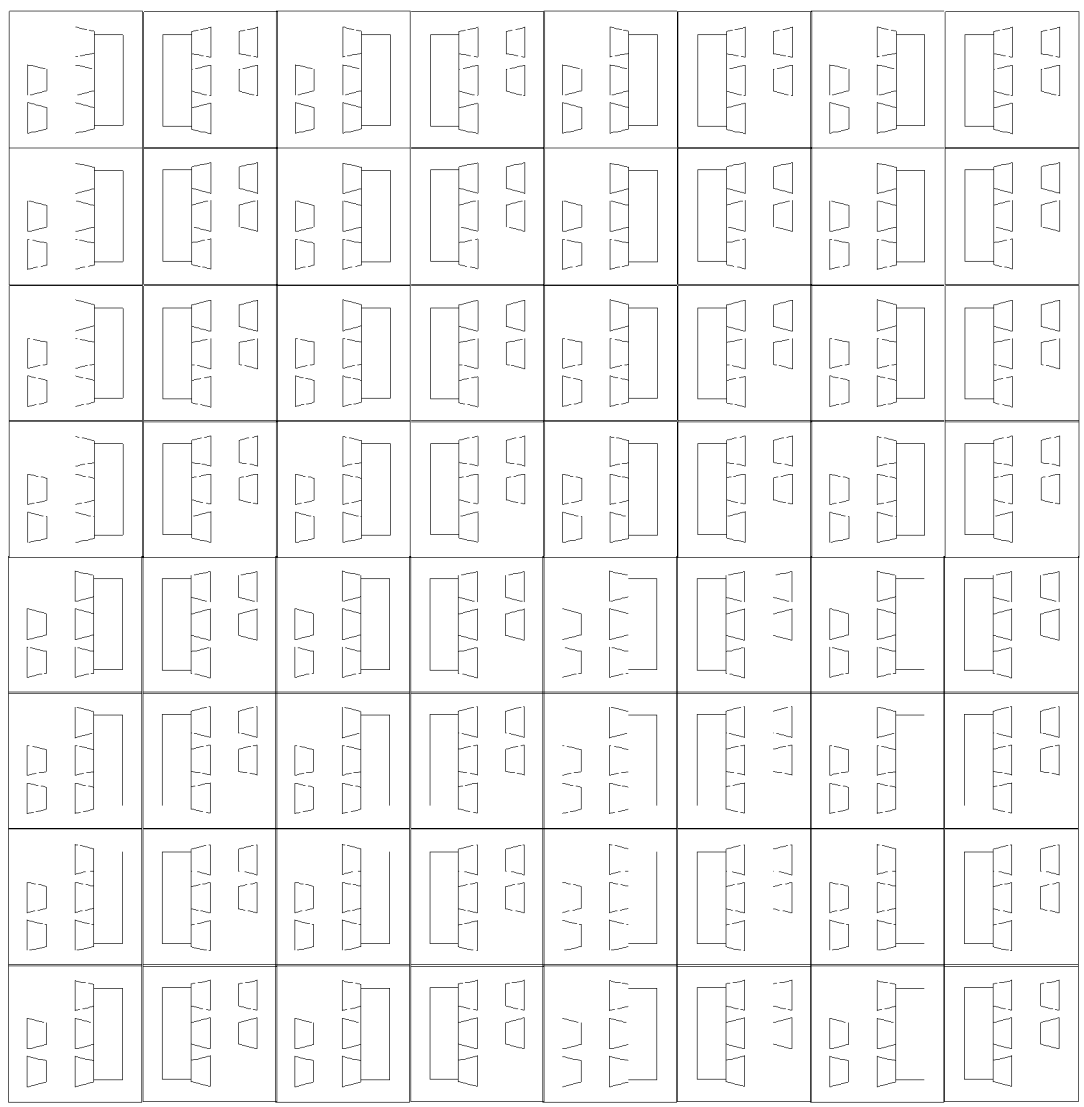
FIG. 25 provides one possible physical architecture of the configurable IC illustrated in FIG. 24 of some embodiments.
Figure 26:
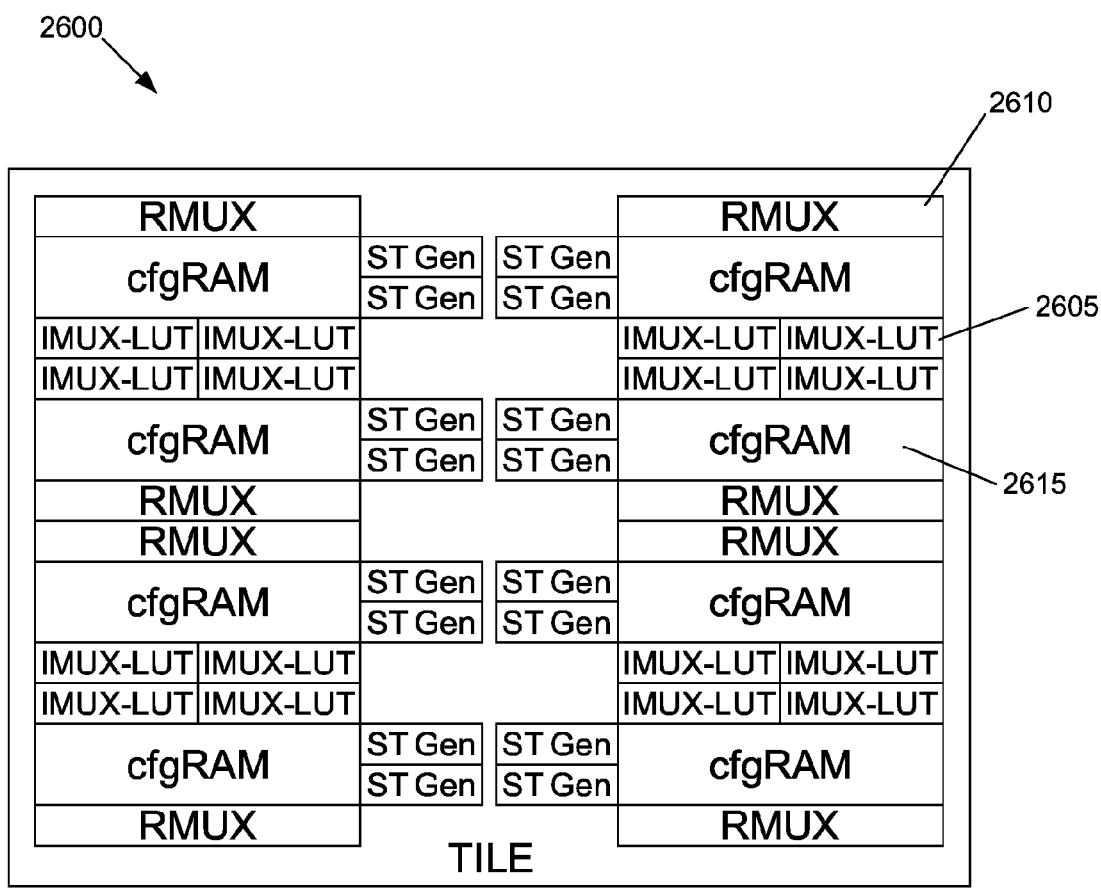
FIG. 26 illustrates the detailed tile arrangement of some embodiments.

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 24-26 illustrate several configurable circuit arrangements/architectures that include the invention's circuits. One such architecture is illustrated in FIG. 24.

The architecture of FIG. 24 is formed by numerous configurable tiles 2405 that are arranged in an array with multiple rows and columns. In FIG. 24, each configurable tile includes a configurable three-input LUT 2410, three configurable input-select multiplexers 2415, 2420, and 2425, and two configurable routing multiplexers 2430 and

2435. Different embodiments have different numbers of configurable interconnect circuits 2415-2435. For instance, some embodiments may have eight configurable interconnect circuits while others may have more or less such circuits. For each configurable circuit, the configurable IC 2400 includes a set of storage elements (e.g., a set of SRAM cells) for storing a set of configuration data bits. Storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits. One such type of configurable tile is a CAM tile, which includes memory arrays and circuits in support of content matching/searching operation based on a given key.

In FIG. 24, an input-select multiplexer (also referred to as an "IMUX") 2415 is an interconnect circuit associated with the LUT 2410 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 24, a routing multiplexer (also referred to as an RMUX) 2430 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 24 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments.

Various wiring architectures can be used to connect the RMUXs, IMUXs, and LUTs. Several examples of the wire connection scheme are described in U.S. Pat. No. 7,295,037, entitled "Configurable IC with Routing Circuits with Offset Connections", issued on Nov. 13, 2007.

Several embodiments are described below by reference to a "direct connection." In some embodiments, a direct connection is established through a combination of one or more wire segments, and potentially one or more vias, but no intervening circuit. In some embodiments, a direct connection might, however, include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direct connection. Also, some connections are referred to below as configurable connections and some circuits are described as configurably connected. Such references signify that the circuits are connected through a configurable interconnect circuit (such as a configurable routing circuit).

In some embodiments, the examples illustrated in FIG. 24 represent the actual physical architecture of a configurable IC. However, in other embodiments, the examples illustrated in FIG. 24 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the physical architecture of the IC appears quite different than its topological architecture. FIG. 25 provides one such possible physical architecture of the configurable IC 2400 illustrated in FIG. 24.

Having the aligned tile layout with the same circuit elements of FIG. 25 simplifies the process for designing and fabricating the IC, as it allows the same circuit designs and mask patterns to be repetitively used to design and fabricate the IC. In some embodiments, the similar aligned tile layout not only has the same circuit elements but also has the exact same internal wiring between their circuit elements. Having such a layout further simplifies the design and fabrication processes by further simplifying the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 26 illustrates an alternative tile structure that is used in some embodiments. This tile 2600 has four sets 2605 of 4-aligned LUTs along with their associated IMUXs. It also includes eight sets 2610 of RMUXs and eight banks 2615 of configuration RAM storage. Each 4-aligned LUT tile shares one carry chain. One example of which is described in U.S. Pat. No. 7,295,037, entitled "Configurable IC with Routing Circuits with Offset Connections", issued on Nov. 13, 2007. One of ordinary skill in the art would appreciate that other organizations of LUT tiles may also be used in conjunction with the invention and that these organizations might have fewer or additional tiles.

VI. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 27:
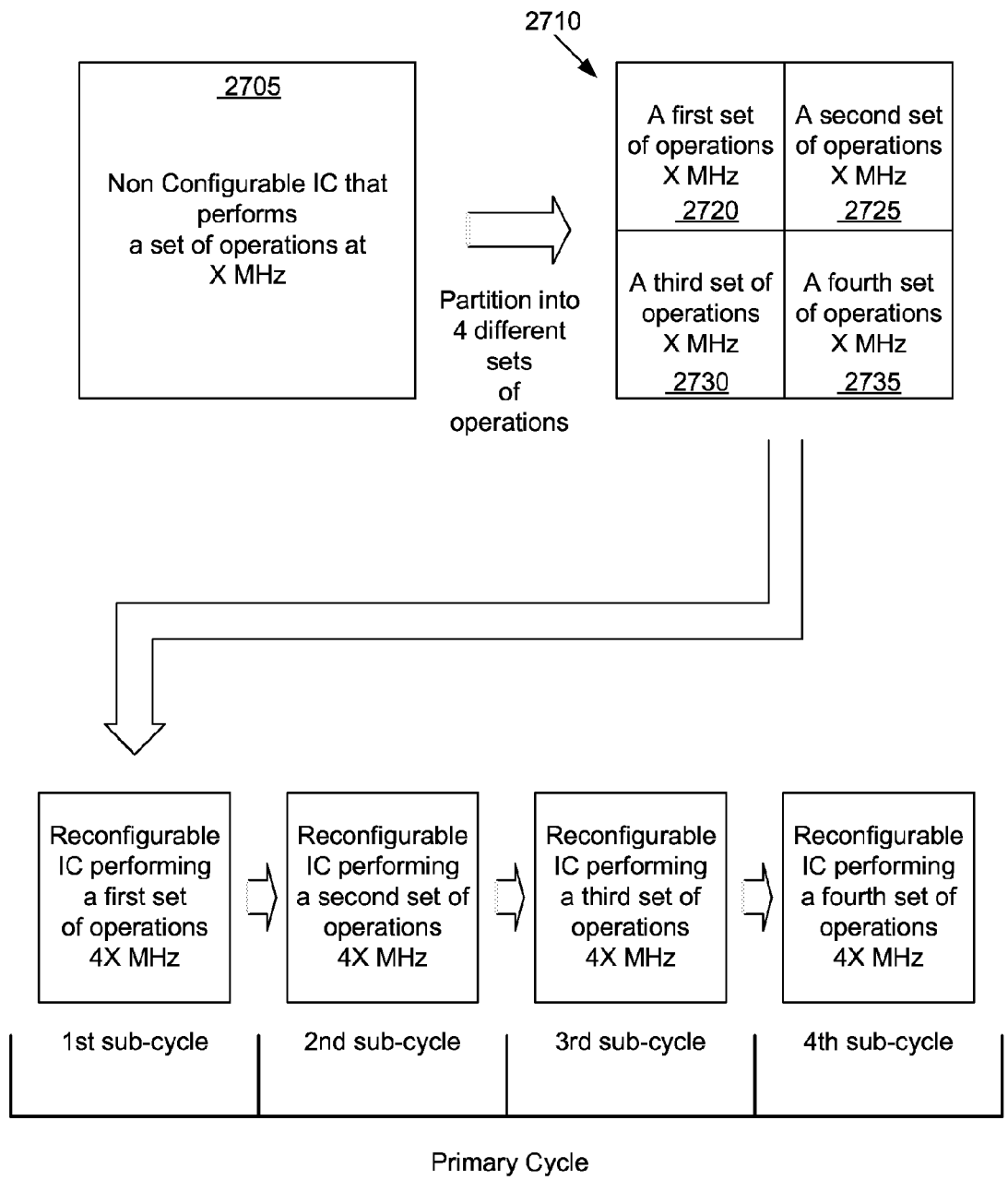
FIG. 27 illustrates an example of a sub-cycle reconfigurable IC of some embodiments.

FIG. 27 conceptually illustrates an example of a sub-cycle reconfigurable IC (i.e., an IC that is reconfigurable on a sub-cycle basis). In this example, the sub-cycle reconfigurable IC implements an IC design 2705 that operates at a clock speed of X MHz. The operations performed by the components in the IC design 2705 can be partitioned into four sets of operations 2720-2735, with each set of operations being performed at a clock speed of X MHz.

FIG. 27 then illustrates that these four sets of operations 2720-2735 can be performed by one sub-cycle reconfigurable IC 2710 that operates at 4X MHz. In some embodiments, four cycles of the 4X MHz clock correspond to four sub-cycles within a cycle of the X MHz clock. Accordingly, this figure illustrates the reconfigurable IC 2710 reconfiguring four times during four cycles of the 4X MHz clock (i.e., during four sub-cycles of the X MHz clock). During each of these reconfigurations (i.e., during each sub-cycle), the reconfigurable IC 2710 performs one of the identified four sets of operations 2720-2735. In other words, the faster operational speed of the reconfigurable IC 2710 allows this IC to reconfigure four times during each cycle of the X MHz clock, in order to perform the four sets of operations 2720-2735 sequentially at a 4X MHz rate instead of performing the four sets of operations in parallel at an X MHz rate.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 16, 32, etc.) can likewise be implemented.

For some embodiments, real-time reconfigurable circuits as described above by reference to FIGS. 24-27 are used to implement user designs that incorporate CAM and/or TCAM functionalities. In some embodiments, reconfigurable circuits are used to implement circuits that serve as interface circuitry between CAM/TCAM and the rest of the IC. Examples of such circuits includes the CAM interface circuits 105, the comparison result reduction circuits 1910, the sequencers 1570, 1670, 1820, 1920, etc.

While the reconfigurable circuits described above reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

VII. Configurable IC and System

Some embodiments described above are implemented in configurable ICs that can compute configurable combinational digital logic functions on signals that are presented on the inputs of the configurable ICs. In some embodiments, such computations are stateless computations (i.e., do not depend on a value of a previous state). Some embodiments described above are implemented in configurable ICs that can perform a continuous function. In these embodiments, the configurable IC can receive a continuous function at its input, and in response, provide a continuous output at one of its outputs.

Figure 28:
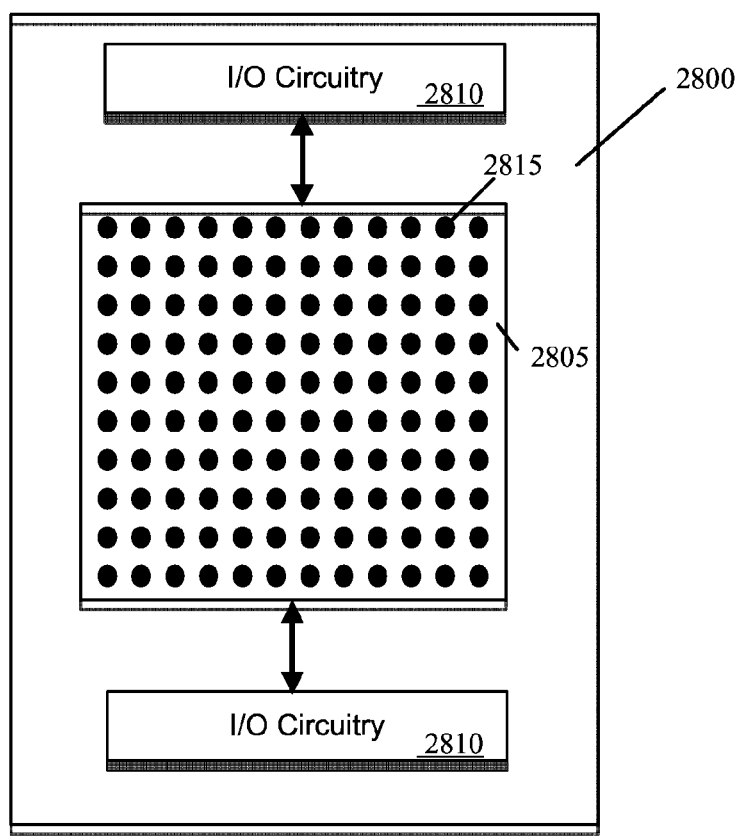
FIG. 28 illustrates a portion of a configurable IC of some embodiments of the invention.

FIG. 28 illustrates a portion of a configurable IC 2800 of some embodiments of the invention. As shown in this figure, this IC has a configurable circuit arrangement 2805 and I/O circuitry 2810. The configurable circuit arrangement 2805 can include any of the above described circuits, storage elements, and routing fabric of some embodiments of the invention. The I/O circuitry 2810 is responsible for routing data between the configurable nodes 2815 of the configurable circuit arrangement 2805 and circuits outside of this arrangement (i.e., circuits outside of the IC, or within the IC but outside of the configurable circuit arrangement 2805). As further described below, such data includes data that needs to be processed or passed along by the configurable nodes.

Figure 29:
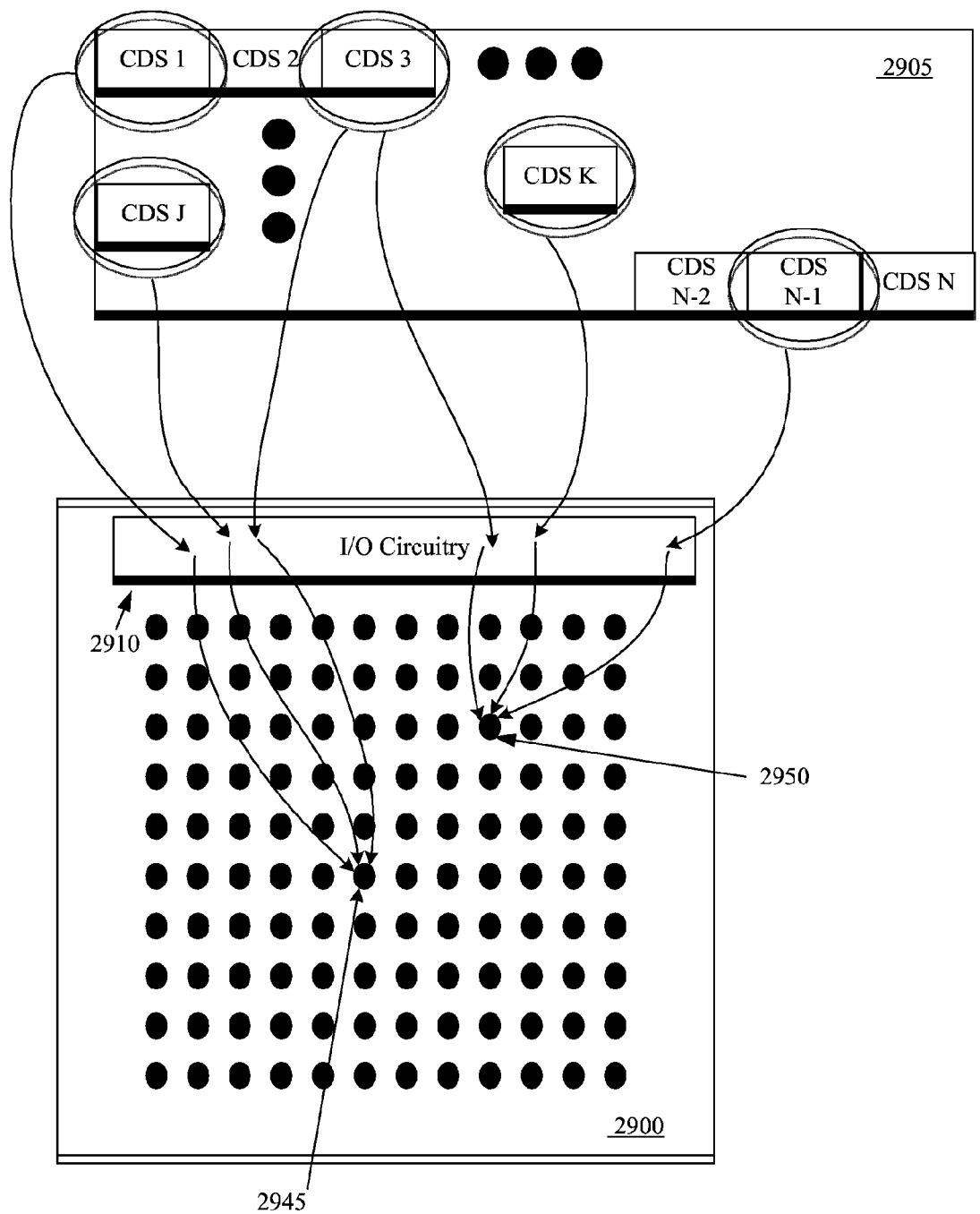
FIG. 29 illustrates a more detailed example of a set of configuration data that configures nodes to perform particular operations.

The data also includes, in some embodiments, a set of configuration data for configuring the nodes to perform particular operations. FIG. 29 illustrates a detailed example of this. Specifically, this figure illustrates a configuration data pool 2905 for the configurable IC 2900. This pool includes N configuration data sets ("CDS"). As shown in FIG. 29, the I/O circuitry 2910 of the configurable IC 2900 routes different configuration data sets to different configurable nodes of the IC 2900. For instance, FIG. 29 illustrates configurable node 2945 receiving configuration data sets 1, 3, and J, through the I/O circuitry, while configurable node 2950 receives configuration data sets 3, K, and N−1, through the I/O circuitry. In some embodiments, the configuration data sets are stored within each configurable node. Also, in some embodiments, a configurable node can store multiple configuration data sets for a configurable circuit so that the circuit can reconfigure quickly by changing to another configuration data set for a configurable circuit. In some embodiments, some configurable nodes store only one configuration data set, while other configurable nodes store multiple configuration data sets for a configurable circuit.

Figure 30:
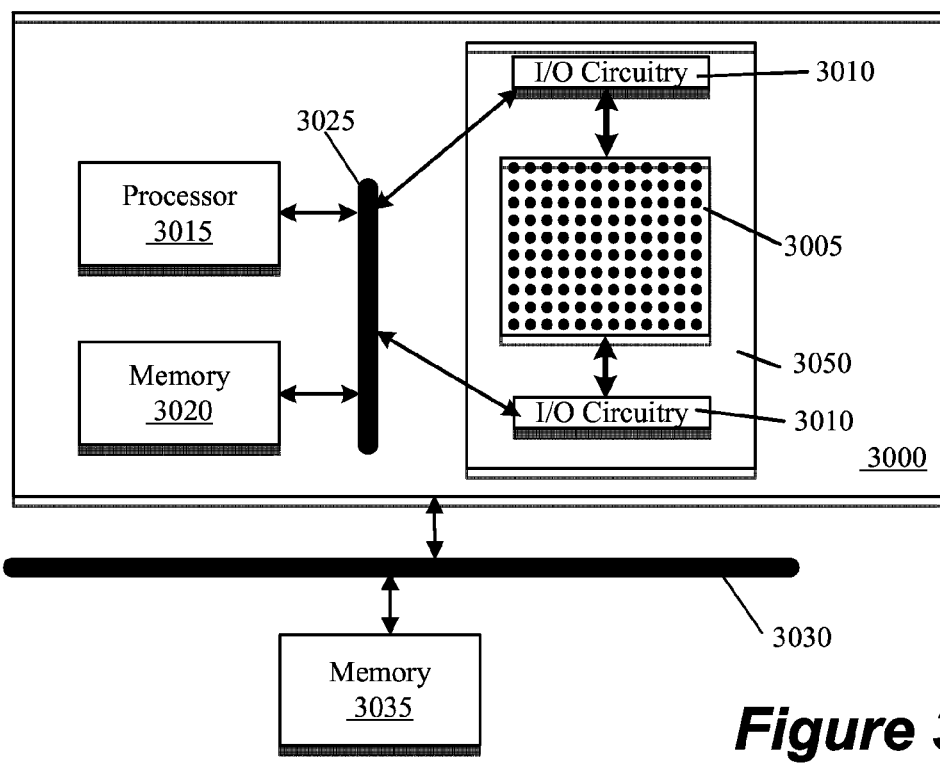
FIG. 30 illustrates a system on a chip ("SoC") implementation of a configurable IC.

A configurable IC of the invention can also include circuits other than a configurable circuit arrangement and I/O circuitry. For instance, FIG. 30 illustrates a system on a chip ("SoC") implementation of a configurable IC 3000. This IC has a configurable block 3050, which includes a configurable circuit arrangement 3005 and I/O circuitry 3010 for this arrangement. It also includes a processor 3015 outside of the configurable circuit arrangement, a memory 3020, and a bus 3025, which conceptually represents all conductive paths between the processor 3015, memory 3020, and the configurable block 3050. As shown in FIG. 30, the IC 3000 couples to a bus 3030, which communicatively couples the IC to other circuits, such as an off-chip memory 3035. Bus 3030 conceptually represents all conductive paths between the system components.

The processor 3015 can read and write instructions and/or data from an on-chip memory 3020 or an off-chip memory 3035. The processor 3015 can also communicate with the configurable block 3050 through memory 3020 and/or 3035 through buses 3025 and/or 3030. Similarly, the configurable block can retrieve data from and supply data to memories 3020 and 3035 through buses 3025 and 3030.

Figure 31:
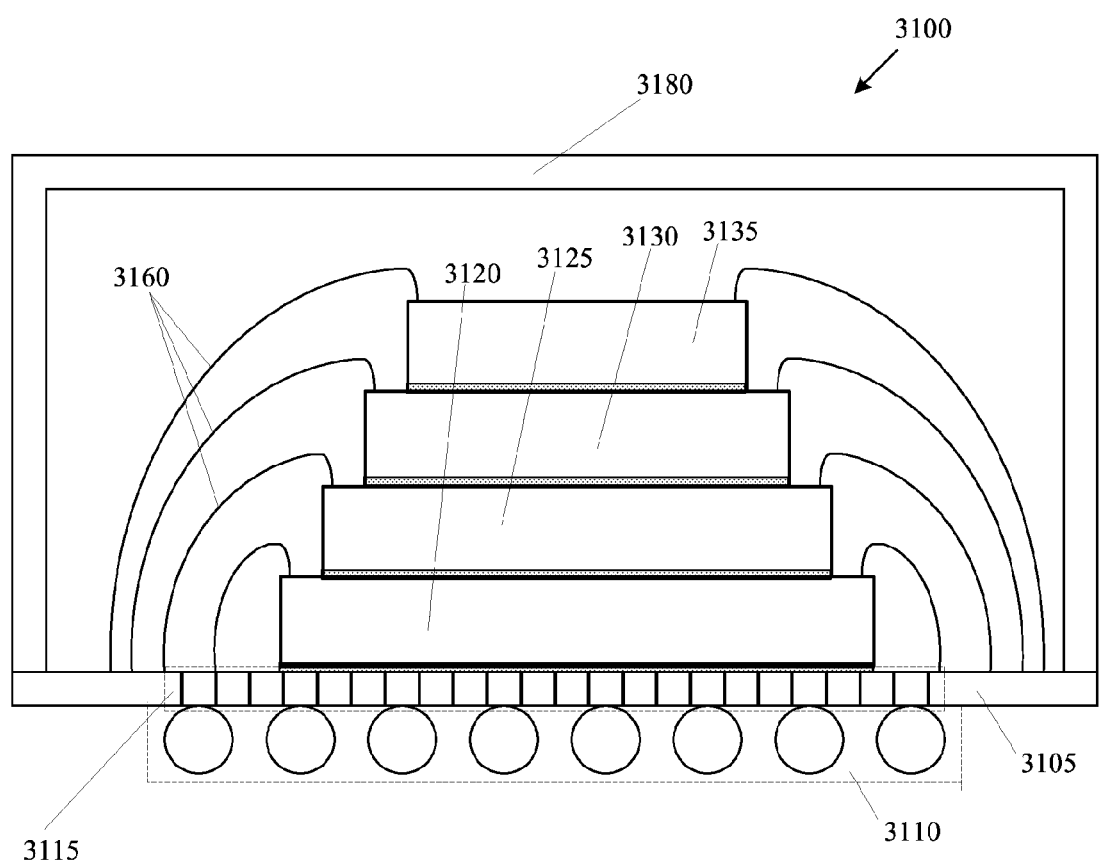
FIG. 31 illustrates a system in a package ("SiP") implementation of a configurable IC.

Instead of, or in conjunction with, the system on a chip ("SoC") implementation for a configurable IC, some embodiments might employ a system in a package ("SiP") implementation for a configurable IC. FIG. 31 illustrates one such SiP 3100. As shown in this figure, SiP 3100 includes four ICs 3120, 3125, 3130, and 3135 that are stacked on top of each other on a substrate 3105. At least one of the ICs is a configurable IC that includes a configurable block, such as the configurable block 3050 of FIG. 30. Other ICs might be other circuits, such as processors, memory, etc.

As shown in FIG. 31, the IC communicatively connects to the substrate 3105 through wire bondings 3160. These wire bondings 3160 allow the ICs 3120-3135 to communicate with each other without having to go outside of the SiP 3100. In some embodiments, the ICs 3120-3135 might be directly wire-bonded to each other in order to facilitate communication between the ICs. Instead of, or in conjunction with the wire bondings 3160, some embodiments might use other mechanisms to communicatively couple the ICs 3120-3135 to each other.

As further shown in FIG. 31, the SiP includes a ball grid array ("BGA") 3110 and a set of vias 3115. The BGA 3110 is a set of solder balls that allows the SiP 3100 to be attached to a printed circuit board ("PCB"). Each via connects a solder ball in the BGA 3110 on the bottom of the substrate 3105, to a conductor on the top of the substrate 3105.

The conductors on the top of the substrate 3105 are electrically coupled to the ICs 3120-3135 through the wire bondings 3160. Accordingly, the ICs 3120-3135 can send and receive signals to and from circuits outside of the SiP 3100 through the wire bondings 3160, the conductors on the top of the substrate 3105, the set of vias 3115, and the BGA 3110. Instead of a BGA, other embodiments might employ other structures (e.g., a pin grid array) to connect a SiP to circuits outside of the SiP. As shown in FIG. 31, a housing 3180 encapsulates the substrate 3105, the BGA 3110, the set of vias 3115, the ICs 3120-3135, and the wire bondings 3160 to form the SiP 3100. This and other SiP structures are further described in U.S. Pat. No. 7,530,044 entitled "Method for Manufacturing a Programmable System In Package", which is incorporated herein by reference.

Figure 32:
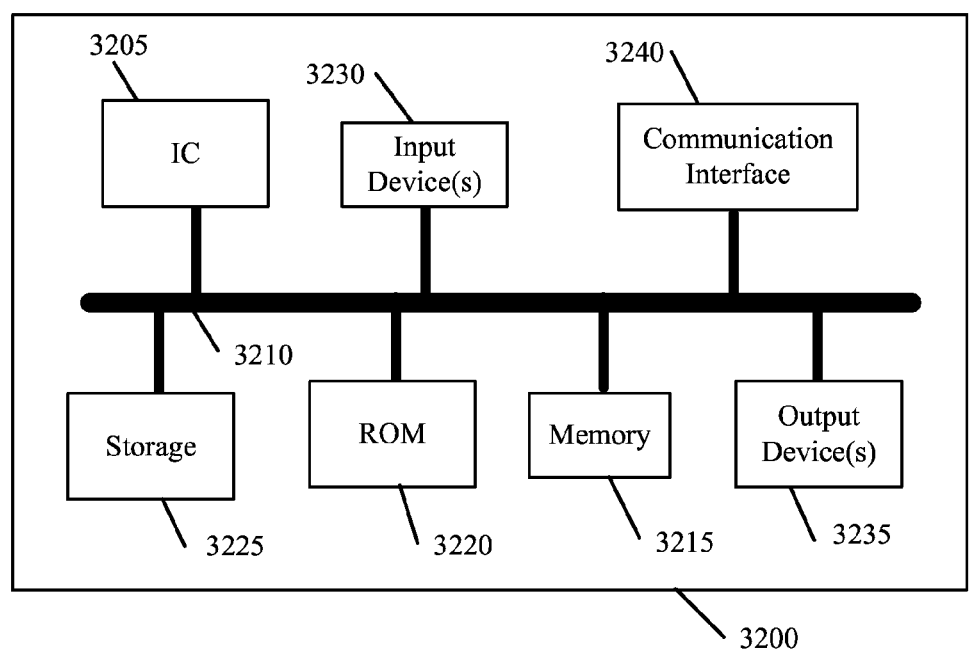
FIG. 32 conceptually illustrates an example of a computing system.

FIG. 32 conceptually illustrates a more detailed example of a computing system 3200 that has an IC 3205, which includes a configurable circuit arrangement with configurable circuits, storage elements, and routing fabric of some embodiments of the invention that are described above. The system 3200 can be a stand-alone computing or communication device, or it can be part of another electronic device. As shown in FIG. 32, in addition to the IC 3205, the system 3200 also includes a bus 3210, a system memory 3215, a read-only memory 3220, a storage device 3225, input device(s) 3230, output device(s) 3235, and a communication interface 3240.

The bus 3210 collectively represents all system, peripheral, and chipset interconnects (including bus and non-bus interconnect structures) that communicatively connect the numerous internal devices of the system 3200. For instance, the bus 3210 communicatively connects the IC 3205 with the read-only memory 3220, the system memory 3215, and the permanent storage device 3225. The bus 3210 may be any of several types of bus structures including a memory bus or memory controller, a peripheral bus, and a local bus using any of a variety of conventional bus architectures. For instance, the bus 3210 architecture may include any of the following standard architectures: PCI, PCI-Express, VESA, AGP, Microchannel, ISA and EISA, to name a few.

From these various memory units, the IC 3205 receives data for processing and configuration data for configuring the configurable logic and/or interconnect circuits of the IC. When the IC 3205 has a processor, the IC also retrieves, from the various memory units, instructions to execute. The read-only-memory (ROM) 3220 stores static data and instructions that are needed by the IC 3205 and other modules of the system 3200.

Some embodiments of the invention use a mass-storage device (such as a magnetic disk to read from or write to a removable disk, or an optical disk for reading a CD-ROM disk or to read from or write to other optical media) as the permanent storage device 3225. Other embodiments use a removable storage device (such as a flash memory card or memory stick) as the permanent storage device 3225. The drives and their associated computer-readable media provide non-volatile storage of data, data structures, computer-executable instructions, etc. for the system 3200. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 3225, the system memory 3215 is a read-and-write memory device. However, unlike storage device 3225, the system memory is a volatile read-and-write memory, such as a random access memory. Typically, system memory 3215 may be found in the form of random access memory (RAM) modules such as SDRAM, DDR, RDRAM, and DDR-2. The system memory stores some of the sets of instructions and data that the processor needs at runtime.

The bus 3210 also connects to the input and output devices 3230 and 3235. The input devices 3230 enable the user to enter information into the system 3200. The input devices 3230 can include touch-sensitive screens, keys, buttons, keyboards, cursor-controllers, touch screen, joystick, scanner, microphone, etc. The output devices 3235 display the output of the system 3200. The output devices 3235 include printers and display devices, such as cathode ray tubes (CRT), liquid crystal displays (LCD), organic light emitting diodes (OLED), plasma, projection, etc.

Finally, as shown in FIG. 32, bus 3210 also couples system 3200 to other devices through a communication interface 3240. Examples of the communication interface 3240 include network adapters that connect to a network of computers, or wired or wireless transceivers for communicating with other devices. Through the communication interface 3240, the system 3200 can be a part of a network of computers (such as a local area network ("LAN"), a wide area network ("WAN"), or an Intranet) or a network of networks (such as the Internet). The communication interface 3240 may provide such connection using wireless techniques, including digital cellular telephone connection, Cellular Digital Packet Data (CDPD) connection, digital satellite data connection, or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An integrated circuit (IC) comprising:
   a first set of configurable circuits implementing a user design that performs operations by searching memories for content that matches a key;
   a content addressable memory (CAM); and
   a second set of configurable circuits implementing interface circuitry between the user design and the CAM, wherein the CAM comprises:
   a plurality of banks, each bank comprising an array of memory cells and a set of comparison circuits for comparing content of the bank's array of memory cells with the key; and
   a read port for selectively retrieving content from one of the plurality of banks in the CAM and delivering the retrieved content to the user design.

2. The IC of claim 1, wherein different sets of comparison circuits in different banks of the CAM compare the content of memory cells in the different banks with the key simultaneously.

3. The IC of claim 1, wherein the key comprises a set of value bits and a set of mask bits, wherein each of the mask bits indicates whether a corresponding value bit is to be ignored when the key is being compared with the content in the CAM.

4. The IC of claim 1, wherein the array of memory cells of each bank comprises first and second sets of memory cells, wherein the first set of memory cells provides data bits for bitwise comparison with the key and the second set of memory cells provides mask bits for bitwise masking of the comparison result.

5. The IC of claim 1, wherein each bank further comprising a content retrieval circuit for selecting one word of the array of memory cells and for retrieving content from the selected word.

6. The IC of claim 5, wherein comparing the content of the bank's array of memory cells with the key comprises comparing the retrieved content from the selected word with the key.

7. The IC of claim 6, wherein the content retrieval circuit selects the word based on a selection pointer that is incremented every clock cycle.

8. The IC of claim 7, wherein the selection pointer is used by content retrieval circuits in all banks of the CAM.

9. The IC of claim 1, wherein results of the comparison from each of the plurality of banks are stored in a storage circuit that can be access by the user design.

10. The IC of claim 1, wherein results of the comparison from each of the plurality of banks are processed by a comparison result reduction circuit to find content in the CAM that matches the key.

11. An integrated circuit (IC) comprising:
    a first set of configurable circuits implementing a user design that is defined by a user clock, wherein the user design searches memories in the IC for content that matches a key; and
    a second set of configurable circuits implementing interface circuitry between the user design and a particular memory, the interface circuitry providing an address pointer to the particular memory for selecting one of a plurality of words stored in the particular memory for comparison with the key, wherein the address pointer increments a plurality of times within each cycle of the user clock.

12. The IC of claim 11, wherein the interface circuitry operates using a reconfiguration clock, wherein a user clock cycle comprises multiple reconfiguration clock cycles.

13. The IC of claim 12, wherein the reconfiguration clock is a sub-cycle clock of the user clock.

14. The IC of claim 12, wherein the comparison with the key produces one set of comparison results every reconfiguration clock cycle.

15. The IC of claim 14, wherein the comparison results are stored in a storage circuit that can be access by the user design.

16. The IC of claim 14, wherein the comparison results are processed by a comparison result reduction circuit to find content in the particular memory that matches the key, wherein the comparison result reduction circuit comprises pipeline stages that are driven by the reconfiguration clock.

17. The IC of claim 11, wherein the key comprises a set of value bits and a set of mask bits, wherein each of the mask bits indicates whether a corresponding value bit is to be ignored when the key is being compared with the content in the particular memory.

18. The IC of claim 11, wherein the particular memory comprises first and second sets of memory cells, wherein the first set of memory cells provides data bits for bitwise comparison with the key and the second set of memory cells provides mask bits for bitwise masking of the comparison result.

19. The IC of claim 11, wherein first and second sets of configurable circuits are reconfigurable circuits that reconfigure on every reconfiguration clock cycle.

20. The IC of claim 19, wherein the address pointer increments every reconfiguration clock cycle while the first set of configurable circuits is searching the particular memory for content that matches the key.

21. An integrated circuit (IC) comprising:
    a plurality of configurable logic circuits configured to perform a particular operation;

a user defined memory comprising a plurality of configurable memory modules storing content that are accessible by the plurality of configurable logic circuits, wherein the user defined memory operates as (i) a random access memory (RAM) when the plurality of configurable memory modules is configured by a first set of configuration data, (ii) a content addressable memory (CAM) when the plurality of configurable memory modules is configured by a second set of configuration data, and (iii) a ternary content addressable memory (TCAM) when the plurality of configurable memory modules is configured by a third set of configuration data.

22. The IC of claim 21, wherein each configurable memory module comprises a set of comparison circuits for comparing a key with content stored in the configurable memory.

23. The IC of claim 22, wherein the key comprises a set of value bits and a set of mask bits, wherein each of the mask bits indicates whether a corresponding value bit is to be ignored.

24. The IC of claim 22, wherein each configurable memory comprises first and second sets of memory cells, wherein the first set of memory cells provides data bits for bitwise comparison with the key and the second set of memory cells provides mask bits for bitwise masking of the comparison result when the user defined memory is operating as a TCAM.

25. The IC of claim 24, wherein the first set of memory cells and the second set of memory cells both provide data bits for bitwise comparison with the key when the user defined memory is operating as a CAM.

26. The IC of claim 22, wherein results of said comparison from each of the plurality of configurable memory modules are stored in a storage circuit that can be access by the plurality of configurable logic circuits.

27. The IC of claim 22, wherein results of said comparison from each of the plurality of configurable memory modules are processed by a comparison result reduction circuit to find content in the user defined memory that matches the key.

28. The IC of claim 21, wherein all configurable memory modules in the user defined memory share an address pointer for selecting and retrieving content from memory cells in the configurable memory modules.

29. The IC of claim 21, wherein the user defined memory is a first user defined memory and the plurality of configurable memory modules is a first plurality of configurable memory modules, the IC further comprising a second user defined memory comprising a second plurality of configurable memory modules.

30. The IC of claim 29, wherein the second user defined memory includes fewer configurable memory modules than the first user defined memory.

31. The IC of claim 29, wherein the second user defined memory includes more configurable memory modules than the first user defined memory.

32. The IC of claim 29, wherein the second user defined memory receives a different key from the first user defined memory.

* * * * *